(12) United States Patent
Kanna et al.

(10) Patent No.: US 7,482,112 B2
(45) Date of Patent: Jan. 27, 2009

(54) PATTERN FORMING METHOD

(75) Inventors: Shinichi Kanna, Shizuoka (JP); Haruki Inabe, Shizuoka (JP); Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/655,960

(22) Filed: Jan. 22, 2007

(65) Prior Publication Data

US 2007/0172768 A1 Jul. 26, 2007

(30) Foreign Application Priority Data

Jan. 23, 2006 (JP) ............... 2006-013979
Jun. 6, 2006 (JP) ............... 2006-157228

(51) Int. Cl.
*G03C 5/00* (2006.01)
*G03F 7/00* (2006.01)

(52) U.S. Cl. .............. 430/322; 430/281.1; 430/286.1; 430/327; 526/321; 526/268; 526/347; 526/279

(58) Field of Classification Search .............. 430/270.1, 430/281.1, 287.1, 327, 322; 359/380; 428/447; 526/321, 268, 347, 279
See application file for complete search history.

(56) References Cited

U.S. PATENT DOCUMENTS

| 6,916,543 | B2 * | 7/2005 | De et al. ............ 428/447 |
| 2005/0014090 | A1 * | 1/2005 | Hirayama et al. ........ 430/270.1 |
| 2005/0046934 | A1 * | 3/2005 | Ho et al. ............ 359/380 |
| 2005/0255414 | A1 * | 11/2005 | Inabe et al. ............ 430/327 |

FOREIGN PATENT DOCUMENTS

| EP | 1596251 A1 * | 11/2005 |
| JP | 57-153433 A | 9/1982 |
| JP | 7-220990 A | 8/1995 |
| WO | WO 2004/068242 A1 | 8/2004 |
| WO | WO 2004/077158 A1 | 9/2004 |

OTHER PUBLICATIONS

B.J. Lin, "Semiconductor Foundry, Lithography, and Partner", Plenary Paper, Micropatterning Division TSMC, inc., Emerging Lithographic Technologies VI, Roxann L. Engelstad, , 2002, p. 11-24, Editor processings of SPIE, vol. 4688 , 2002 SPIE .0277-786X/02.
J. A. Hoffnagle, "Liquid immersion deep-ultraviolet interferometric lithography", J. Vas. Sc. Technol., American Vaccuum Society, Dec. 1999, pp. 3306-3309, B 17(6), 0734-211X/99/17(6)/3306.

* cited by examiner

*Primary Examiner*—Cynthia H Kelly
*Assistant Examiner*—Ponder N Thompson Rummel
(74) *Attorney, Agent, or Firm*—Sughrue Mion, PLLC

(57) ABSTRACT

A pattern forming method which uses a positive resist composition comprises: (A) a silicon-free resin capable of increasing its solubility in an alkaline developer under action of an acid; (B) a compound capable of generating an acid upon irradiation with an actinic ray or radiation; (C) a silicon-containing resin having at least one group selected from the group of consisting (X) an alkali-soluble group, (XI) a group capable of decomposing under action of an alkaline developer and increasing solubility of the resin (C) in an alkaline developer, and (XII) a group capable of decomposing under action of an acid and increasing solubility of the resin (C) in an alkaline developer, and (D) a solvent, the method comprising: (i) a step of applying the positive resist composition to a substrate to form a resist coating, (ii) a step of exposing the resist coating to light via an immersion liquid, (iii) a step of removing the immersion liquid remaining on the resist coating, (iv) a step of heating the resist coating, and (v) a step of developing the resist coating.

12 Claims, No Drawings

PATTERN FORMING METHOD

BACKGROUND OF THE INVENTION

1. Field of the Invention

The present invention relates to a pattern forming method that utilizes a positive resist composition usable in a lithography process for manufacturing semiconductors, such as ICs, and circuit boards for liquid crystal displays and thermal heads, and other photofabrication processes. More specifically, the invention is concerned with a pattern forming method that utilizes a specified positive resist composition suitable for exposure performed with a projection exposure apparatus for immersion lithography using as a light source far ultraviolet light with wavelengths of 300 nm or below.

2. Description of the Related Art

As the demand for finer semiconductor devices has grown, efforts have been moving ahead to develop exposure light sources having the shorter wavelengths and projection lenses having the higher numerical apertures (higher NAs). Up to the present, steppers using as light sources ArF excimer laser with a wavelength of 193 nm and having NA of 0.84 have been developed. As generally well known, the resolution and the focal depth of these machines can be given by the following expressions;

(Resolution)=$k_1 \cdot (\lambda/NA)$ (Focal depth)=$\pm k_2 \cdot \lambda/NA^2$ where $\lambda$ is the wavelength of an exposure light source, NA is the numerical aperture of a projection lens, and $k_1$ and $k_2$ are coefficients concerning a process.

Although steppers using as light sources $F_2$ excimer laser with a wavelength of 157 nm are under study with the intention of achieving higher resolution by further moving the exposure light sources to shorter wavelengths, it is very difficult to stabilize production costs and qualities of apparatus and materials since lens materials usable in exposure apparatus and materials usable in resist for ensuring exposure at shorter wavelengths are confined within very narrow limits, and there is a possibility of failing to bring exposure apparatus and resist having sufficient performance and stability to perfection within a required period.

As a technique of enhancing the resolution in an optical microscope, the method of filling the space between a projection lens and a test specimen with a liquid having a high refractive index (hereinafter referred to as an immersion liquid), or the so-called immersion method, has hitherto been known.

This "immersion effect" can be explained as follows. In immersion lithography, the foregoing resolution and focal depth can be given by the following expressions;

(Resolution)=$k_1 \cdot (\lambda_0/n)/NA_0$ (Focal depth)=$\pm k_2 \cdot (\lambda_0/n)/NA_0^2$ where $\lambda_0$ is the wavelength of an exposure light in the air, n is the refractive index of an immersion liquid relative to the air and $NA_0$ is equal to sin θ when the convergent half angle of incident rays is represented by θ. That is to say, the effect of immersion is equivalent to the use of exposure light with a 1/n wavelength. In other words, application of the immersion method to a projection optical system having the same NA value can multiply the focal depth by a factor of n. This technique is effective on all shapes of patterns, and besides, it can be used in combination with super-resolution techniques under study at present, such as a phase-shift method and an off-axis illumination method.

Examples of apparatus in which this effect is applied to transfer of fine circuit patterns for semiconductor devices are presented in JP-A-57-153433 and JP-A-7-220990.

Recent progress of immersion lithography is reported in Proceedings of International Society for Optical Engineering (Proc. SPIE), vol. 4688, p. 11 (2002), J. Vac. Sci. Technol. B, 17 (1999), Proceedings of International Society for Optical Engineering (Proc. SPIE), vol. 3999, p. 2 (2000), and WO 2004/077158. When ArF excimer laser is used as a light source, it is thought that pure water (having a refractive index of 1.44 at 193 nm) is the most promising immersion liquid in terms of not only handling safety but also transmittance and refractive index at 193 nm. When $F_2$ excimer laser is used as a light source, on the other hand, fluorine-containing solvents have been examined with an eye to balance between transmittance and refractive index at 157 nm, but no immersion liquid satisfactory in terms of environmental safety and refractive index has been found yet. From the viewpoints of the level of immersion effect and maturity of resist, it is thought that ArF steppers are earliest exposure apparatus equipped with immersion lithography.

From resists for KrF excimer laser (248 nm) onward, the image forming method referred to as chemical amplification has been adopted as a method of patterning resists for the purpose of supplementing sensitivity drops resulting from light absorption by the resists. To illustrate the image forming method by taking the case of positive-working chemical amplification, images are formed in a process that exposure is performed to generate an acid through decomposition of an acid generator in exposed areas, and conversion of alkali-insoluble groups into an alkali-soluble groups by utilizing the generated acid as a reaction catalyst is caused by bake after exposure (PEB: Post Exposure Bake) to render the exposed areas removable with an alkaline developer.

Since application of immersion lithography to a chemical amplification resist brings the resist layer into contact with an immersion liquid at the time of exposure, it is indicated that the resist layer quality is altered and ingredients having adverse effects on the immersion liquid are oozed from the resist layer. In WO 2004/068242, cases are described where the resists tailored to ArF exposure suffer changes in resist performance by immersion in water before and after the exposure, and it is pointed out that such a phenomenon is a problem in immersion lithography.

Use of chemical amplification resist in immersion lithography according to the foregoing general resist process in particular requires further improvements in development defects appearing after development.

SUMMARY OF THE INVENTION

An object of the invention is to provide a pattern forming method which can ensure improvement in development defect appearing after development in immersion lithography.

Exemplary aspects of the invention are the following pattern forming methods, and thereby the aforesaid object of the invention is attained.

(1) A pattern forming method which uses a positive resist composition comprises: (A) a silicon-free resin capable of increasing its solubility in an alkaline developer under action of an acid; (B) a compound capable of generating an acid upon irradiation with an actinic ray or radiation; (C) a silicon-containing resin having at least one group selected from the group of consisting (X) an alkali-soluble group, (XI) a group capable of decomposing under action of an alkaline developer and increasing solubility of the resin (C) in an alkaline developer, and (XII) a group capable of decomposing under action of an acid and increasing solubility of the resin (C) in an alkaline developer, and (D) a solvent, the method comprising: (i) a step of applying the positive resist composition to a substrate to form a resist coating, (ii) a step of exposing the resist coating to light via an immersion liquid, (iii) a step of removing the immersion liquid remaining on the resist coating, (iv) a step of heating the resist coating, and (v) a step of developing the resist coating.

(2) The pattern forming method as described in (1), wherein the resin (A) has a mononuclear or polynuclear alicyclic hydrocarbon structure.

(3) The pattern forming method as described in (1) or (2), wherein the resist coating is exposed to light of a wavelength of 193 nm.

(4) The pattern forming method as described in any of (1) to (3), further comprising a step of cleaning the resist coating surface prior to (ii) the step of exposing the resist coating to light via an immersion liquid.

(5) The pattern forming method as described in any of (1) to (4), wherein (iii) the step of removing the immersion liquid remaining on the resist coating is a step of removing the immersion liquid by feeding a water-miscible organic solvent onto the resist coating.

(6) The pattern forming method as described in (5), wherein the water-miscible organic solvent is isopropyl alcohol.

In addition, the following are preferred embodiments of the invention.

(7) The pattern forming method as described in any of (1) to (6), wherein the silicon-containing resin (C) has a weight-average molecular weight of 1,000 to 100,000.

(8) The pattern forming method as described in any of (1) to (7), wherein the silicon-containing resin (C) further contains a fluorine atom.

(9) The pattern forming method as described in any of (1) to (8), wherein the silicon-containing resin (C) is added in an amount of 0.1 to 5 mass % based on the total solids in the positive resist composition.

(10) The pattern forming method as described in any of (1) to (4) and (7) to (9), wherein (iii) the step of removing the immersion liquid remaining on the resist coating includes steps of forming a liquid film (puddle) of the immersion liquid and removing the liquid film so as not to left any liquid drops.

(11) The pattern forming method as described in (10), wherein the step of removing the liquid film is a step of removing the liquid film while rotating the substrate at 500 rpm or above.

(12) The pattern forming method as described in any of (1) to (11), wherein the resin (A) has a repeating unit containing a group having a polycyclic hydrocarbon structure substituted by a hydroxyl group or a cyano group.

DETAILED DESCRIPTION OF THE INVENTION

The invention is described below in detail.

Additionally, the term "group (atomic group)" used in this specification is intended to include both unsubstituted and substituted ones when neither word substituted nor unsubstituted is added thereto. For instance, the term "alkyl group" is intended to include not only an alkyl group having no substituent (an unsubstituted alkyl group) but also an alkyl group having a substituent or substituents (a substituted alkyl group).

[1] Silicon-Free Resin (A) that can Increase Solubility in Alkaline Developer Under Action of Acid One of resins used in a positive resist composition according to the invention is a silicon-free resin that can increase solubility in an alkaline developer under action of an acid, and a resin that contains groups capable of decomposing under action of an acid to produce alkali-soluble groups (hereinafter referred to as "acid-decomposable groups" also) in either its main chain, or its side chains, or both (hereinafter referred to as "Resin (A)" also).

As examples of Resin (A), mention may be made of poly (hydroxystyrene) derivatives including polymers which each contain repeating units derived from styrene having a hydroxyl substituent at the meta-, para- or ortho-position as illustrated below.

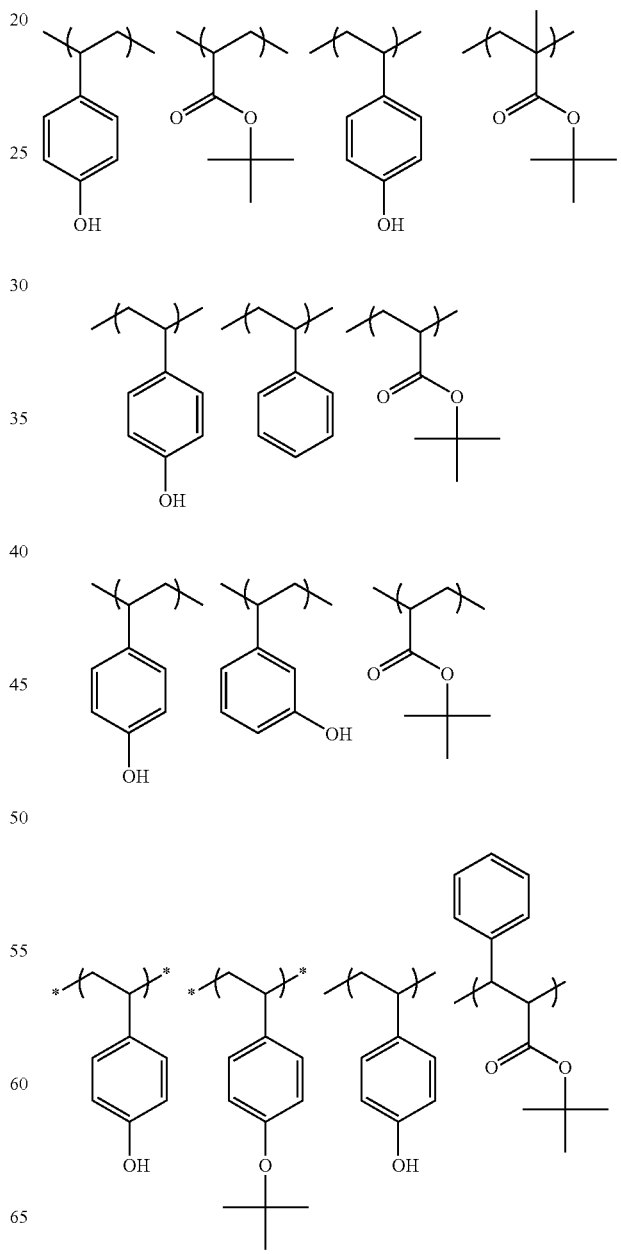

-continued

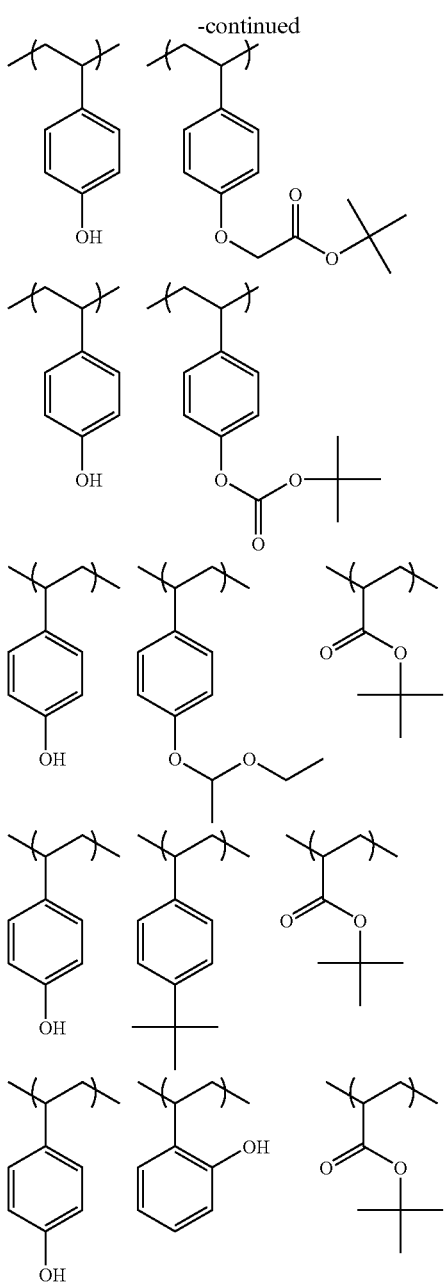

Examples of an alkali-soluble group include groups respectively having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Of these alkali-soluble groups, a carboxylic acid group, a fluorinated alcohol group (preferably a hexafluoroisopropanol group, —$C(CF_3)(CF_3)(OH)$) and a sulfonic acid group are preferred over the others.

Groups suitable as groups capable of decomposing by an acid (acid-decomposable groups) are those obtained by substituting groups capable of splitting off under action of an acid for hydrogen atoms of the alkali-soluble groups as recited above.

Examples of a group capable of splitting off under action of an acid include groups of formula —$C(R_{36})(R_{37})(R_{38})$, groups of formula —$C(R_{36})(R_{37})(OR_{39})$, and groups of formula —$C(R_{01})(R_{02})(OR_{39})$.

In those formulae, $R_{36}$ to $R_{39}$ each represent an alkyl group, a cycloalkyl group, an aryl group, an aralkyl group or an alkenyl group independently. $R_{36}$ and $R_{37}$ may combine with each other to form a ring.

$R_{01}$ and $R_{02}$ each represent a hydrogen atom, an alkyl group, a cycloalkyl group, an aryl group, an aralkyl group or an alkenyl group independently.

Examples of a group suitable as an acid-decomposable group include cumyl ester groups, enol ester groups, acetal ester groups and tertiary alkyl ester groups. Of these groups, tertiary alkyl ester groups are preferred over the others.

It is advantageous for Resin (A) to have mononuclear or polynuclear alicyclic hydrocarbon structures.

Resin (A) is preferably a resin having at least one kind of repeating units selected from repeating units having partial structures containing alicyclic hydrocarbon groups represented by the following formulae (pI) to (pV) or repeating units represented by the following formula (II-AB) (hereinafter referred to as "an alicyclic hydrocarbon-containing acid-decomposable resin" also).

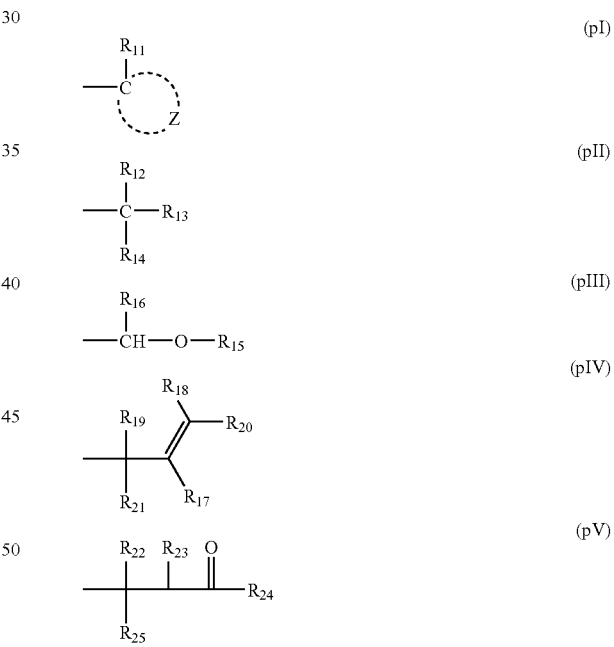

In the formulae (pI) to (pV), $R_{11}$ represents a methyl group, an ethyl group, an n-propyl group, an isopropyl group, an n-butyl group, an isobutyl group or a sec-butyl group, and Z represents atoms forming a cycloalkyl group together with the carbon atom.

$R_{12}$ to $R_{16}$ each represent a linear or branched alkyl group or a cycloalkyl group independently, provided that at least one of $R_{12}$ to $R_{14}$, or either $R_{15}$ or $R_{16}$ represents a cycloalkyl group.

$R_{17}$ to $R_{21}$ each represent a hydrogen atom, a linear or branched alkyl group or a cycloalkyl group independently, provided that at least one of $R_{17}$ to $R_{21}$ represents a cycloalkyl group. Further, either $R_{19}$ or $R_{21}$ is required to represent a linear or branched alkyl group or a cycloalkyl group.

$R_{22}$ to $R_{25}$ each represent a hydrogen atom, a linear or branched alkyl group or a cycloalkyl group independently, provided that at least one of $R_{22}$ to $R_{25}$ represents a cycloalkyl group. Alternatively, $R_{23}$ and $R_{24}$ may combine with each other to form a ring.

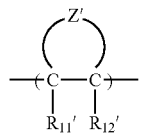

(II-AB)

In the formula (II-AB), $R_{11}'$ and $R_{12}'$ each represent a hydrogen atom, a cyano group, a halogen atom or an alkyl group independently.

Z' represents atoms forming an alicyclic structure together with the two bonded carbon atoms (C—C).

The formula (II-AB) is preferably the following formula (II-AB1) or formula (II-AB2).

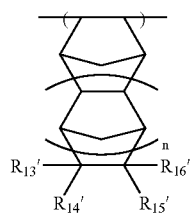

(II-AB1)

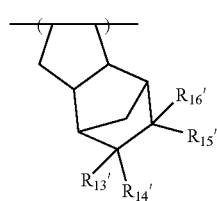

(II-AB2)

In the formulae (II-AB1) and (II-AB2), $R_{13}'$ to $R_{16}'$ each independently represent a hydrogen atom, a halogen atom, a cyano group, —COOH, —COOR$_5$, a group capable of decomposing under action of an acid, —C(=O)—X-A'-R$_{17}'$, an alkyl group or a cycloalkyl group. At least two of $R_{13}'$ to $R_{16}'$ may combine with each other to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linkage group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

The alkyl group which $R_{12}$ to $R_{25}$ each can represent in the formulae (pI) to (pV) is preferably a 1-4C linear or branched alkyl group, with examples including a methyl group, an ethyl group, an n-propyl group, an isopropyl group, an n-butyl group, an isobutyl group and a sec-butyl group.

The cycloalkyl group which $R_{12}$ to $R_{25}$ each can represent or the cycloalkyl group which can be formed of Z and the carbon atoms may be monocyclic or polycyclic. Examples of such a cycloalkyl group include groups each containing at least 5 carbon atoms and having a monocyclo, bicyclo, tricyclo or tetracyclo structure. The number of carbon atoms in such a structure is preferably from 6 to 30, particularly preferably from 7 to 25.

Suitable examples of such a cycloalkyl group include an adamantyl group, a noradamantyl group, a decaline residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Of these groups, an adamantyl group, a norbornyl group, a cyclohexyl group, a cyclopentyl group, a tetradecanyl group and a tricyclodecanyl group are preferred over the others.

Each of these alkyl groups and cycloalkyl groups may further have a substituent. Examples of such a substituent include an alkyl group (1-4C), a halogen atom, a hydroxyl group, an alkoxy group (1-4C), a carboxyl group and an alkoxycarbonyl group (2-6C). Herein, the alkyl, alkoxy and alkoxycarbonyl groups each may further have a substituent, such as a hydroxyl group, a halogen atom or an alkoxy group.

The structures represented by the formulae (pI) to (pV) in the resins can be used for protection of alkali-soluble groups. Examples of alkali-soluble groups which can be protected by such structures include various groups which are known in this technical field.

More specifically, such a protected alkali-soluble group has a structure formed by substituting the structure represented by any of the formulae (pI) to (pV) for the hydrogen atom of carboxylic acid, sulfonic acid, phenol or thiol group. Suitable examples of such a structure include structures formed by substituting the structures represented by formulae (pI) to (pV) for the hydrogen atoms of carboxylic acid groups or sulfonic acid groups.

As repeating units having alkali-soluble groups protected by the structures of formulae (pI) to (pV), repeating units represented by the following formula (pA) are preferred.

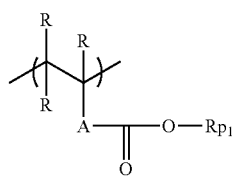

(pA)

In the formula (pA), each R represents a hydrogen atom, a halogen atom or a 1-4C linear or branched alkyl group. A plurality of Rs may be the same or different.

A represents a single bond, an alkylene group, an ether group, a thioether group, a carbonyl group, an ester group, an amide group, a sulfonamide group, a urethane group, a urea group, or a combination of two or more of the groups recited above. A is preferably a single bond.

$Rp_1$ represents any of the formulae (pI) to (pV).

The most suitable of repeating units represented by the formula (pA) is a repeating unit derived from 2-alkyl-2-adamantyl(meth)acrylate or dialkyl(1-adamantyl)methyl(meth)acrylate.

Examples of a repeating unit represented by the formula (pA) are illustrated below, but these examples should not be construed as limiting the scope of the invention.

(In the following formulae, Rx is H, CH$_3$, CF$_3$ or CH$_2$OH, and Rxa and Rxb are each a 1-4C alkyl group.)

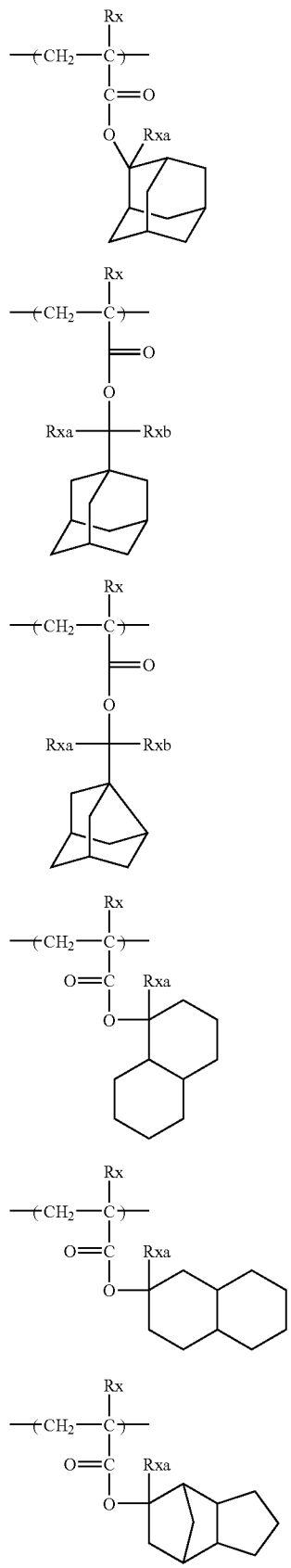
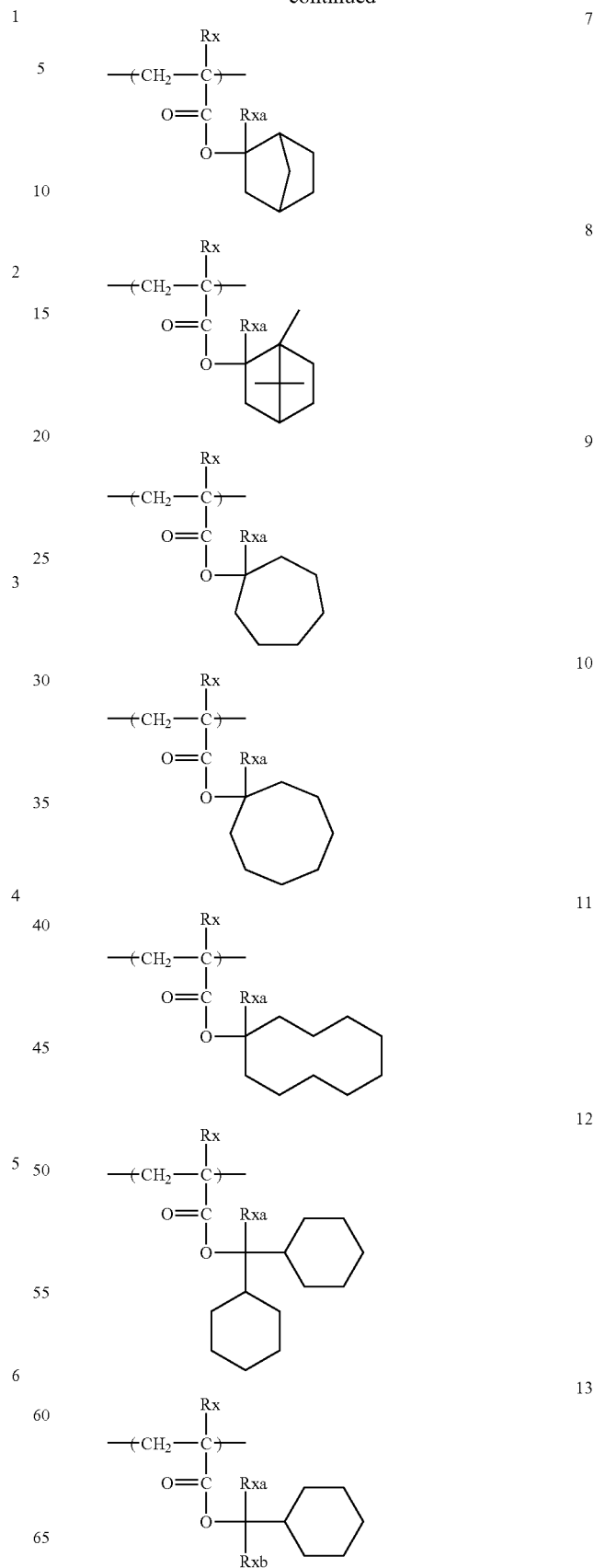

-continued

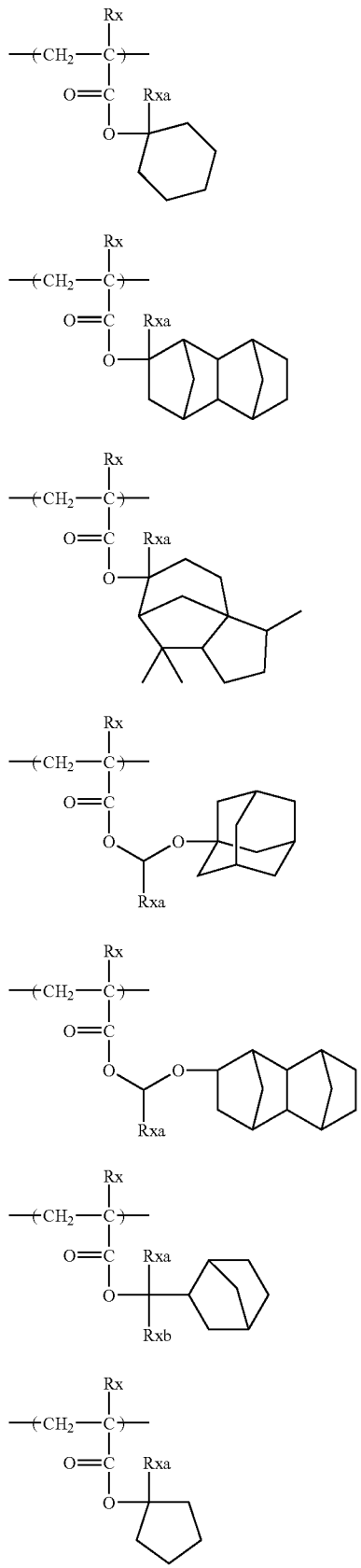

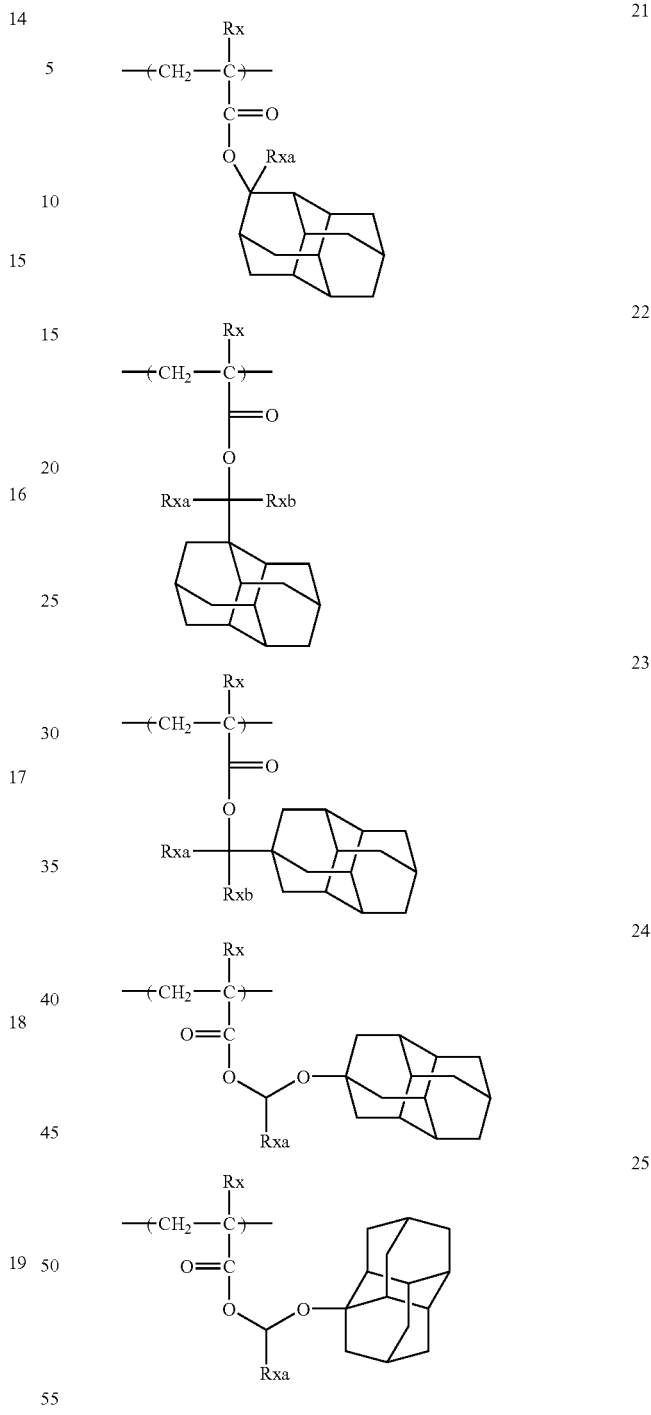

Examples of a halogen atom which $R_{11}'$ and $R_{12}'$ each can represent in the formula (II-AB) include a chlorine atom, a bromine atom, a fluorine atom and an iodine atom.

Examples of an alkyl group which $R_{11}'$ and $R_{12}'$ each can represent include 1-10C linear or branched alkyl groups.

The atomic group Z' for forming an alicyclic structure is an atomic group forming a repeating unit having an alicyclic hydrocarbon structure which may have a substituent, particularly preferably atoms forming a repeating unit having a bridged alicyclic hydrocarbon structure.

Examples of a skeleton of the alicyclic hydrocarbon formed include the same ones as alicyclic hydrocarbon groups which $R_{12}$ to $R_{25}$ can represent in the formulae (pI) to (pV).

The skeleton of each alicyclic hydrocarbon structure may have a substituent. Examples of such a substituent include $R_{13}'$ to $R_{16}'$ in the formula (II-AB1) or (II-AB2).

The alicyclic hydrocarbon-containing acid-decomposable resin for use in the invention can contain groups capable of decomposing under action of an acid in at least one type of repeating units chosen from repeating units having partial structures containing alicyclic hydrocarbons represented by the formulae (pI) to (pV), repeating units represented by the formula (II-AB) or repeating units of copolymerization components described hereinafter.

Various kinds of substituents as $R_{13}'$ to $R_{16}'$ in the formula (II-AB1) or (II-AB2) may also become substituents of atoms Z' forming an alicyclic hydrocarbon structure or a bridged alicyclic hydrocarbon structure in the formula (II-AB).

Examples of repeating units represented by the formulae (II-AB1) and (II-AB2) are illustrated below, but these examples should not be construed as limiting the scope of the invention.

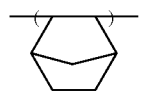
[II-1]

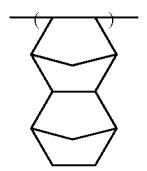
[II-2]

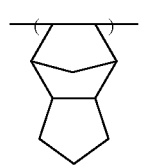
[II-3]

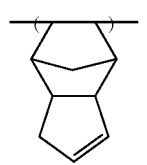
[II-4]

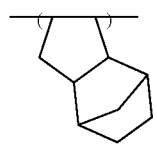
[II-5]

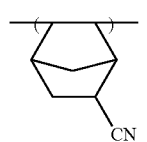
[II-6]

-continued

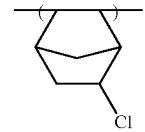
[II-7]

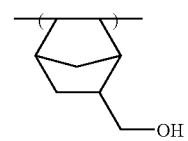
[II-8]

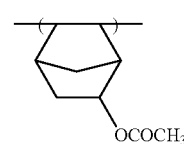
[II-9]

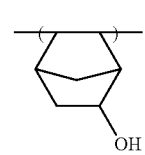
[II-10]

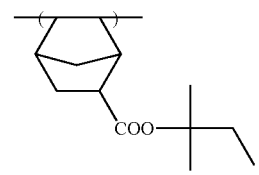
[II-11]

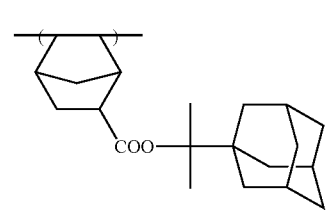
[II-12]

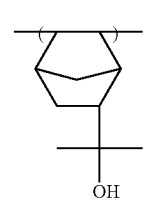
[II-13]

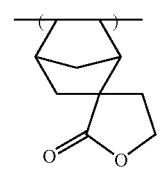
[II-14]

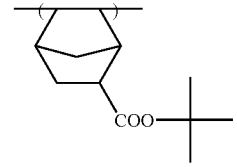
[II-15]

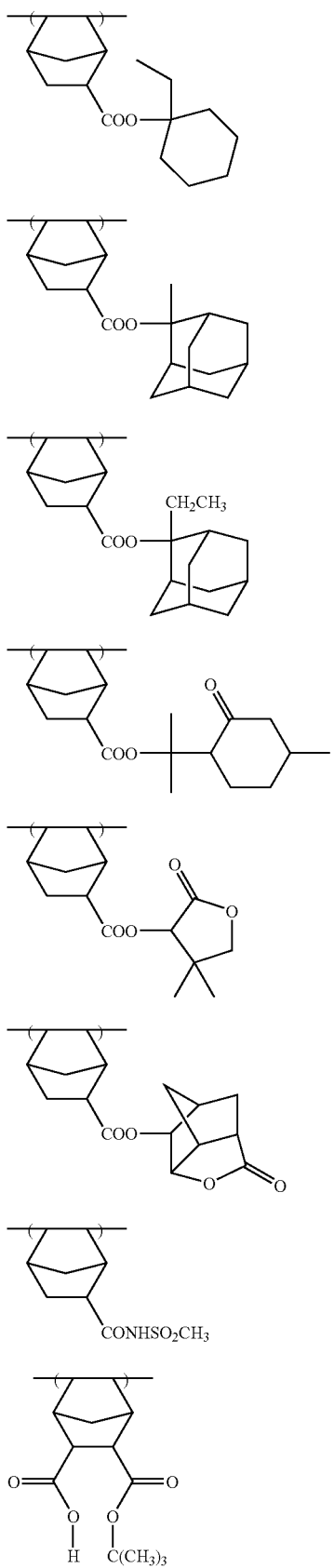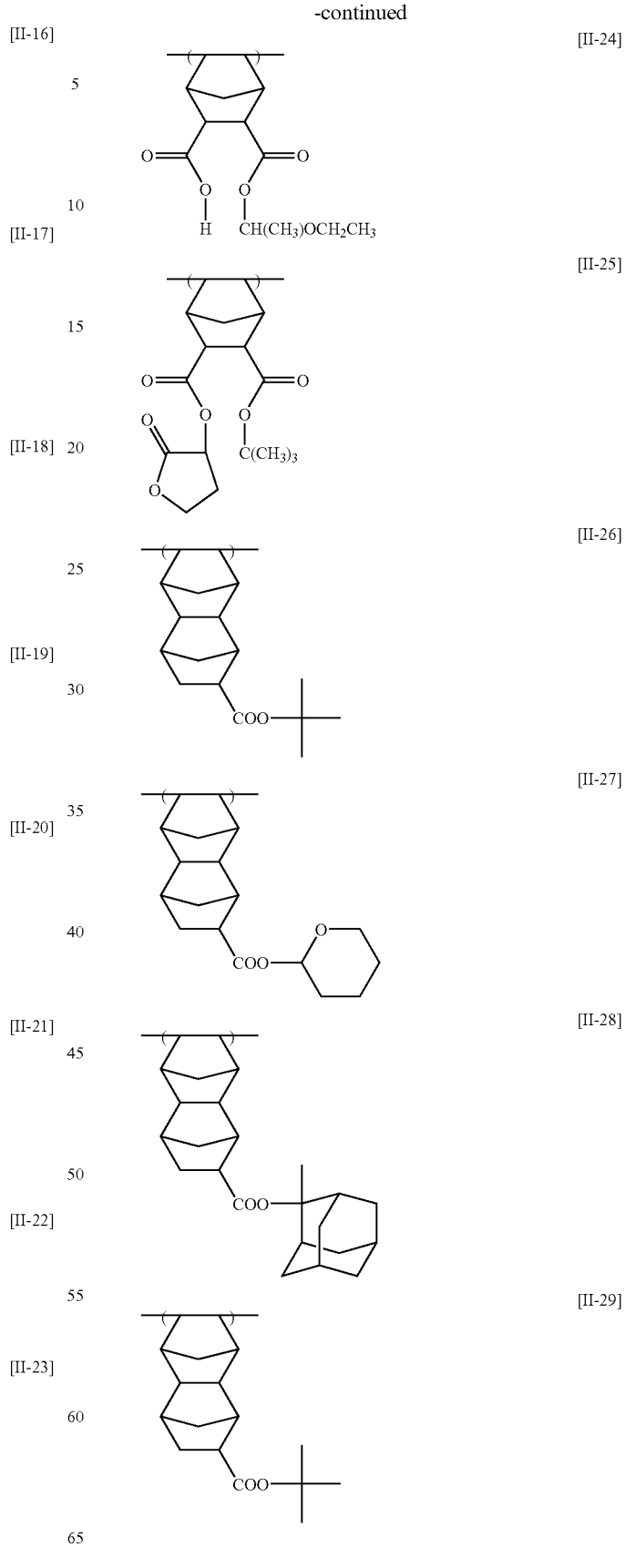

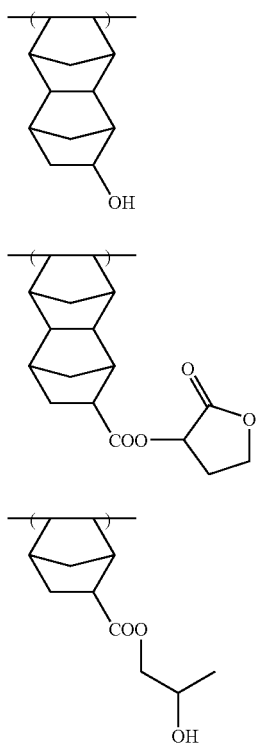

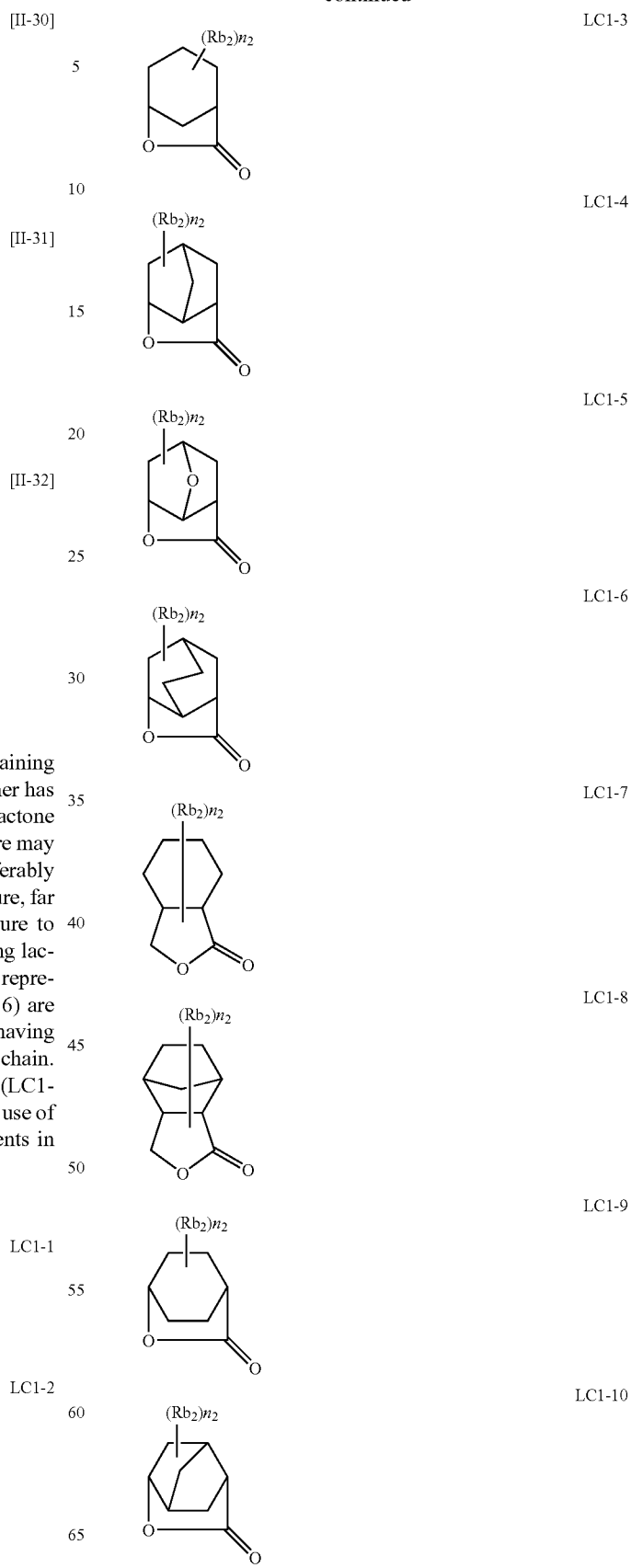

It is preferable that the alicyclic hydrocarbon-containing acid-decomposable resin for use in the invention further has repeating units each containing a group having a lactone structure. Although the group having a lactone structure may be any group as far as it has a lactone structure, it is preferably a group having a 5- to 7-membered ring lactone structure, far preferably one which fuses with another ring structure to form a bicyclo or Spiro structure. Of the groups having lactone structures, the groups having lactone structures represented by the following formulae (LC1-1) to (LC1-16) are preferred over the others. Alternatively, the groups having lactone structures may be bonded directly to the main chain. The lactone structures used to advantage are (LC1-1), (LC1-4), (LC1-5), (LC1-6), (LC1-13) and (LC1-14), and the use of specified lactone structures contributes to improvements in line edge roughness and development defect.

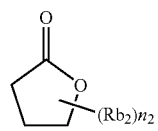

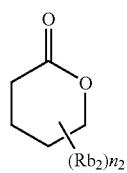

-continued

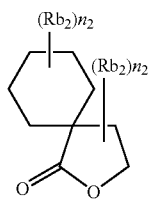
LC1-11

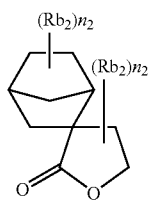
LC1-12

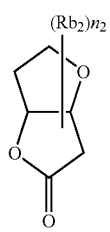
LC1-13

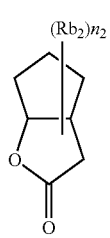
LC1-14

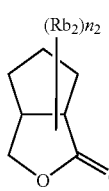
LC1-15

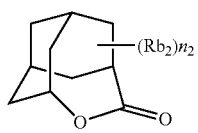
LC1-16

Each lactone structure moiety may have a substituent ($Rb_2$) or needn't. Suitable examples of a substituent ($Rb_2$) include 1-8C alkyl groups, 3-7C cycloalkyl groups, 1-8C alkoxy groups, 1-8C alkoxycarbonyl groups, a carboxyl group, halogen atoms, a hydroxyl group, a cyano group and acid-decomposable groups. $n_2$ represents an integer of 0 to 4. When $n_2$ is 2 or above, a plurality of $Rb_2$s may be the same or different, or they may combine with each other to form a ring.

Examples of a repeating unit containing a group having a lactone structure represented by any of the formulae (LC1-1) to (LC1-16) include the repeating units represented by the formula (II-AB1) or (II-AB2) wherein at least one of $R_{13}'$ to $R_{16}'$ is a group having the lactone structure represented by any of the formulae (LC1-1) to (LC1-16) (for instance, $R_5$ in —$COOR_5$ represents a group having the lactone structure represented by any of the formulae (LC1-1) to (LC1-16)) and repeating units represented by the following formula (AI).

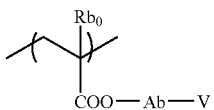
(AI)

In the formula (AI), $Rb_0$ represents a hydrogen atom, a halogen atom or a 1-4C alkyl group. Examples of a suitable substituent the alkyl group represented by $Rb_0$ may have include a hydroxyl group and halogen atoms.

Examples of a halogen atom represented by $Rb_0$ include a fluorine atom, a chlorine atom, a bromine atom and an iodine atom.

$Rb_0$ is preferably a hydrogen atom or a methyl group.

Ab represents a single bond, an alkylene group, a divalent linkage group having a mononuclear or polynuclear alicyclic hydrocarbon structure, an ether group, an ester group, a carbonyl group, or a divalent group formed by combining two or more of the groups recited above.

Ab is preferably a single bond or a linkage group represented by -$Ab_1$-$CO_2$—. $Ab_1$ is a linear or branched alkylene group or a mononuclear or polynuclear cycloalkylene group, preferably a methylene group, an ethylene group, a cyclohexylene group, an adamantylene group or a norbornylene group.

V represents a group having a lactone structure represented by any of the formulae (LC1-1) to (LC1-16).

A repeating unit having a lactone structure generally has optical isomers, and any of the optical isomers may be used. Further, one optical isomer may be used by itself, or two or more of optical isomers may be used as a mixture. When one optical isomer is mainly used, the optical purity (ee) thereof is preferably 90 or above, far preferably 95 or above.

Examples of a repeating unit containing a group having a lactone structure are illustrated below, but these examples should not be construed as limiting the scope of the invention.

(In each of the following formulae, Rx is H, $CH_3$, $CH_2OH$ or $CF_3$)

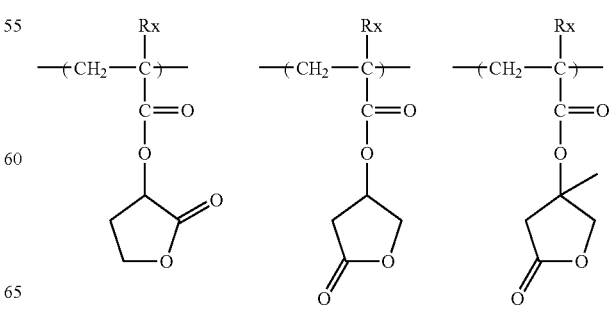

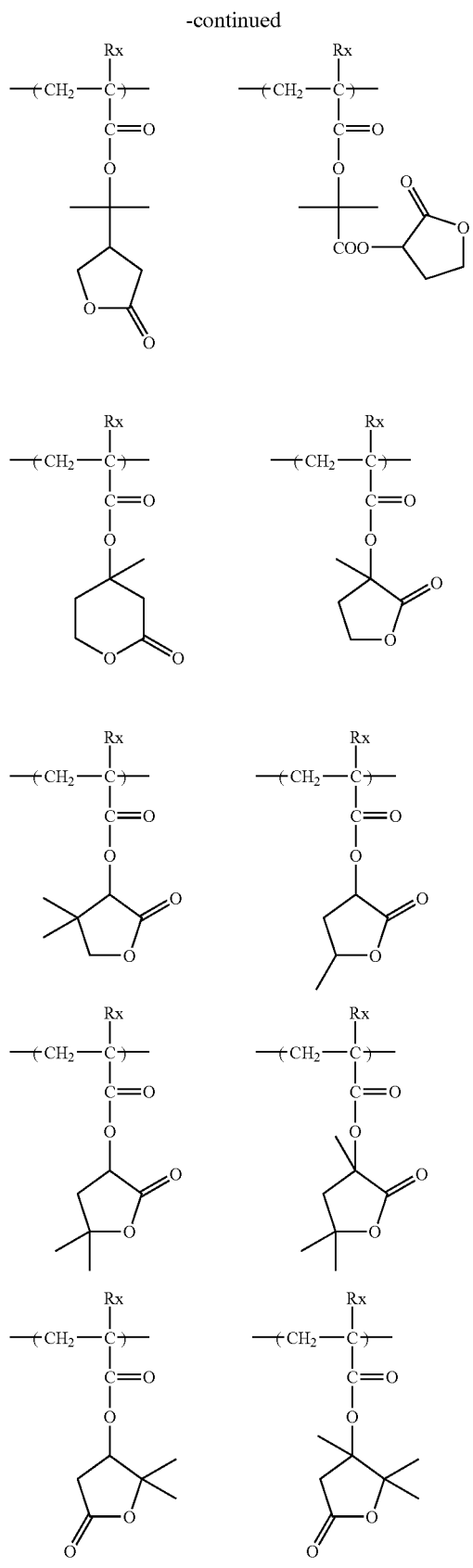
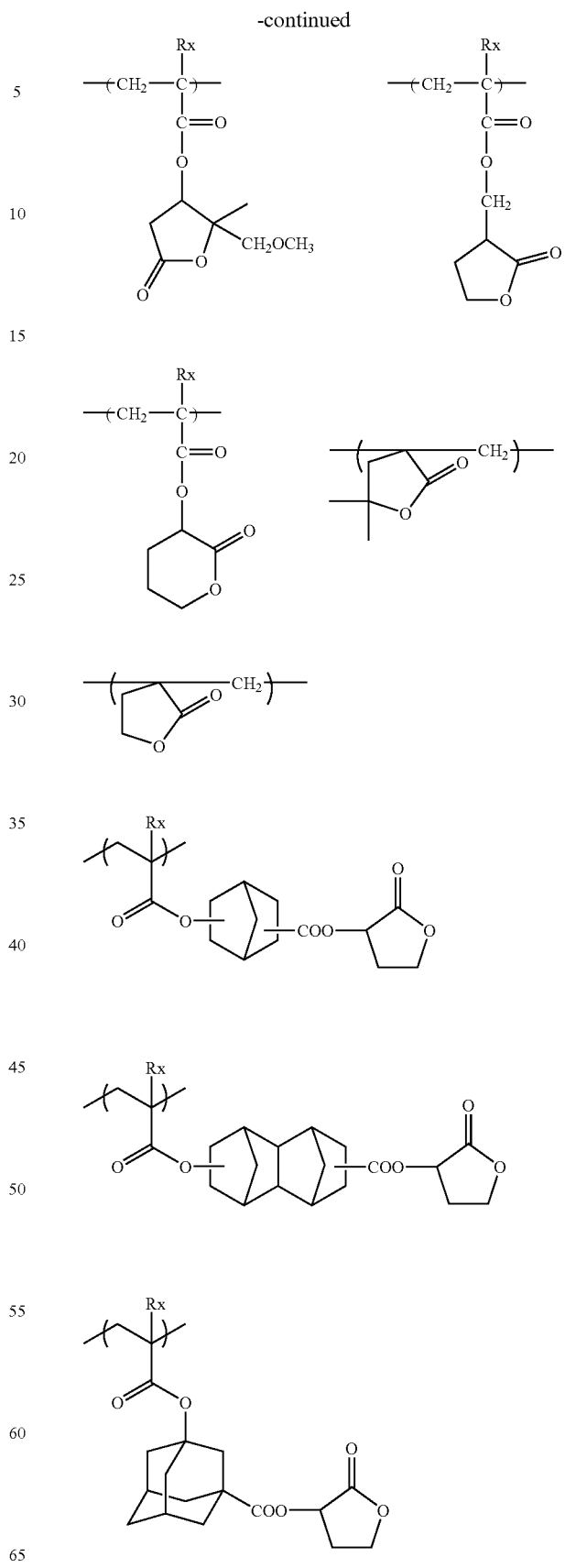

(In each of the following formulae, Rx is H, CH₃, CH₂OH or CF₃)
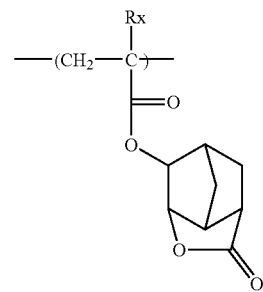
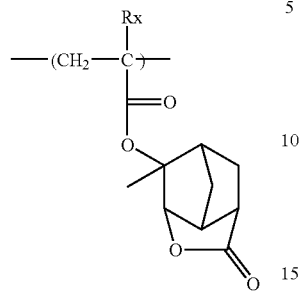
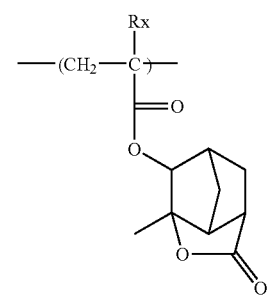
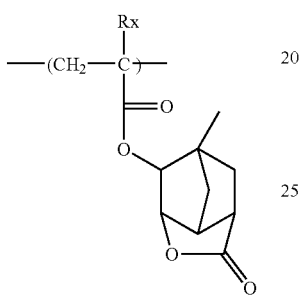
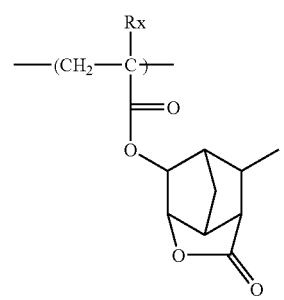
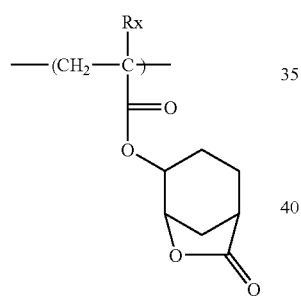
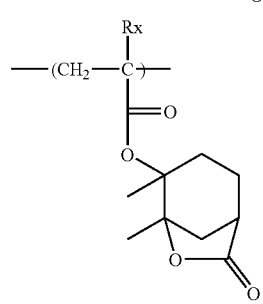
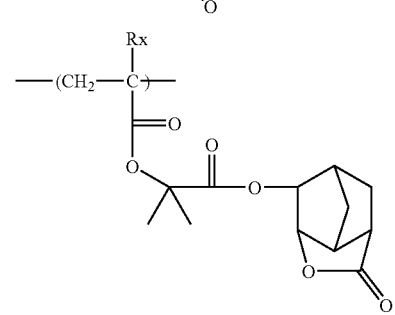
-continued
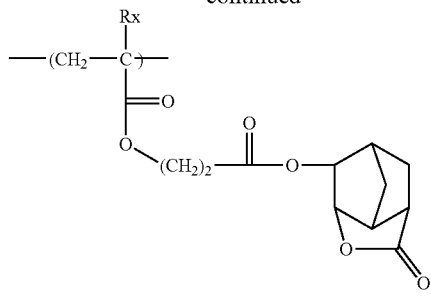
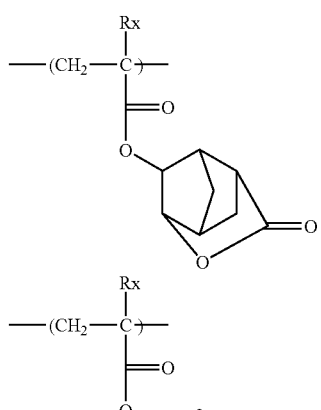
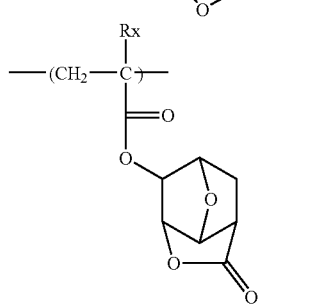
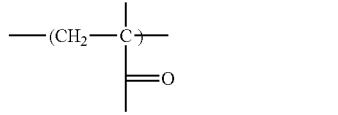
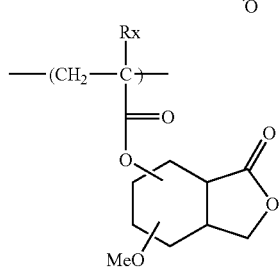

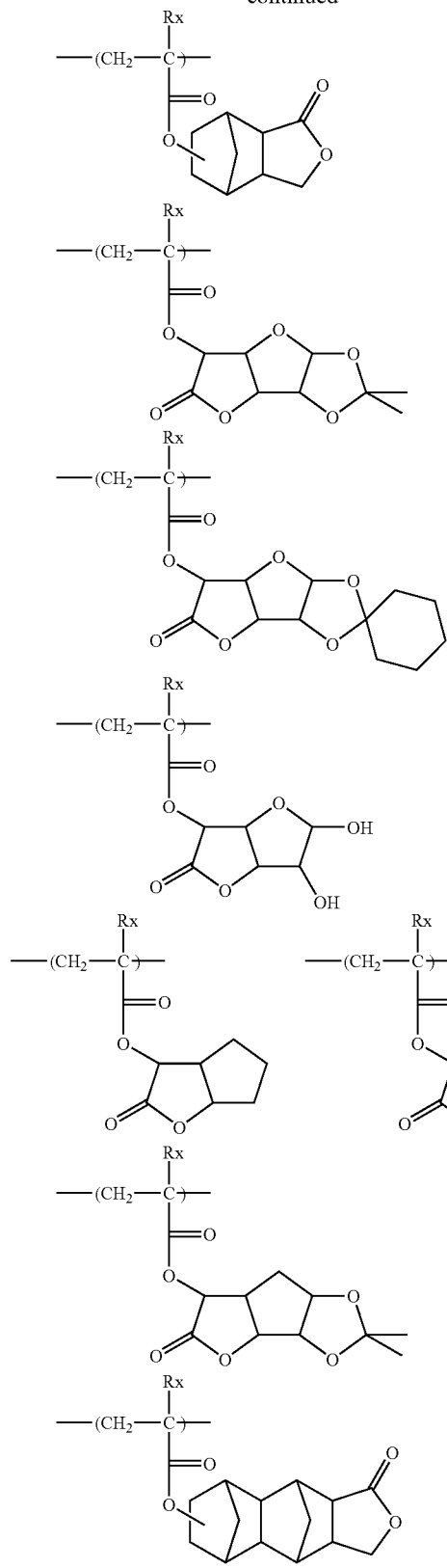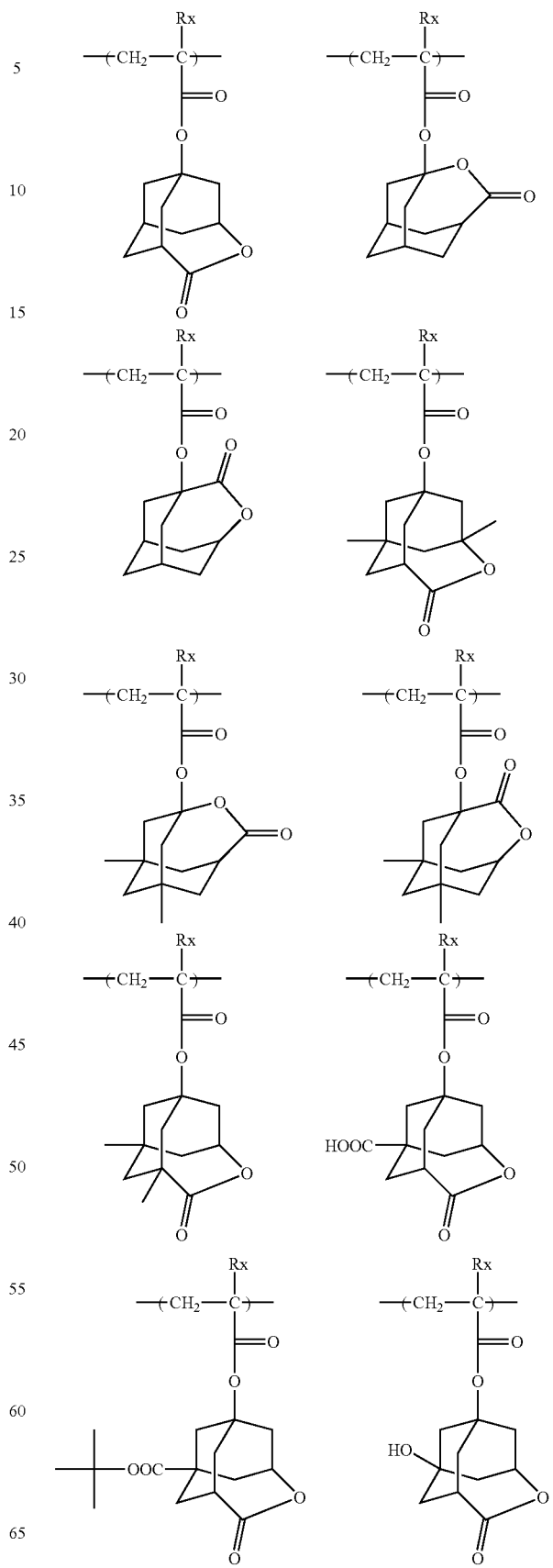
(In each of the following formulae, Rx is H, CH₃, CH₂OH or CF₃)

-continued

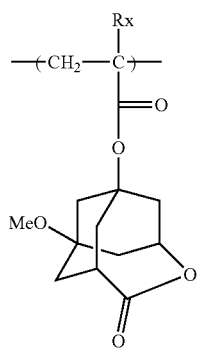

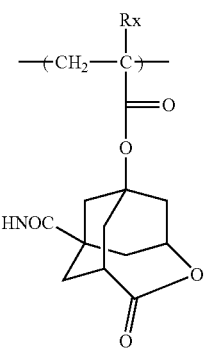

The alicyclic hydrocarbon-containing acid-decomposable resin for use in the invention preferably has repeating units containing groups having alicyclic hydrocarbon structures (preferably polycyclic hydrocarbon structures) substituted with polar groups. By introduction of such repeating units in the resin, adhesiveness to a substrate and affinity for a developer can be enhanced. Suitable examples of an alicyclic hydrocarbon structure in the alicyclic hydrocarbon structure substituted with a polar group include an adamantyl group, a diamantyl group and a norbornyl group, and suitable examples of a polar group in such a structure are a hydroxyl group and a cyano group. As groups having alicyclic hydrocarbon structures substituted with polar groups, those represented by the following formulae (VIIa) to (VIId) are suitable.

(VIIa)
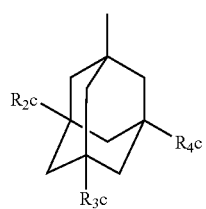

(VIIb)
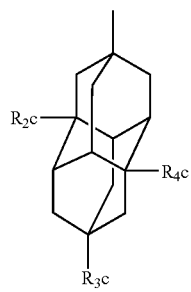

(VIIc)
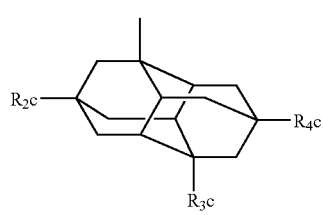

-continued (VIId)
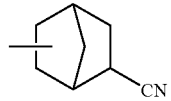

In the formulae (VIIa) to (VIIc), $R_{2C}$ to $R_{4C}$ each represent a hydrogen atom, a hydroxyl group or a cyano group independently, provided that at least one of them represents a hydroxyl group or a cyan group. Cases where one or two of $R_{2C}$ to $R_{4C}$ are hydroxyl groups and the remainder is a hydrogen atom are preferred. In the formula (VIIa), it is far preferred that two of $R_{2C}$ to $R_{4C}$ are hydroxyl groups and the remainder is a hydrogen atom.

Examples of repeating units containing groups represented by the formulae (VIIa) to (VIId) include the repeating units represented by the formula (II-AB1) or (II-AB2) wherein at least one of $R_{13}'$ to $R_{16}'$ is a group represented by any of the formulae (VIIa) to (VIId) (for instance, $R_5$ in —$COOR_5$ represents a group represented by any of the formulae (VIIa) to (VIId)) and repeating units represented by the following formulae (AIIa) to (AIId).

(AIIa)
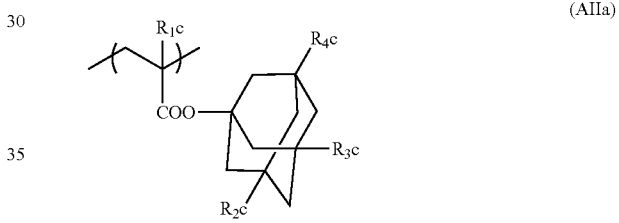

(AIIb)
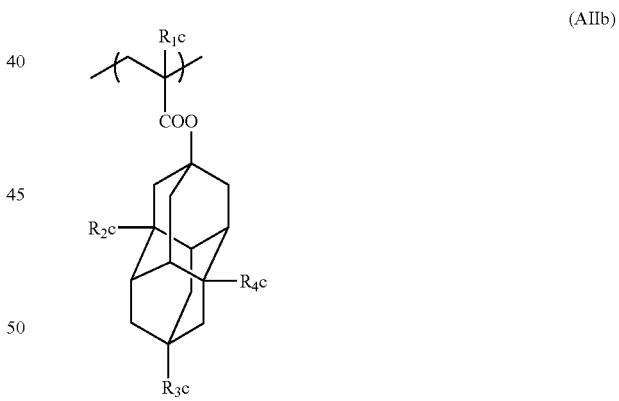

(AIIc)
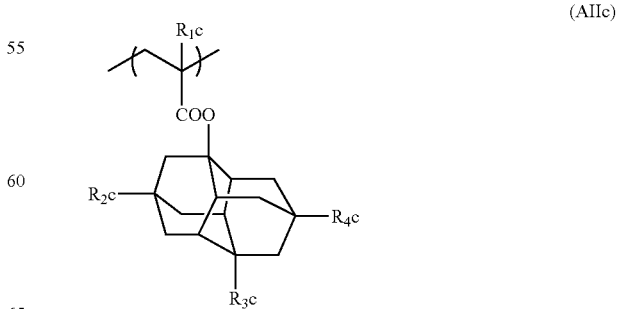

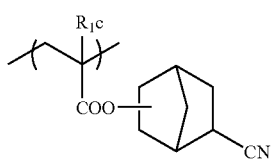

In the formula (AIIa) to (AIId), $R_{1C}$ represents a hydrogen atom, a methyl group, a trifluoromethyl group or a hydroxymethyl group.

Examples of repeating units represented by the formulae (AIIa) to (AIId) are illustrated below, but these examples should not be construed as limiting the scope of the invention.

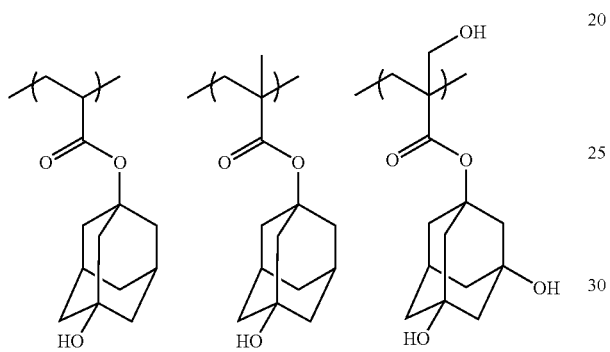

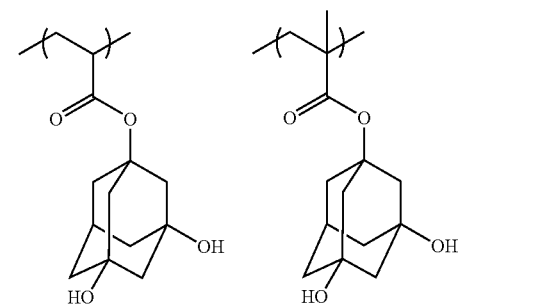

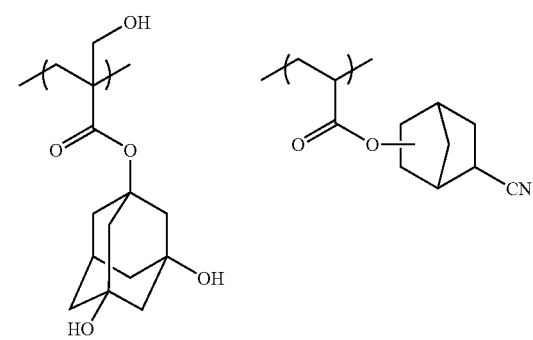

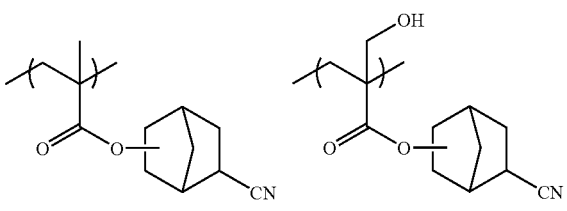

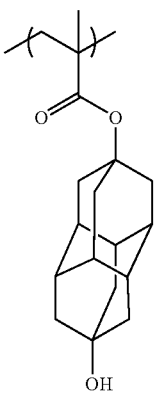
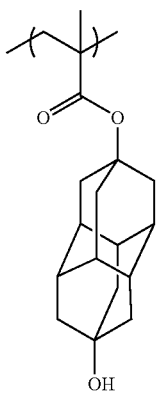

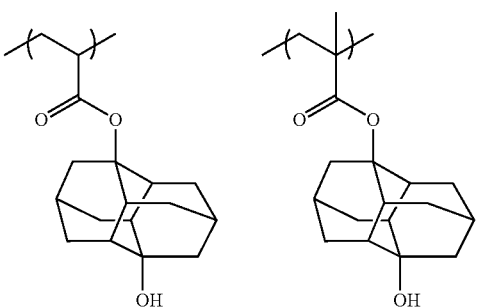

The alicyclic hydrocarbon-containing acid-decomposable resin for use in the invention may have repeating units represented by the following formula (VIII).

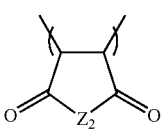

In the formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represent an alkyl group, a cycloalkyl group or a camphor residue. The alkyl groups of $R_{41}$ and $R_{42}$ may be substituted with halogen atoms (preferably fluorine atoms).

Examples of a repeating unit represented by the formula (VIII) are illustrated below, but these examples should not be construed as limiting the scope of the invention.

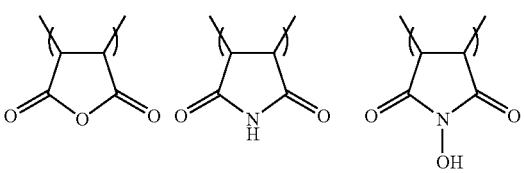

-continued

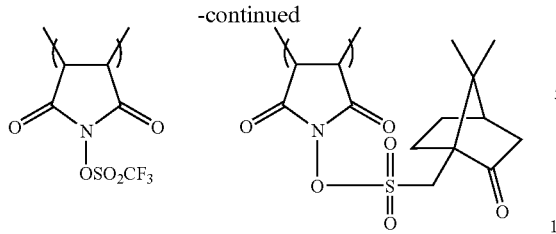

The alicyclic hydrocarbon-containing acid-decomposable resin for use in the invention preferably has repeating units containing alkali-soluble groups, far preferably repeating units containing carboxyl groups. By containing such groups in the repeating units, resolution in contact hole uses is enhanced. Suitable examples of repeating units containing carboxyl groups include repeating units containing carboxyl groups in a state that they are bonded directly to the resin's main chain, such as repeating units derived from acrylic acid and methacrylic acid, repeating units containing carboxyl groups in a state that they are attached to the resin's main chain via linkage groups, and polymer chain terminals wherein alkali-soluble groups are introduced by using a polymerization initiator or chain transfer agent having an alkali-soluble group at the time of polymerization. Therein, the linkage groups may have mononuclear or polynuclear cyclic hydrocarbon structures. However, repeating units derived from acrylic acid and methacrylic acid in particular are preferred.

The alicyclic hydrocarbon-containing acid-decomposable resin for use in the invention may further contain repeating units which each have one, two or three groups represented by the following formula (F1). By containing such repeating units, line edge roughness can be improved.

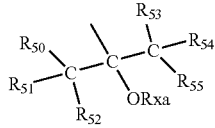

(F1)

In the formula (F1), $R_{50}$ to $R_{55}$ each represent a hydrogen atom, a fluorine atom or an alkyl group independently, provided that at least one of $R_{50}$ to $R_{55}$ is a fluorine atom or a fluorinated alkyl group obtained by substituting at least one hydrogen atom with a fluorine atom.

Rxa represents a hydrogen atom or an organic group (preferably an acid-decomposable protective group, an alkyl group, a cycloalkyl group, an acyl group or an alkoxycarbonyl group).

The alkyl group represented by each of $R_{50}$ to $R_{55}$ may be substituted with a halogen atom, such as a fluorine atom, or a cyano group, with suitable examples including 1-3C alkyl groups, such as a methyl group and a trifluoromethyl group.

The case where all of $R_{50}$ to $R_{55}$ are fluorine atoms is preferred.

Suitable examples of an organic group represented by Rxa include an acid-decomposable protective group, and substituted or unsubstituted alkyl, cycloalkyl, acyl, alkylcarbonyl, alkoxycarbonyl, alkoxycarbonylmethyl, alkoxymethyl and 1-alkoxyethyl groups.

The repeating units having groups represented by the formula (F1) are preferably repeating units represented by the following formula (F2).

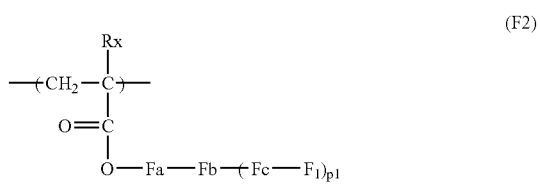

(F2)

In the formula (F2), Rx represents a hydrogen atom, a halogen atom or a 1-4C alkyl group. Suitable examples of a substituent the alkyl group as Rx may have include a hydroxyl group and halogen atoms.

Fa represents a single bond or a linear or branched alkylene group (preferably a single bond).

Fb represents a mononuclear or polynuclear cyclic hydrocarbon group.

Fc represents a single bond or a linear or branched alkylene group (preferably a single bond or a methylene group).

$F_1$ represents a group represented by the formula (F1).

$P_1$ represents 1 to 3.

The cyclic hydrocarbon group as Fb is preferably a cyclopentylene group, a cyclohexylene group or a norbornylene group.

Examples of a repeating unit having a group represented by the formula (F1) are illustrated below, but these examples should not be construed as limiting the scope of the invention.

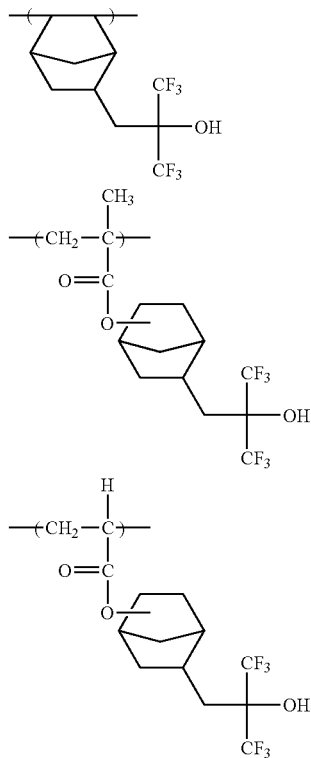

The alicyclic hydrocarbon-containing acid-decomposable resin for use in the invention may further contain repeating units having alicyclic hydrocarbon structures but not showing acid decomposability. By introduction of such repeating units, elution of low molecular components from a resist coating into an immersion liquid at the time of performance of immersion lithography can be reduced. Examples of such repeating units include those derived from 1-adamantyl (meth)acrylate, tricyclodecanyl(meth)acrylate and cyclohexyl(meth)acrylate.

In addition to the repeating structural units recited above, the alicyclic hydrocarbon-containing acid-decomposable resin for use in the invention can contain a wide variety of repeating structural units for the purpose of controlling resistance to dry etching, suitability for standard developers, adhesiveness to substrates, resist profile, and besides, characteristics generally required for resist, such as resolution, thermal resistance and sensitivity.

Examples of such repeating structural units include repeating structural units corresponding to the monomers as recited below, but these examples should not be construed as limiting the scope of the invention.

By containing those repeating units, it becomes possible to make fine adjustments to properties required for the alicyclic hydrocarbon-containing acid-decomposable resin, especially to:

(1) solubility in coating solvents, (2) film formability (glass transition temperature), (3) alkali developability, (4) thinning of film (hydrophilic-hydrophobic balance, alkali-soluble group selection), (5) adhesion of unexposed areas to a substrate, and (6) dry etching resistance.

Examples of monomers suitable for the foregoing purposes include compounds which each have one addition-polymerizable unsaturated bond and are selected from acrylic acid esters, methacrylic acid esters, acrylamides, methacrylamides, allyl compounds, vinyl ethers or vinyl esters.

In addition to those monomers, any other monomers may be copolymerized so long as they are addition-polymerizable unsaturated compounds capable of forming copolymers together with monomers corresponding to the various repeating structural units mentioned above.

The mole fraction of each repeating structural unit in the alicyclic hydrocarbon-containing acid-decomposable resin can be chosen appropriately for adjusting dry etching resistance, standard developer suitability, adhesion to substrates, resist profile, and characteristics generally required for resist, such as resolution, thermal resistance and sensitivity.

Examples of a preferred state of the alicyclic hydrocarbon-containing acid-decomposable resin for use in the invention include the following.

(1) A state of containing repeating units each having a partial structure containing an alicyclic hydrocarbon represented by any of the formulae (pI) to (pV) (side-chain type).

The repeating units contained therein are preferably (meth)acrylate repeating units each having a structure containing any of (pI) to (pV).

(2) A state of containing repeating units represented by the formula (II-AB) (main-chain type). However, the state (2) further includes the following.

(3) A state of having repeating units represented by the formula (II-AB) and maleic anhydride derivative and (meth)acrylate structures (hybrid type).

The content of repeating units having acid-decomposable groups in the alicyclic hydrocarbon-containing acid-decomposable resin is preferably 10 to 60 mole %, far preferably 20 to 50 mole %, further preferably 25 to 40 mole %, of the total repeating structural units.

The content of repeating units having partial structures containing alicyclic hydrocarbons represented by the formulae (pI) to (pV) in the alicyclic hydrocarbon-containing acid-decomposable resin is preferably 20 to 70 mole %, far preferably 20 to 50 mole %, further preferably 25 to 40 mole %, of the total repeating structural units.

The content of repeating units represented by the formula (II-AB) in the alicyclic hydrocarbon-containing acid-decomposable resin is preferably 10 to 60 mole %, far preferably 15 to 55 mole %, further preferably 20 to 50 mole %, of the total repeating structural units.

The content of repeating structural units derived from the additional comonomers in the resin can also be chosen appropriately according to the intended resist performance. In general, the proportion of such repeating structural units is preferably 99 mole % or below, far preferably 90 mole % or below, further preferably 80 mole % or below, based on the total mole number of the repeating structural units having partial structures containing alicyclic hydrocarbons represented by the formulae (pI) to (pV) and the repeating units represented by the formula (II-AB).

When the composition according to the invention is designed for ArF exposure use, it is appropriate to adopt resins not having any aromatic groups in point of transparency to ArF light.

As to the alicyclic hydrocarbon-containing acid-decomposable resin for use in the invention, all of its repeating units are preferably constituted of (meth)acrylate repeating units. Herein, all the repeating units may be either acrylate repeating units alone, or methacrylate repeating units alone, or a mixture of acrylate and methacrylate repeating units. However, it is preferable that the acrylate repeating units is at most 50 mole % of the total repeating units. And it is far preferable that the alicyclic hydrocarbon-containing acid-decomposable resin is a ternary copolymer containing 20 to 50 mole % of repeating units having partial structures containing alicyclic hydrocarbons represented by any of the formulae (pI) to (pV), 20 to 50 mole % of repeating units containing lactone structures and 5 to 30 mole % of repeating units having alicyclic hydrocarbon structures substituted with polar groups, or a quaternary copolymer further containing 0 to 20 mole % of other repeating units.

The resin preferred in particular is a ternary copolymer containing 20 to 50 mole % of repeating units having acid-decomposable groups, which are represented by any of the following formulae (ARA-1) to (ARA-5), 20 to 50 mole % of repeating units having lactone groups, which are represented by any of the following formulae (ARL-1) to (ARL-6), and 5 to 30 mole % of repeating units having alicyclic hydrocarbon structures substituted with polar groups, which are represented by any of the following formulae (ARH-1) to (ARH-3), or a quaternary copolymer further containing 5 to 20 mole % of either repeating units having carboxyl groups, or repeating units having structures represented by the formula (F1), or repeating units having alicyclic hydrocarbon structures but not showing acid decomposability.

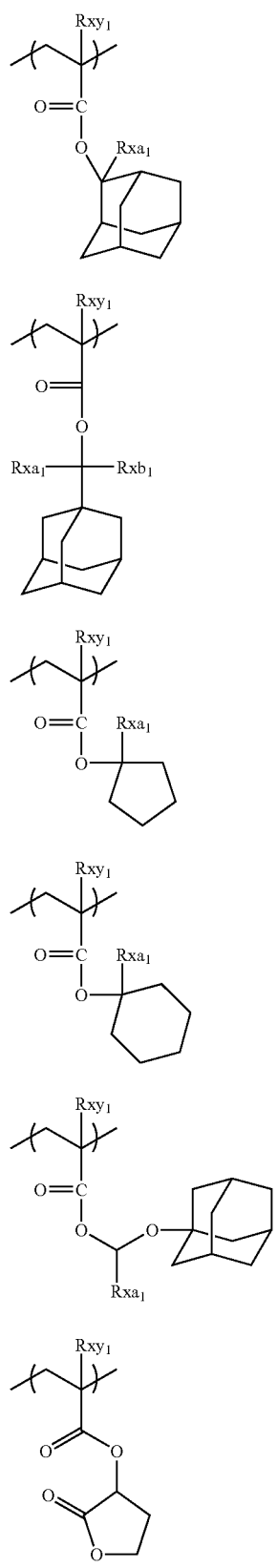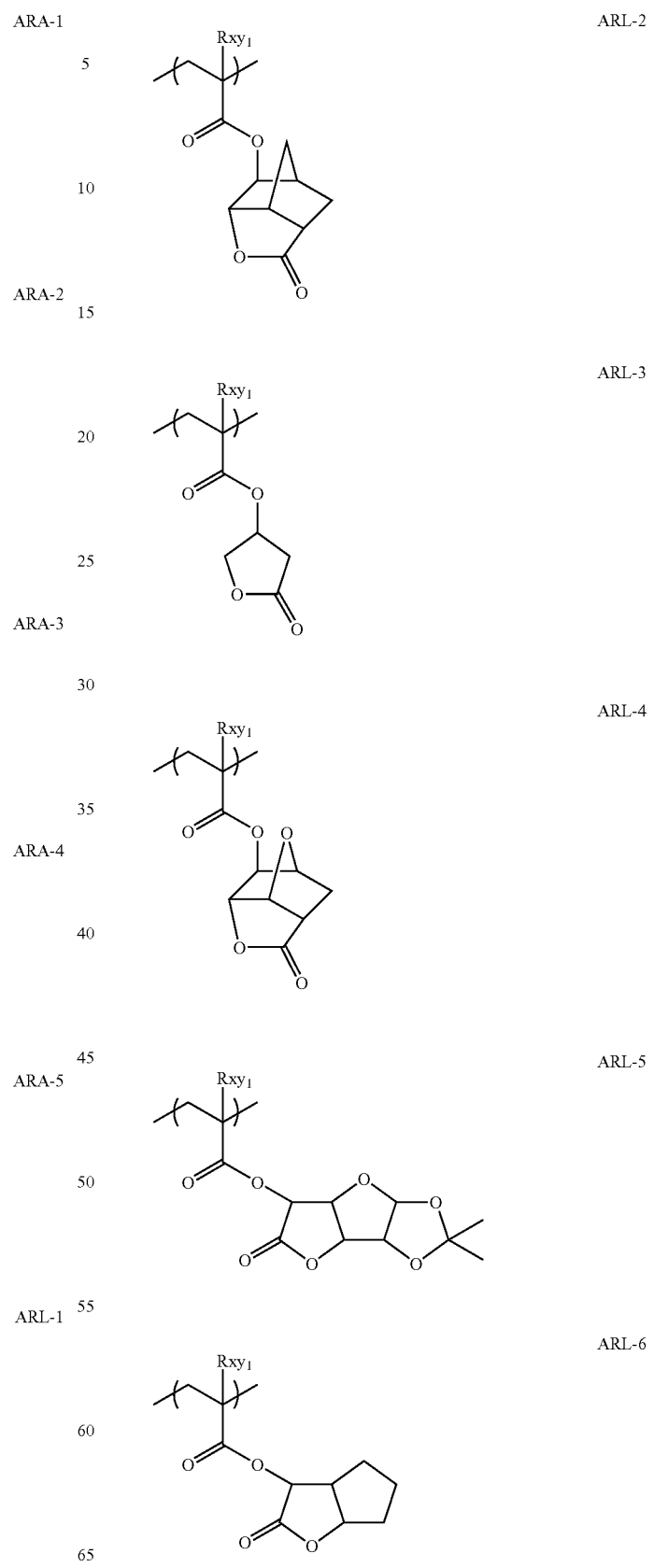

-continued

ARH-1

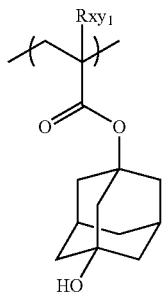

ARH-2

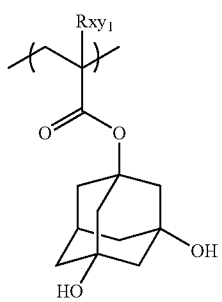

ARH-3

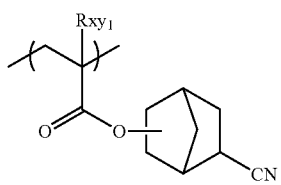

In the above concrete examples each, Rxy$_1$ represents a hydrogen atom or a methyl group.

Rxa$_1$ and Rxb$_1$ each represent a methyl group or an ethyl group independently.

The alicyclic hydrocarbon-containing acid-decomposable resin preferably has repeating units represented by the following formula (A1), repeating units represented by the following formula (A2) and repeating units represented by the following formula (A3).

(A1)

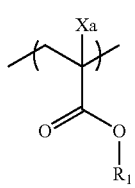

(A2)

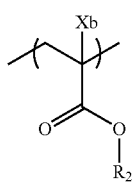

(A3)

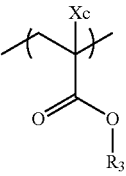

In the formulae (A1) to (A3), Xa, Xb and Xc each represent a hydrogen atom or a methyl group independently.

R$_1$ represents a univalent organic group having a lactone structure.

R$_2$ represents a univalent organic group having a hydroxyl group or a cyano group.

R$_3$ represents a group capable of splitting off under action of an acid.

The repeating units represented by the formula (A1) are preferably the repeating units represented by the formula (AI) illustrated hereinbefore.

The proportion of the repeating units represented by the formula (A1) is preferably 25 to 50 mole % of the total repeating units in the alicyclic hydrocarbon-containing acid-decomposable resin.

The repeating units represented by the formula (A2) are preferably the repeating units represented by the formula (AIIa) or (AIIb) illustrated hereinbefore.

The proportion of the repeating units represented by the formula (A2) is preferably 5 to 30 mole % of the total repeating units in the alicyclic hydrocarbon-containing acid-decomposable resin.

The repeating units represented by the formula (A3) are preferably the repeating units represented by the formula (pA) illustrated hereinbefore.

The proportion of the repeating units represented by the formula (A3) is preferably 25 to 50 mole % of the total repeating units in the alicyclic hydrocarbon-containing acid-decomposable resin.

The alicyclic hydrocarbon-containing acid-decomposable resin for use in the invention can be synthesized according to general methods (e.g., radical polymerization). As examples of a general synthesis method, there are known a batch polymerization method in which polymerization is carried out by dissolving monomer species and an initiator in a solvent and heating, and a drop polymerization method in which a solution containing monomer species and an initiator is added dropwise to a heated solvent over 1 to 10 hours. However, it is preferable to use the drop polymerization method. Examples of a solvent usable in the polymerization reaction include ethers, such as tetrahydrofuran, 1,4-dioxane and diisopropyl ether; ketones, such as methyl ethyl ketone and methyl isobutyl ketone; ester solvents, such as ethyl acetate; amide solvents, such as dimethylformamide and dimethylacetamide; and solvents described later in which the present composition can be dissolved, such as propylene glycol monomethyl ether acetate, propylene glycol monomethyl ether and cyclohexanone. Further, it is preferred to perform polymerization by use of the same solvent as used in the present resist composition. By doing so, development of particles during storage can be retarded.

The polymerization reaction is preferably carried out in an atmosphere of inert gas, such as nitrogen or argon. And the polymerization is initiated using a commercially available radical initiator (e.g., an azo-type initiator or peroxide) as polymerization initiator. As the radical initiator, an azo-type initiator is suitable, and an azo-type initiator having an ester group, a cyano group or a carboxyl group is preferable. Examples of such a preferable azo-type initiator include azobisisobutyronitrile, azobisdimethylvaleronitrile and dimethyl 2,2'-azobis(2-methylpropionate). Such an initiator may be added additionally in the course of polymerization as required, or may be added in several portions. After the conclusion of the reaction, the reaction solution is poured into a solvent, and the intended polymer is collected as a powder or a solid. The concentration of a reaction system is from 5 to 50 mass %, preferably from 10 to 30 mass %, and the reaction temperature is generally from 10° C. to 150° C., preferably from 30° C. to 120° C., far preferably from 60° C. to 100° C.

As to Resin (A), the weight-average molecular weight thereof is preferably from 1,500 to 100,000, far preferably from 2,000 to 70,000, particularly preferably from 3,000 to 50,000. The dispersion degree thereof is preferably from 1.0 to 3.0, far preferably from 1.0 to 2.5, further preferably from 1.0 to 2.0.

The addition amount of Resin (A) is from 50 to 99.7 mass %, preferably from 70 to 99.5 mass %, of the total solids in the positive resist composition.

[2] Compound (B) that can Generate Acid Upon Irradiation with Actinic Ray or Radiation The positive resist composition according to the invention contains a compound capable of generating an acid upon irradiation with an actinic ray or radiation (which is also referred to as "an acid generator").

The compound usable as such an acid generator can be selected appropriately from photo-initiators for cationic photopolymerization, photo-initiators for radical photopolymerization, photodecoloring agents for dyes, photodiscoloring agents, compounds used in microresists and known to generate acids upon irradiation with an actinic ray or radiation, or mixtures of two or more thereof.

Examples of such compounds include diazonium salts, phosphonium salts, sulfonium salts, iodonium salts, imide sulfonates, oxime sulfonates, diazodisulfone, disulfone and o-nitrobenzylsulfonate.

In addition, polymeric compounds having those groups or compounds capable of generating acids upon irradiation with an actinic ray or radiation in a state of being introduced in their main or side chains can also be used. Examples of such polymeric compounds include the compounds as disclosed in U.S. Pat. No. 3,849,137, German Patent No. 3914407, JP-A-63-26653, JP-A-55-164824, JP-A-62-69263, JP-A-63-146038, JP-A-63-163452, JP-A-62-153853 and JP-A-63-146029.

Further, the compounds capable of generating acids by the action of light as disclosed in U.S. Pat. No. 3,779,778 and European Patent No. 126,712 can also be used.

Of the compounds capable of decomposing upon irradiation with an actinic ray or radiation to generate acids, compounds represented by the following formulae (ZI), (ZII) and (ZIII) respectively are preferred.

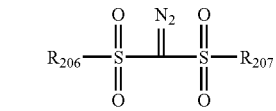

ZI

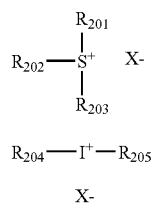

ZII

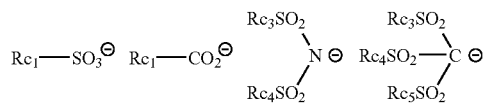

ZIII

In the formula (ZI), $R_{201}$, $R_{202}$ and $R_{203}$ each represent an organic group independently.

$X^-$ represents a non-nucleophilic anion, preferably a sulfonic acid anion, a carboxylic acid anion, a bis(alkylsulfonyl)amide anion, a tris(alkylsulfonyl)methide anion, $BF_4^-$, $PF_6^-$ or $SbF_6^-$, far preferably an organic anion having at least one carbon atom.

Examples of an organic anion suitable as $X^-$ include organic anions represented by the following formulae.

$$Rc_1-SO_3^{\ominus} \quad Rc_1-CO_2^{\ominus} \quad \begin{matrix} Rc_3SO_2 \\ \diagdown \\ N^{\ominus} \\ \diagup \\ Rc_4SO_2 \end{matrix} \quad \begin{matrix} Rc_3SO_2 \\ \diagdown \\ Rc_4SO_2-C^{\ominus} \\ \diagup \\ Rc_5SO_2 \end{matrix}$$

In the above formulae, $Rc_1$ represents an organic group.

Examples of an organic group as $Rc_1$ include those containing 1 to 30 carbon atoms, preferably alkyl groups and aryl groups, which each may be substituted, and groups formed by connecting two or more of those groups via one or more of linkage groups, such as a single bond, —O—, —$CO_2$—, —S—, —$SO_3$— and —$SO_2N(Rd_1)$-. $Rd_1$ represents a hydrogen atom or an alkyl group.

$Rc_3$, $Rc_4$ and $Rc_5$ each represents an organic group independently. Suitable examples of such an organic group include the same organic groups as recited as those preferred by $Rc_1$, especially 1-4C perfluoroalkyl groups.

$Rc_3$ and $Rc_4$ may combine with each other to form a ring. The group formed by combining $Rc_3$ with $Rc_4$ is an alkylene group or an arylene group, preferably a 2-4C perfluoroalkylene group.

The organic groups particularly preferred as $Rc_1$ and $Rc_3$ to $Rc_5$ are alkyl groups substituted with fluorine atoms or fluoroalkyl groups at their respective 1-positions and phenyl groups substituted with fluorine atoms or fluoroalkyl groups. When a fluorine atom or a fluoroalkyl group is present, the acid generated by irradiation with light can have high acidity to result in enhancement of the sensitivity. On the other hand, when $Rc_3$ and $Rc_4$ combine with each other to form a ring, the acid generated by irradiation with light can also increase its acidity to result in enhancement of the sensitivity.

The number of carbon atoms in the organic group as $R_{201}$, $R_{202}$ and $R_{203}$ each is generally from 1 to 30, preferably from 1 to 20.

Two of $R_{201}$ to $R_{203}$ may combine with each other to form a ring structure, and the ring formed may contain an oxygen atom, a sulfur atom, an ester linkage, an amide linkage or a carbonyl group. Examples of a group formed by combining two of $R_{201}$, $R_{202}$ and $R_{203}$ include alkylene groups (such as a butylene group and a pentylene group).

Examples of organic groups as $R_{201}$, $R_{202}$ and $R_{203}$ include their corresponding groups in compounds (Z1-1), (Z1-2) and (Z1-3) illustrated below.

Additionally, the acid generator may be a compound having two or more of structures represented by formula (ZI). For instance, the acid generator may be a compound having a structure that at least one of $R_{201}$, $R_{202}$ and $R_{203}$ in one compound represented by formula (ZI) is bound to at least one of $R_{201}$, $R_{202}$ and $R_{203}$ in another compound represented by formula (ZI).

Examples of a further preferred component (ZI) include compounds (ZI-1), (ZI-2) and (ZI-3).

The compound (Z1-1) is an arylsulfonium compound represented by the formula (ZI) wherein at least one of $R_{201}$ to $R_{203}$ is an aryl group, namely a compound having an arylsulfonium as its cation.

In such an arylsulfonium compound, all of $R_{201}$ to $R_{203}$ may be aryl groups, or one or two of $R_{201}$ to $R_{203}$ may be aryl groups and the remainder may be an alkyl group or a cycloalkyl group.

Examples of such an arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as a phenyl group or a naphthyl group, or a hetroaryl group such as an indole residue or a pyrrole residue, far preferably a phenyl group or an indole residue. When the arylsulfonium compound has two or more aryl groups, the two or more aryl groups may be the same or different.

One or two alkyl groups which the arylsulfonium compound has as required are preferably 1-15C linear or branched alkyl groups, with examples including a methyl group, an ethyl group, a propyl group, an n-butyl group, a sec-butyl group and a t-butyl group.

One or two cycloalkyl groups which the arylsulfonium compound has as required are preferably 3-15C cycloalkyl groups, with examples including a cyclopropyl group, a cyclobutyl group and a cyclohexyl group.

The aryl group, the alkyl group or the cycloalkyl group represented by any of $R_{201}$ to $R_{203}$ may have as a substituent an alkyl group (containing, e.g., 1 to 15 carbon atoms), a cycloalkyl group (containing, e.g., 3 to 15 carbon atoms), an aryl group (containing, e.g., 6 to 14 carbon atoms), an alkoxy group (containing, e.g., 1 to 15 carbon atoms), a halogen atom, a hydroxyl group or a phenylthio group. Suitable examples of such substituents include 1-12C linear or branched alkyl groups, 3-12C cycloalkyl groups and 1-12C linear, branched or cyclic alkoxy groups. Of these substituents, 1-4C alkyl groups and 1-4C alkoxy groups are preferred over the others. One of $R_{201}$ to $R_{203}$ may have such a substituent, or all of $R_{201}$ to $R_{203}$ may have such substituents. When $R_{201}$ to $R_{203}$ are aryl groups, it is preferable that such a substituent is situated in the p-position of each aryl group.

Next, the compound (ZI-2) is explained below.

The compound (ZI-2) is a compound represented by the formula (ZI) in which $R_{201}$ to $R_{203}$ each independently represent an organic group having no aromatic ring. The term "aromatic ring" as used herein is intended to also include aromatic rings containing hetero atoms.

The number of carbon atoms in an aromatic ring-free organic group as each of $R_{201}$ to $R_{203}$ is generally from 1 to 30, preferably from 1 to 20.

Each of $R_{201}$ to $R_{203}$ is preferably an alkyl group, a cycloalkyl group, an allyl group or a vinyl group, far preferably a linear, branched or cyclic 2-oxoalkyl group, or an alkoxycarbonylmethyl group, particularly preferably a linear or branched 2-oxoalkyl group.

The alkyl group as each of $R_{201}$ to $R_{203}$ may have either a linear or branched form, and it is preferably a 1-10C linear or branched group, with examples including a methyl group, an ethyl group, a propyl group, a butyl group and a pentyl group.

The alkyl group as each of $R_{201}$ to $R_{203}$ is far preferably a linear or branched 2-oxoalkyl group, or an alkoxycarbonylmethyl group.

The cycloalkyl group as each of $R_{201}$ to $R_{203}$ is preferably a 3-10C cycloalkyl group, such as a cyclopentyl group, a cyclohexyl group or a norbornyl group. The cycloalkyl group as each of $R_{201}$ to $R_{203}$ is far preferably a cyclic 2-oxoalkyl group.

Suitable examples of a linear, branched or cyclic 2-oxoalkyl group as each of $R_{201}$ to $R_{203}$ include the above-recited alkyl and cycloalkyl groups having >C=O at their respective 2-positions.

The alkoxy moiety in an alkoxycarbonylmethyl group as each of $R_{201}$ to $R_{203}$ is preferably a 1-5C alkoxy group (such as a methoxy, ethoxy, propoxy, butoxy or pentoxy group).

Each of groups represented by $R_{201}$ to $R_{203}$ may further be substituted with a halogen atom, an alkoxy group (containing, e.g., 1 to 5 carbon atoms), a hydroxyl group, a cyano group or a nitro group.

The compound (ZI-3) is a compound represented by the following formula (ZI-3), namely a compound having a phenacylsulfonium salt structure.

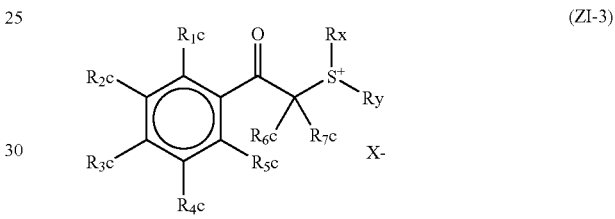

(ZI-3)

In the formula (ZI-3), $R_{1c}$ to $R_{5c}$ each represent a hydrogen atom, an alkyl group, a cycloalkyl group, an alkoxy group or a halogen atom independently.

$R_{6c}$ and $R_{7c}$ each represent a hydrogen atom, an alkyl group or a cycloalkyl group independently.

$R_x$ and $R_y$ each represent an alkyl group, a cycloalkyl group, an allyl group or a vinyl group independently.

Any two or more of $R_{1c}$ to $R_{7c}$ may combine with one another to form a ring structure, and $R_x$ and $R_y$ may also combine with each other to form a ring structure. In such a ring structure, an oxygen atom, a sulfur atom, an ester linkage or an amide linkage may be contained. The group formed by combining any two or more of $R_{1c}$ to $R_{7c}$ or by combining $R_x$ and $R_y$ may be a butylene group or a pentylene group.

$X^-$ represents a non-nucleophilic anion, and examples thereof include the same non-nucleophilic anions as examples of $X^-$ in formula (ZI).

The alkyl group as each of $R_{1c}$ to $R_{7c}$ may have either a linear form or a branched form, and suitable examples thereof include 1-20C linear and branched alkyl groups, preferably 1-12C linear and branched alkyl groups, such as a methyl group, an ethyl group, a linear or branched propyl group, linear or branched butyl groups, and linear or branched pentyl groups.

Suitable examples of the cycloalkyl group as each of $R_{1c}$ to $R_{7c}$ include 3-8C cycloalkyl groups, such as a cyclopentyl group and a cyclohexyl group.

The alkoxy group as each of $R_{1c}$ to $R_{5c}$ may have either a linear form, or a branched form, or a cyclic form, and examples thereof include 1-10C alkoxy groups, preferably 1-5C linear and branched alkoxy groups (such as a methoxy group, an ethoxy group, a linear or branched propoxy group, linear or branched butoxy groups, and linear or branched pentoxy groups) and 3-8C cycloalkoxy groups (such as a cyclopentyloxy group and a cyclohexyloxy group).

It is preferable that any of $R_{1c}$ to $R_{5c}$ is a linear or branched alkyl group, a cycloalkyl group, or a linear, branched or cyclic alkoxy group, and it is far preferable that the number of total carbon atoms in $R_{1c}$ to $R_{5c}$ is from 2 to 15. By respond to this request, the solvent solubility can be enhanced, and development of particles during storage can be inhibited.

Examples of the alkyl group as each of $R_x$ and $R_y$ include the same groups as examples of the alkyl group as each of $R_{1c}$ to $R_{7c}$, preferably linear and branched 2-oxoakyl groups and alkoxycarbonylmethyl groups.

Examples of the cycloalkyl group as each of $R_x$ and $R_y$ include the same groups as examples of the cycloalkyl group as each of $R_{1c}$ to $R_{7c}$, preferably cyclic 2-oxoakyl groups Examples of the linear, branched and cyclic 2-oxoalkyl groups include the same alkyl and cycloalkyl groups as $R_{1c}$ to $R_{7c}$ may represent, except that they have >C=O at their respective 2-positions.

The alkoxy moiety in the alkoxycarbonylmethyl group includes the same alkoxy groups as $R_{1c}$ to $R_{5c}$ each may represent.

Each of $R_x$ and $R_y$ is preferably an alkyl group containing at least 4 carbon atoms, far preferably an alkyl group containing at least 6 carbon atoms, further preferably an alkyl group containing at least 8 carbon atoms.

In the formulae (ZII) and (ZIII) each, $R_{204}$ to $R_{207}$ each represent an aryl group, an alkyl group or a cycloalkyl group independently.

The aryl group as each of $R_{204}$ to $R_{207}$ is preferably a phenyl group or a naphthyl group, far preferably a phenyl group.

The alkyl group as each of $R_{204}$ to $R_{207}$ may have either a linear form or a branched form, with suitable examples including 1-10C linear and branched alkyl groups, such as a methyl group, an ethyl group, a propyl group, a butyl group and a pentyl group.

The cycloalkyl group as each of $R_{204}$ to $R_{207}$ is preferably a 3-10C cycloalkyl group, with examples including a cyclopentyl group, a cyclohexyl group and a norbornyl group.

The alkyl, cycloalkyl and aryl groups which $R_{204}$ to $R_{207}$ each can represent may have substituents. Examples of such substituents include an alkyl group (containing, e.g., 1 to 15 carbon atoms), a cycloalkyl group (containing, e.g., 3 to 15 carbon atoms), an aryl group (containing, e.g., 6 to 15 carbon atoms), an alkoxy group (containing, e.g., 1 to 15 carbon atoms), a halogen atom, a hydroxyl group and a phenylthio group.

$X^-$ represents a non-nucleophilic anion, and examples thereof include the same non-nucleophilic anions as the $X^-$ in the formula (ZI) represents.

As examples of a compound which can generate an acid upon irradiation with an actinic ray or radiation and is usable in the invention, compounds represented by the following formulae (ZIV), (ZV) and (ZVI) can further be given.

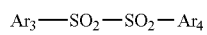

ZIV

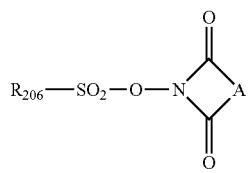

ZV

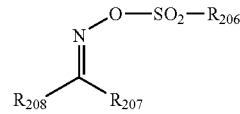

ZVI

In the formulae (ZIV) to (ZVI), $Ar_3$ and $Ar_4$ each represent an aryl group independently.

$R_{206}$ represents an alkyl group, a cycloalkyl group or an aryl group.

$R_{207}$ and $R_{208}$ each represent an alkyl group, a cycloalkyl group, an aryl group or an electron-attracting group. $R_{207}$ is preferably an aryl group. $R_{208}$ is preferably an electron-attracting group, far preferably a cyano group or a fluoroalkyl group.

A represents an alkylene group, an alkenylene group or an arylene group.

Of the compounds that can decompose upon irradiation with an actinic ray or radiation to generate acids, the compounds represented by (ZI) to (ZIII) are preferred over the others.

Examples of particularly preferred ones of compounds capable of decomposing upon irradiation with an actinic ray or radiation to generate acids are illustrated below.

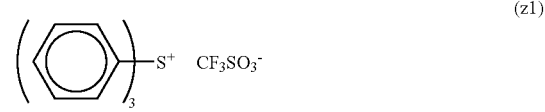

(z1)

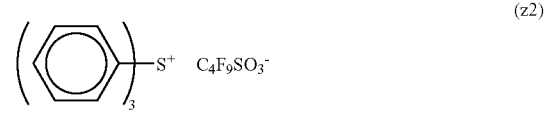

(z2)

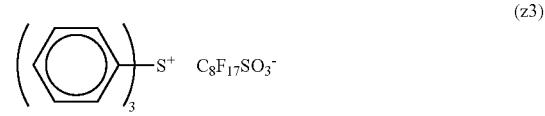

(z3)

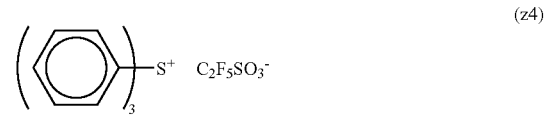

(z4)

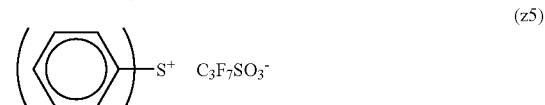

(z5)

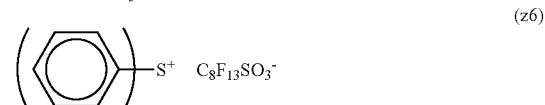

(z6)

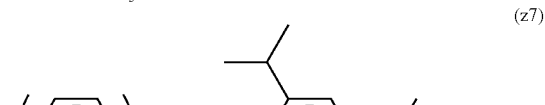

(z7)

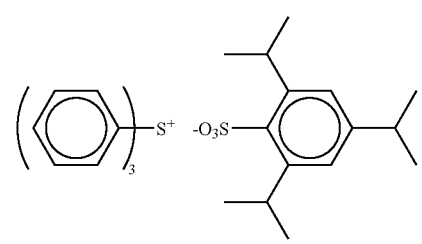

-continued
(z8) 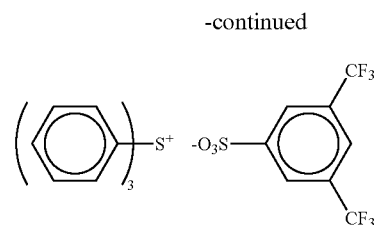
(z9) 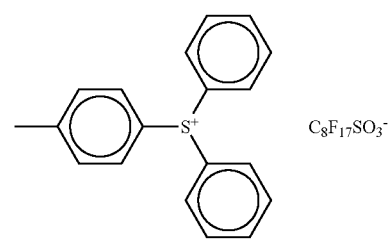
(z10) 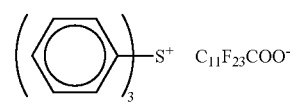
(z11) 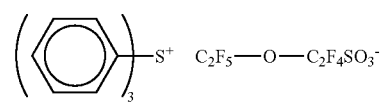
(z12) 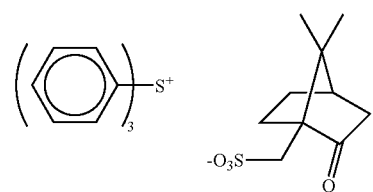
(z13) 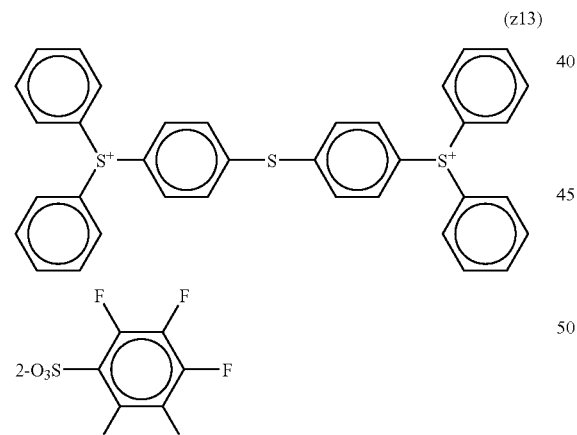
-continued
(z15) 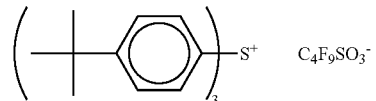
(z16) 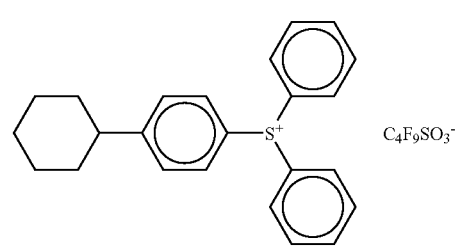
(z17) 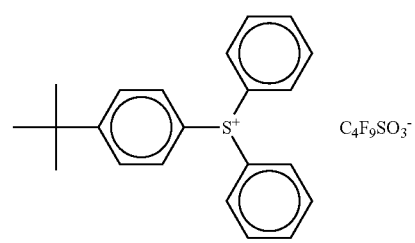
(z18) 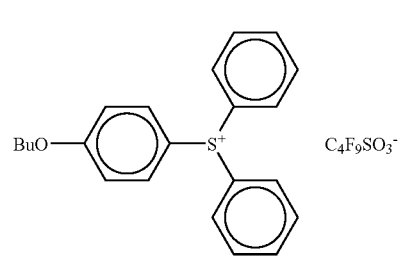
(z19) 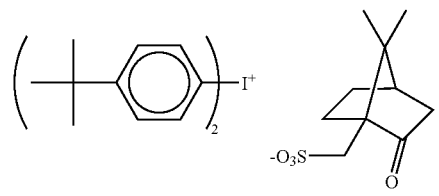
(z20) 
(z21) 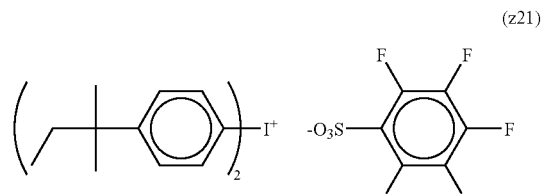
(z22) 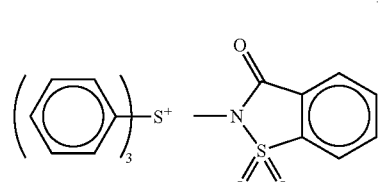

-continued
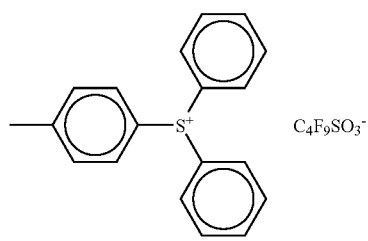
(z23)
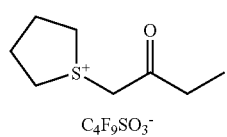
(z24)
(z25)
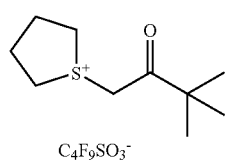
(z26)
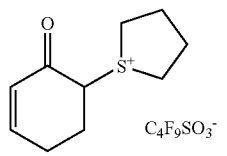
(z27)
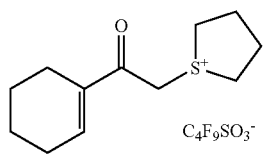
(z28)
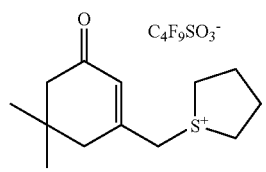
(z29)
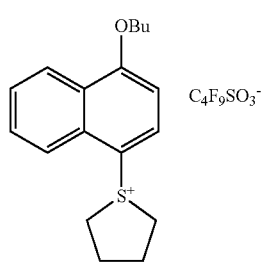
(z30)
-continued
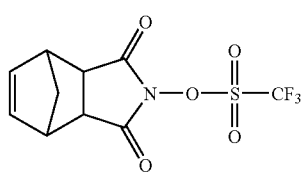
(z31)
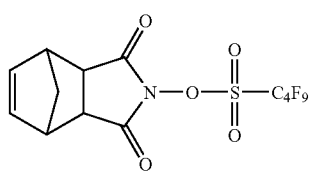
(z32)
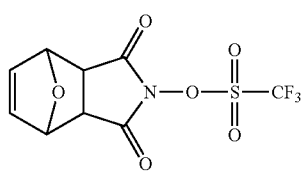
(z33)
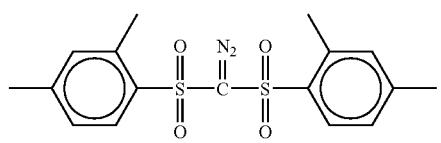
(z34)
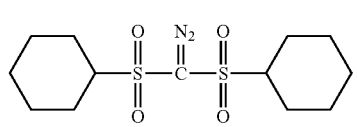
(z35)
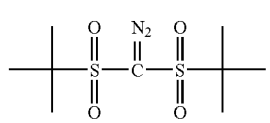
(z36)
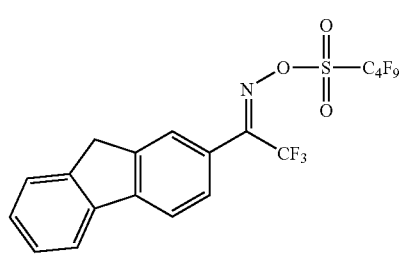
(z37)
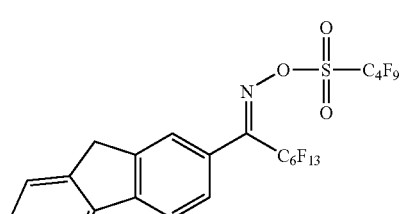
(z38)
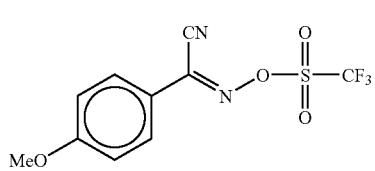
(z39)

-continued
(z40)
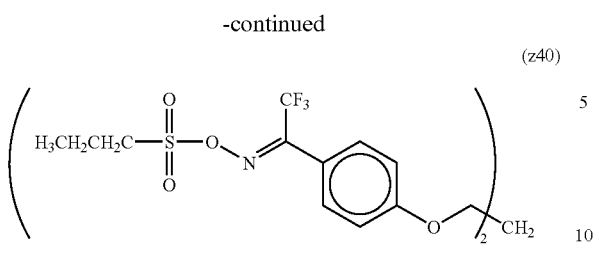
(z41)
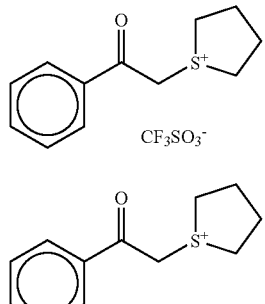
(z42)
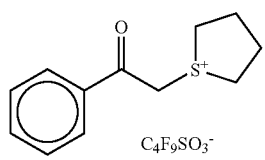
(z43)
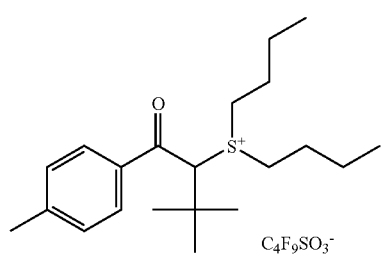
(z44)
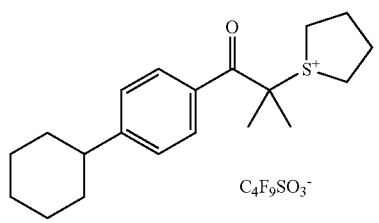
(z45)
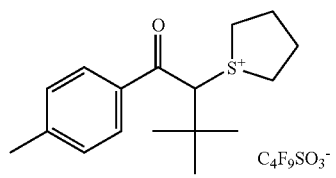
(z46)
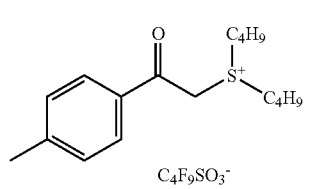
(z47)
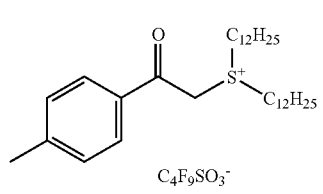
-continued
(z48)
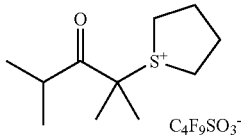
(z49)
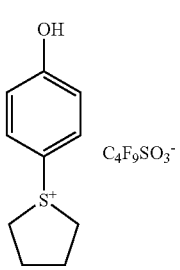
(z50)
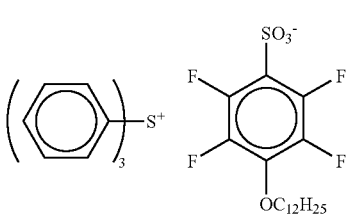
(z51)
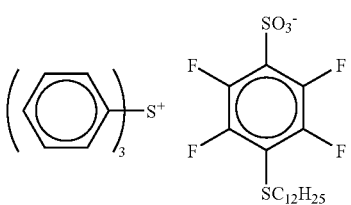
(z52)
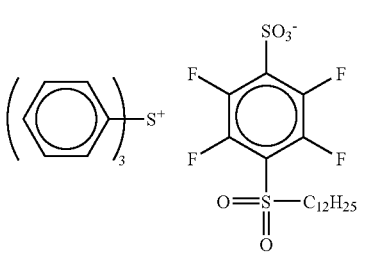
(z53)
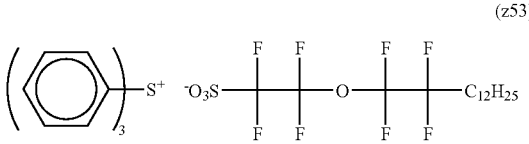
(z54)
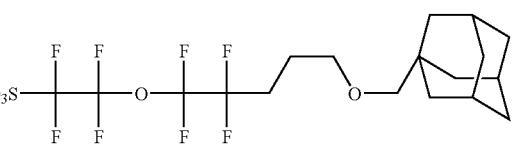

-continued

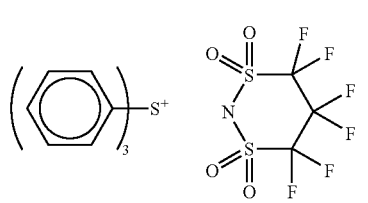
(z55)

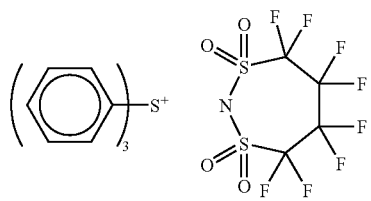
(z56)

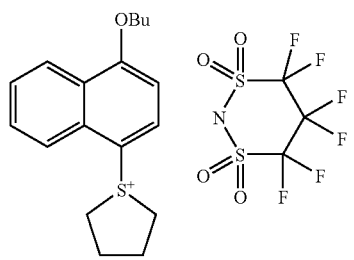
(z57)

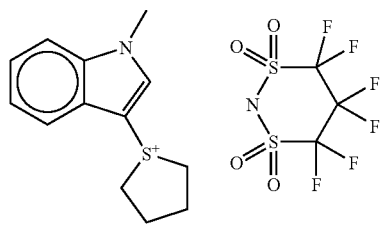
(z58)

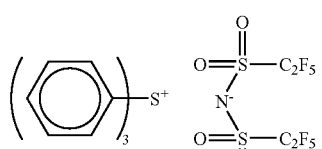
(z59)

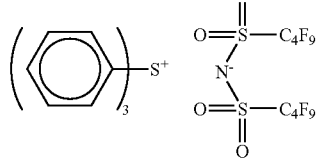
(z60)

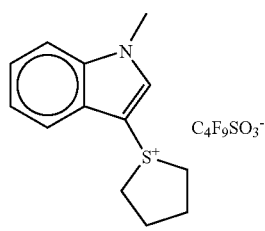
(z61)

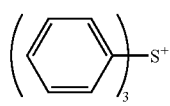
(z62)

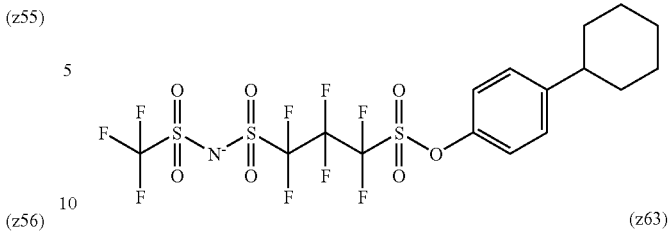
(z63)

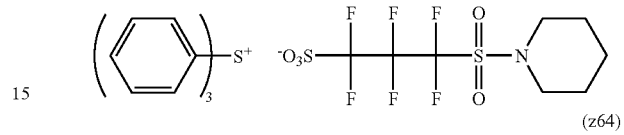
(z64)

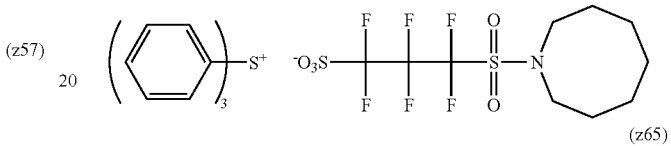
(z65)

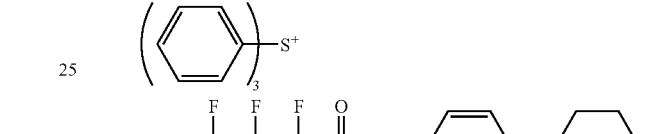
(z66)

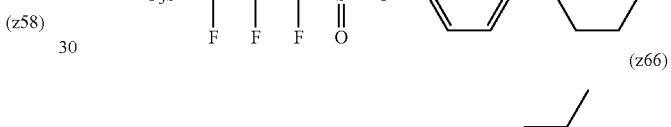

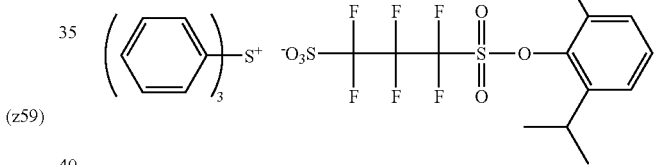

Acid generators can be used singly or as combinations of two or more thereof. When two or more types of acid generators are used in combination, it is preferred to combine compounds generating two types of organic acids differing from each other by at least two in the total number of atoms, except for hydrogen atoms.

The content of acid generators in a positive resist composition is preferably from 0.1 to 20 mass %, far preferably from 0.5 to 10 mass %, further preferably from 1 to 7 mass %, based on the total solids in the composition.

[3] Silicon-Containing Resin (C)

The positive resist composition according to the invention is characterized by incorporation of a silicon-containing resin having at least one group selected from the following category (X), (XI) or (XII) (which is also referred to as "a resin of Component (C)" or "a silicon-containing Resin (C)").

(X): Alkali-soluble groups.

(XI): Groups capable of decomposing under action of an alkaline developer and increasing solubility of a resin of Component (C) in the alkaline developer (hereinafter referred to as "alkali-hydrolyzable groups", too).

(XII): Groups capable of decomposing under action of an acid and increasing solubility of a resin of Component (C) in an alkaline developer (hereinafter referred to as "acid-decomposable groups", too).

(X) Alkali-Soluble Group

The term "alkali-soluble group" as used herein refers to the group by the presence of which the silicon-containing Resin (C) can increase its solubility in a 2.38 mass % aqueous solution of tetramethylammonium hydroxide at 23° C. when compared with the case where the alkali-soluble group (X) is absent therein, and the alkali-soluble group is preferably an acidic group having a pKa of 0.0 to 15.0, especially 3.0 to 12.0.

Suitable examples of an alkali-soluble group (X) include groups having a phenolic hydroxyl group, a carboxylic group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Of these alkali-soluble groups, a fluorinated alcohol group (preferably a hexafluoroisopropanol group, or —C(CF$_3$)(CF$_3$)(OH)) and a sulfonylimide group are preferred over the others.

(XI) Group Capable of Decomposing Under Action of Alkaline Developer and Increasing Solubility of Resin of Component (C) in Alkaline Developer The term "group capable of decomposing under action of an alkaline developer and increasing solubility of a resin of Component (C) in the alkaline developer" refers to the group undergoing hydrolysis reaction in an alkaline developer and being converted into an alkali-soluble group (X).

Suitable examples of an alkali-hydrolyzable group include a lactone group, an ester group, a sulfonamide group, an acid anhydride group and an acid imide group, preferably a lactone group, a sulfonamide group and acid imide group.

(XII) Group Capable of Decomposing Under Action of Acid and Increasing Solubility of Resin of Component (C) in Alkaline Developer The term "group capable of decomposing under action of an acid and increasing solubility of a resin of Component (C) in an alkaline developer refers to the group undergoing decomposition reaction by catalysis of an acid generated in exposed areas at the step of heating after exposure (or the step usually referred to as "Post Exposure Bake (=PEB)") as included in a general resist pattern forming process and being converted into an alkali-soluble group (X).

Examples of such an acid-decomposable group include the same acid-decomposable groups as recited in the description of the resin of Component (A).

When the silicon-containing Resin (C) has either an alkali-soluble group (X), or an alkali-hydrolyzable group (XI), or both, it is preferable that no acid-decomposable group (XII) is contained therein.

When the silicon-containing Resin (C) has an acid-decomposable group (XII), on the other hand, it is preferable that neither alkali-soluble group (X) nor alkali-hydrolyzable group (XI) is contained therein.

The silicon-containing Resin (C) may also be a resin having at least one group selected from the categories (X) to (XII) and being soluble in alkali and/or increasing its solubility in an alkaline developer under action of an acid.

The wording "soluble in alkali" for the silicon-containing Resin (C) means that the resin is soluble in an alkaline developer as mentioned below (usually an alkaline aqueous solution having a pH of 10.0 to 15.0 at 23° C.).

When the silicon-containing Resin (C) is a resin soluble in alkali, it has an alkali-soluble group (X) and/or a group (XI) that can be hydrolyzed by an alkaline developer and made soluble. Examples of groups (X) and (XI) include the same alkali-soluble groups and alkali-hydrolyzable groups as recited above.

The wording "acid-decomposable" for the silicon-containing Resin (C) means that the resin can increase its solubility in an alkaline developer by the action of an acid.

When the silicon-containing Resin (C) is a resin whose solubility in an alkaline developer can be increased by the action of an acid, it has a group (XII) capable of generating an alkali-soluble group through decomposition under action of an acid (acid-decomposable group), or a protected alkali-soluble group. Examples of such a group include the same acid-decomposable groups as the resin of Component (A) has.

When the silicon-containing Resin (C) is soluble in alkali, the Resin (C) is preferably an alkali-soluble resin causing no increase in alkaline developer solubility under action of an acid.

When the silicon-containing Resin (C) is a resin capable of increasing its solubility in an alkaline developer under action of acid, it is preferable that the solubility in an alkaline developer is increased by the action of an acid and the unexposed areas are insoluble in alkali.

Silicon atoms of the silicon-containing Resin (C) may be contained in repeating units having either alkali-soluble groups (X), or alkali-hydrolyzable groups (XI), or acid-decomposable groups (XII), or repeating units other than those having groups (X) to (XII).

Specifically, it is preferable that a silicon atom or silicon atoms are contained in either a repeating unit represented by the following formula (C1), or a repeating unit represented by the following formula (C2).

(C1)

(C2)

In the formulae (C1) and (C2), $X_{11}$ represents an oxygen atom or —N($R_{13}$)—. $R_{13}$ represents a hydrogen atom, an alkyl group or a cycloalkyl group. The alkyl group may be linear or branched, and may have a substituent, such as a halogen atom.

$R_{11}$ represents a hydrogen atom, a halogen atom, an alkyl group or a cycloalkyl group. The alkyl group may be linear or branched, and may have a substituent, such as a halogen atom.

$R_{12}$ and $R_{21}$ each represent an organic group having at least one silicon atom.

The alkyl groups of $R_{11}$ and $R_{13}$ are preferably 1-5C alkyl groups, with examples including a methyl group, an ethyl group and a t-butyl group.

The cycloalkyl groups of $R_{11}$ and $R_{13}$ are preferably 3-10C cycloalkyl groups, with examples including a cyclohexyl group and a cyclooctyl group.

Examples of repeating units having silicon atoms in the silicon-containing Resin (C) are illustrated below, but these examples should not be construed as limiting the scope of the invention.
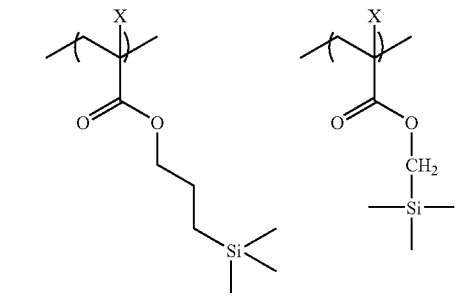
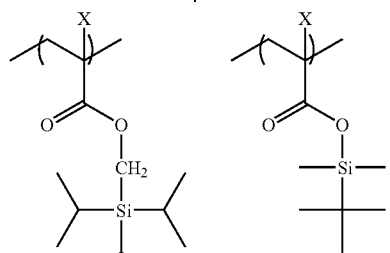
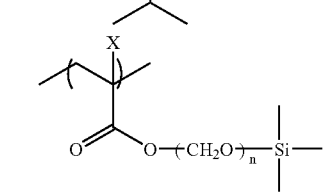
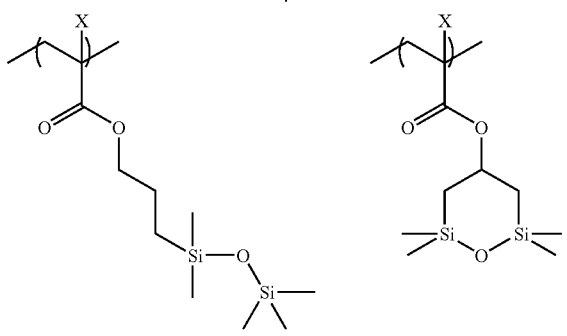
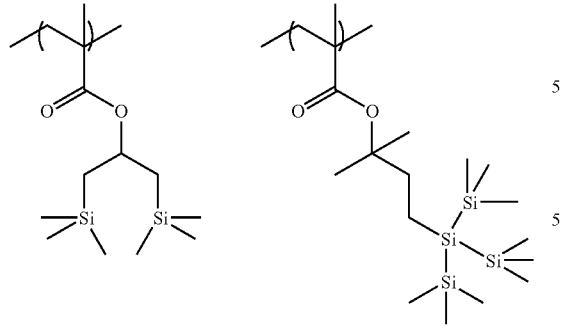
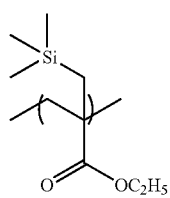
-continued
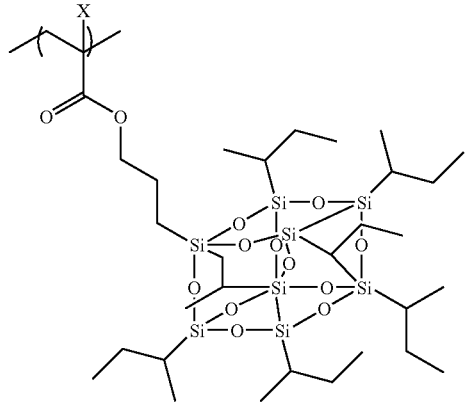
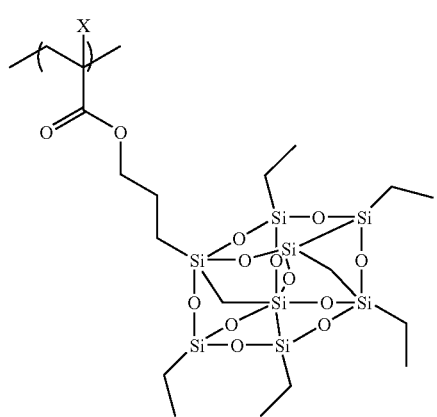
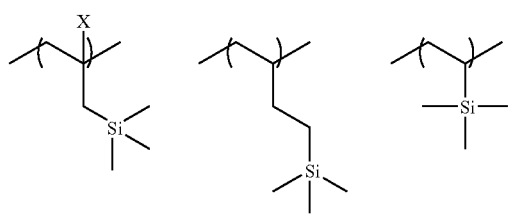
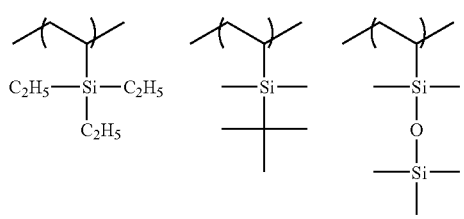
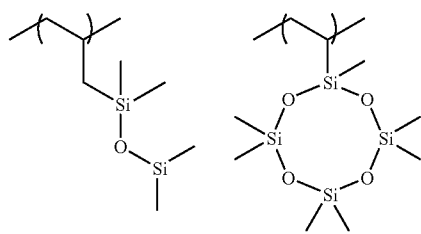

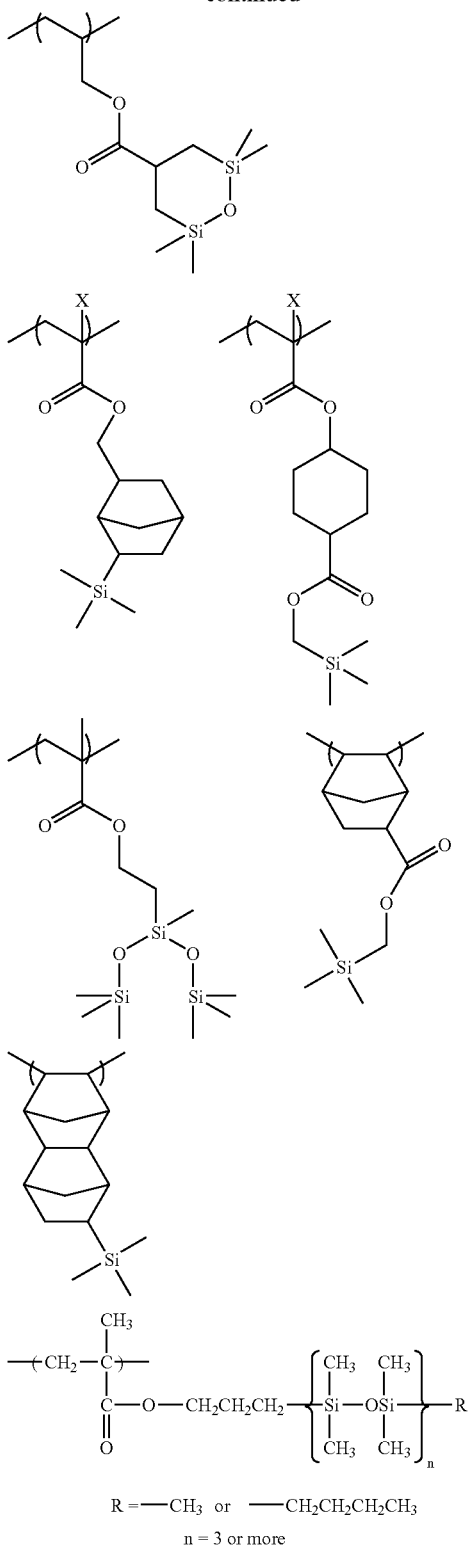

-continued

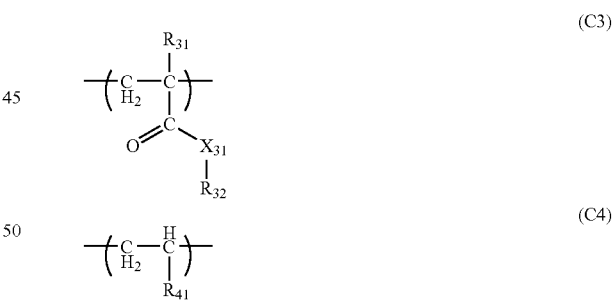

R = —CH₃ or —CH₂CH₂CH₂CH₃ n = 3 or more

X = H, CH₃, F, CH₃

The silicon-containing Resin (C) in the positive resist composition according to the invention may further contain fluorine atoms.

When the silicon-containing Resin (C) contains fluorine atoms, it is preferable that the fluorine atoms are contained in the form of groups selected from the following categories (F-a) to (F-c).

(F-a): Alkyl groups having fluorine atoms
(F-b): Cycloalkyl groups having fluorine atoms
(F-c): Aryl groups having fluorine atoms The alkyl groups falling under (F-a) are preferably 1-4C linear or branched alkyl groups which are each substituted with at least one fluorine atom, and they may further have other substituents.

The cycloalkyl groups falling under (F-b) are preferably mononuclear or polynuclear cycloalkyl groups which are each substituted with at least one fluorine atom, and they may further have other substituents.

The aryl groups falling under (F-c) are preferably aryl groups, such as a phenyl group and a naphthyl group, which are each substituted with at least one fluorine atom, and they may further have other substituents.

When the silicon-containing Resin (C) has fluorine atoms, the fluorine atoms may be present in either the main chain or side chains, but they are preferably present in side chains.

When the silicon-containing Resin (C) has fluorine atoms, the alkali-soluble groups (X), alkali-decomposable groups (XI) or/and acid-decomposable groups (XII) contained in the silicon-containing Resin (C) can include fluorine-containing ones. For instance, the silicon-containing Resin (C) can contain a fluorinated alcohol group like a hexafluoroisopropanol group as an alkali-soluble group (X).

When the silicon-containing Resin (C) has fluorine atoms, the fluorine atoms may be present, as mentioned above, in repeating units having alkali-soluble groups (X), alkali-hydrolyzable groups (XI) or acid-decomposable groups (XII) in conjunction with such groups, or in repeating units other than those having groups (X) to (XII).

More specifically, it is preferable that fluorine atoms are present in the form of either repeating units represented by the following formula (C3) or repeating units represented by the following formula (C4).

$$\left(\begin{array}{c}R_{31}\\|\\-C_{H_2}-C-\\|\\C=O\\|\\X_{31}\\|\\R_{32}\end{array}\right) \quad (C3)$$

$$\left(\begin{array}{c}H\\|\\-C_{H_2}-C-\\|\\R_{41}\end{array}\right) \quad (C4)$$

In the formulae (C3) and (C4), $X_{31}$ represents an oxygen atom or $-N(R_{33})-$. $R_{33}$ represents a hydrogen atom, an alkyl group or a cycloalkyl group. The alkyl group may be linear or branched, and may have a substituent, such as a halogen atom.

$R_{31}$ represents a hydrogen atom, a halogen atom, an alkyl group or a cycloalkyl group. The alkyl group may be linear or branched, and may have a substituent, such as a halogen atom.

$R_{31}$ and $R_{41}$ each represent an organic group having at least one fluorine atom.

The alkyl group which $R_{31}$ and $R_{33}$ each can represent is preferably a 1-5C alkyl group, such as a methyl group, an ethyl group or a t-butyl group.

The cycloalkyl group which $R_{31}$ and $R_{33}$ each can present is preferably a 3-10C cycloalkyl group, such as a cyclohexyl group or a cyclooctyl group.

Examples of a fluorine-containing repeating unit in cases where the silicon-containing Resin (C) has fluorine atoms are illustrated below, but these examples should not be construed as limiting the scope of the invention.

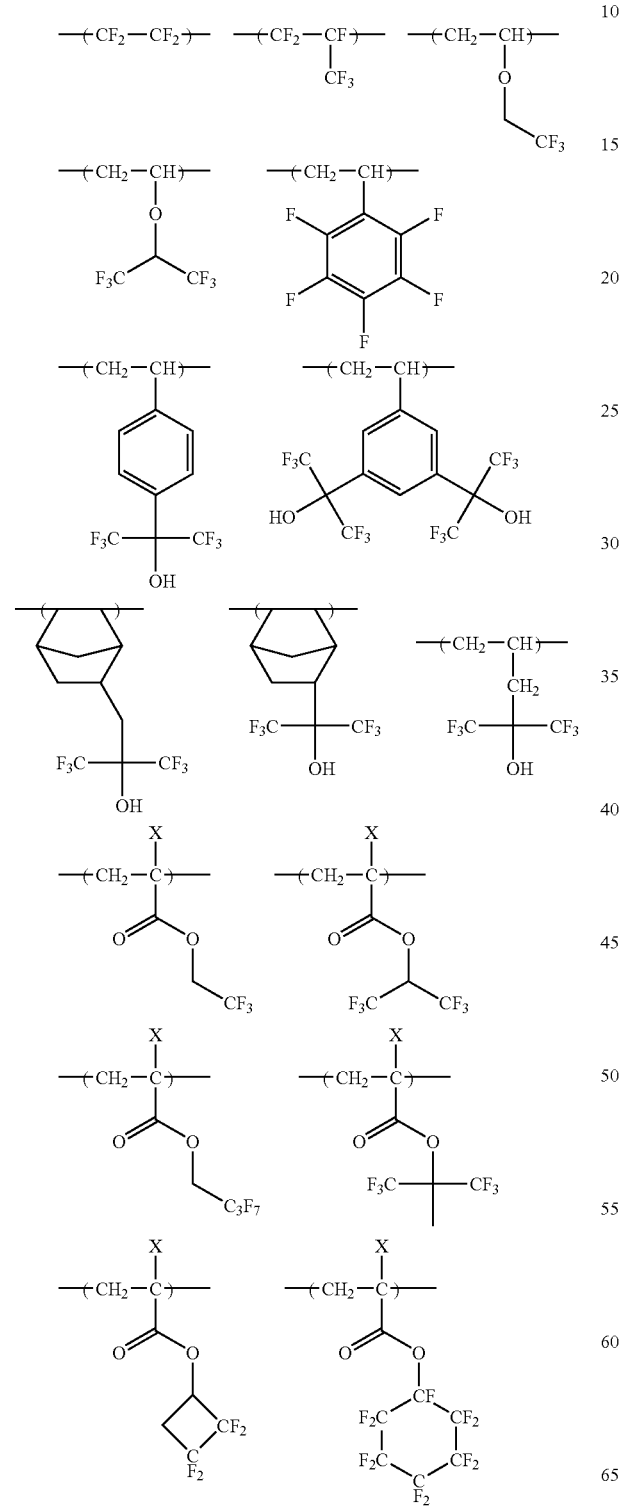

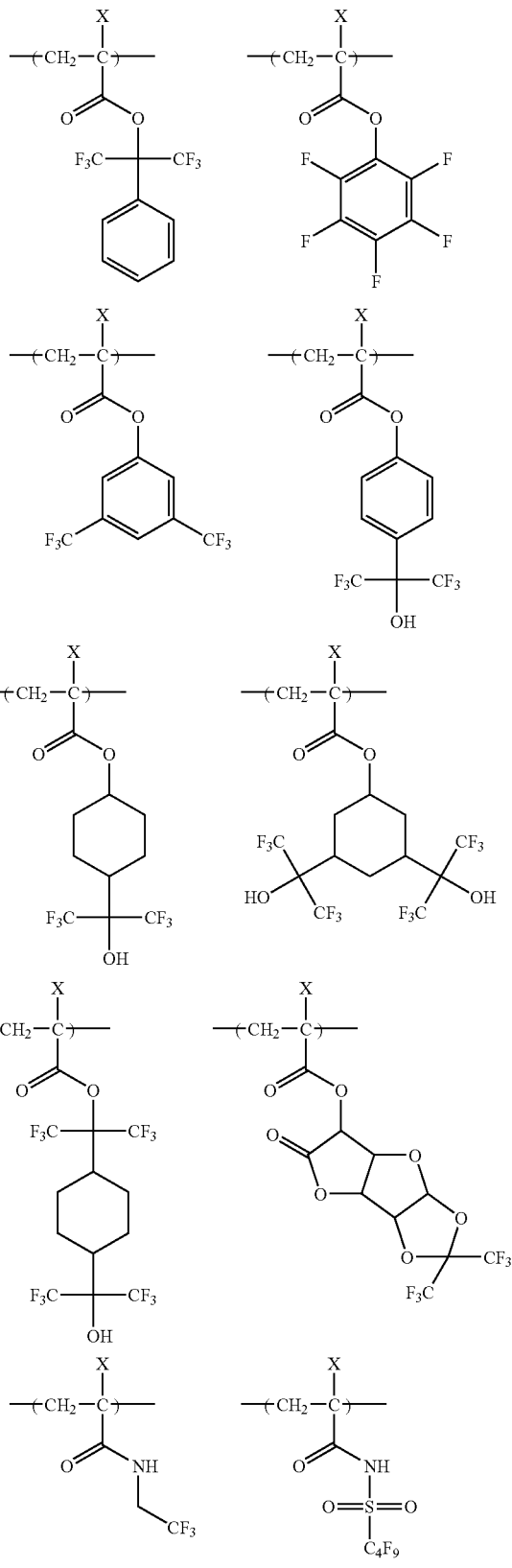

X = H, CH$_3$, F, CF$_3$, CH$_2$OCH(CF$_3$)$_2$

Examples of the silicon-containing Resin (C) are illustrated below, but these examples should not be construed as limiting the scope of the invention.
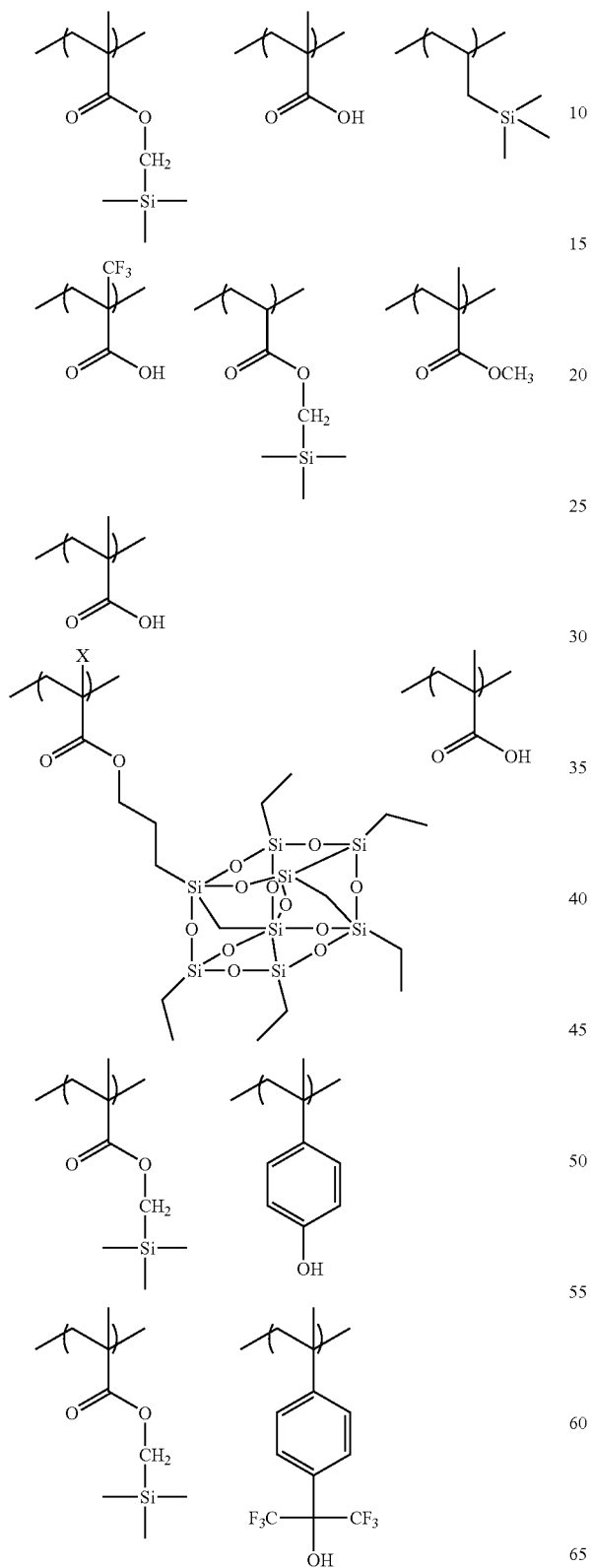
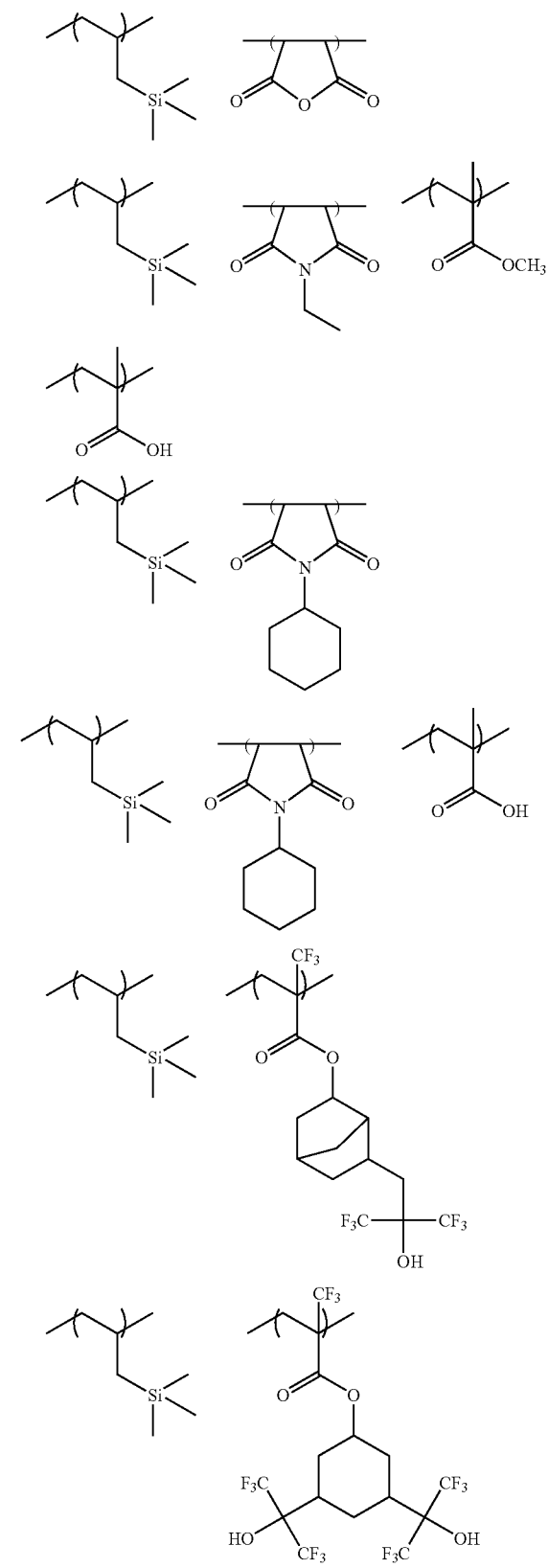

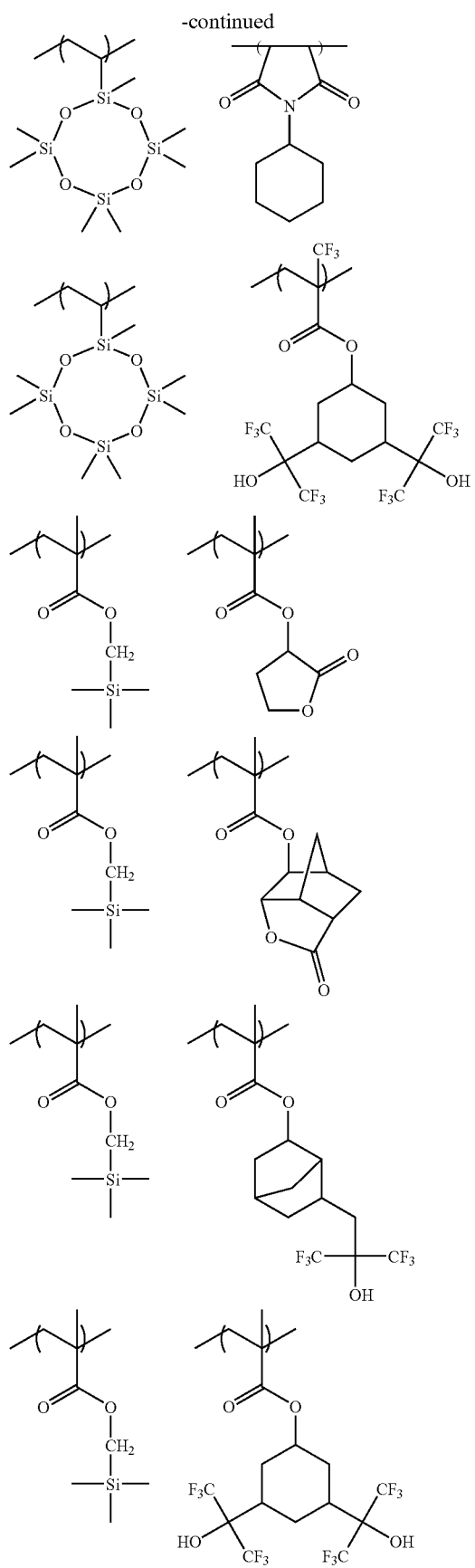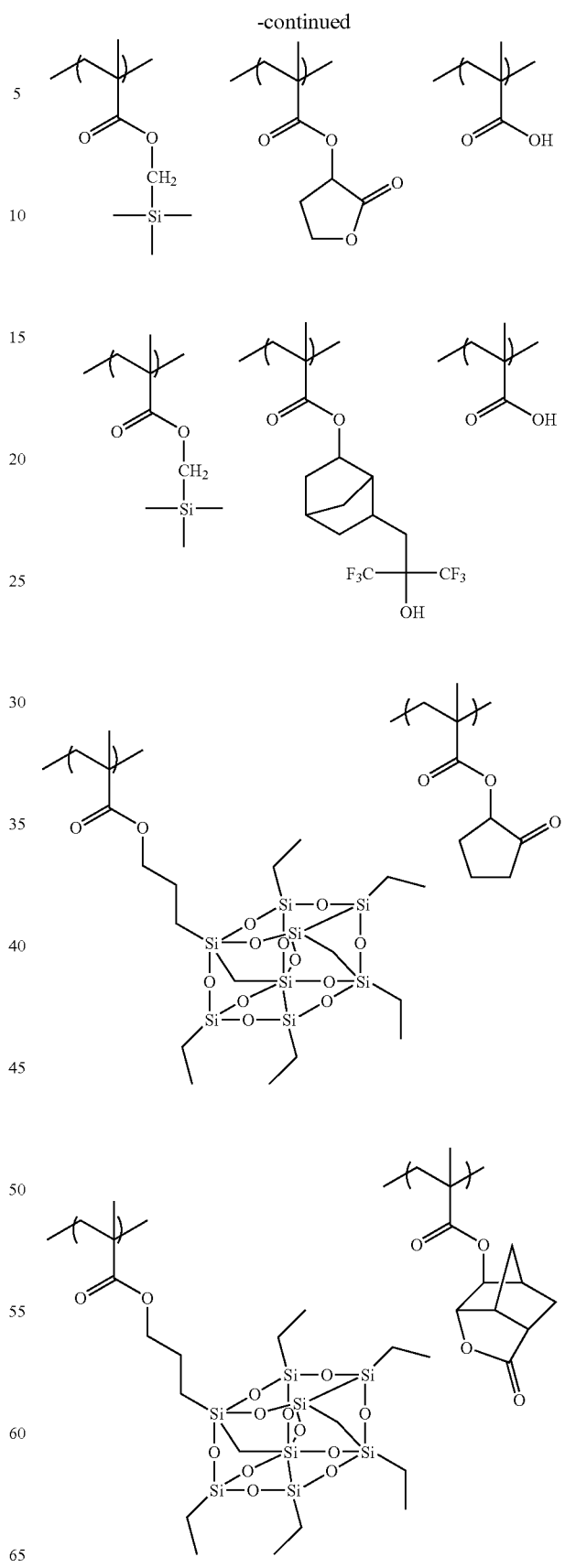

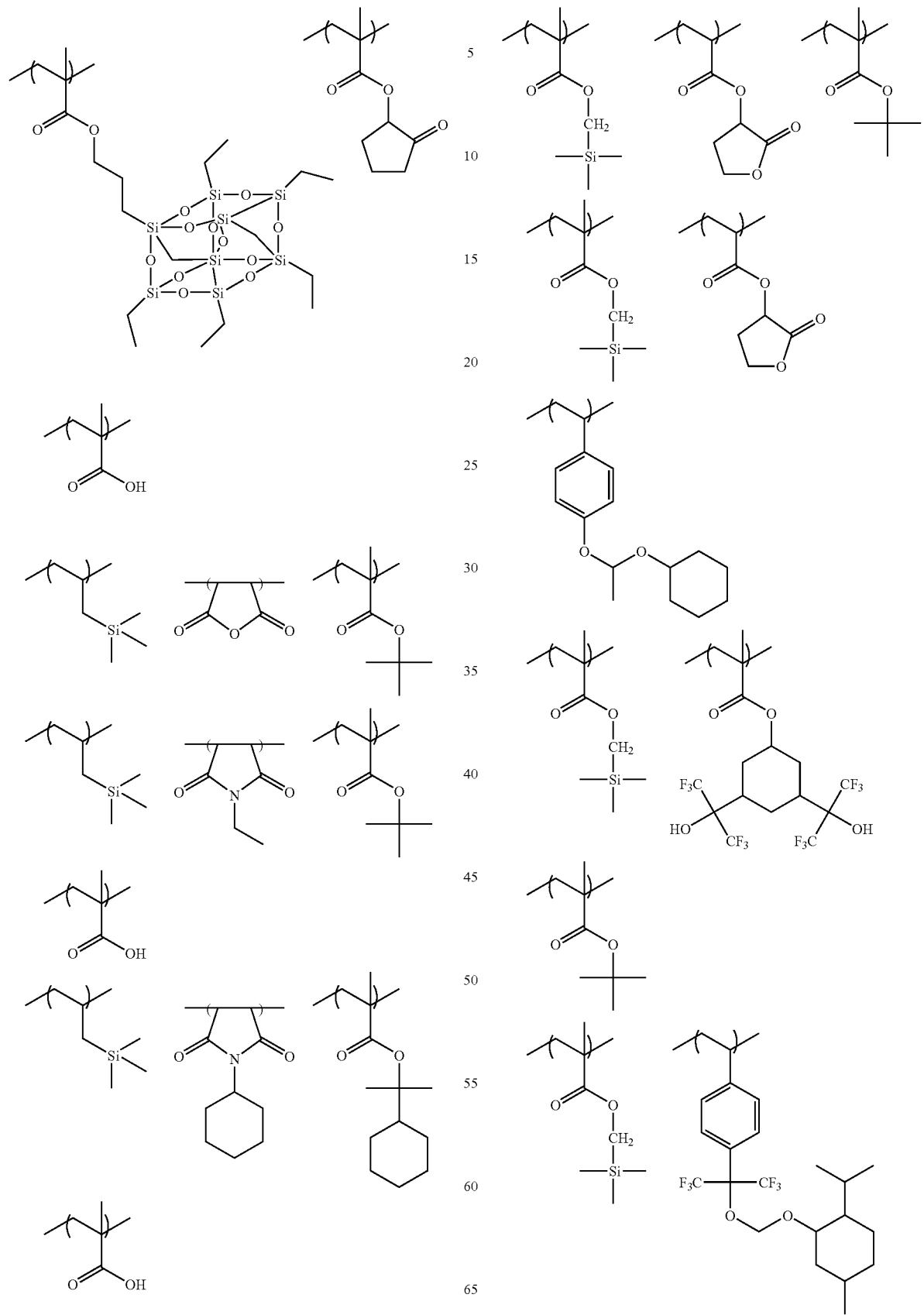

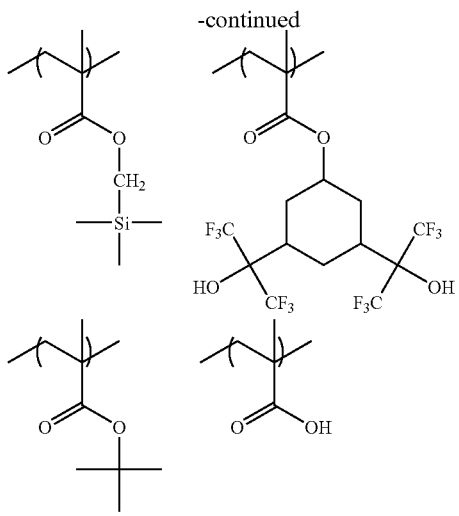

When the silicon-containing resin (C) is a resin having alkali-soluble groups (X) and/or alkali-decomposable groups (XI), the amount of alkali-soluble groups (X) (acid groups) and/or alkali-decomposable groups (XI) (acid groups produced by alkali hydrolysis) is preferably from 2 to 10 milliequivalent/g, far preferably from 2 to 8 milliequivalent/g, in terms of the acid value of the silicon-containing Resin (C). The acid value of a compound is determined by measurement of the amount (mg) of potassium hydroxide required for neutralizing the compound.

When the silicon-containing Resin (C) contains acid-decomposable groups (XII), the content of acid-decomposable groups is preferably from 5 to 100 mole %, far preferably from 10 to 100 mole %, in terms of the proportion by mole % of the repeating units having the acid-decomposable groups.

The silicon-containing Resin (C) contains silicon atoms in a proportion of preferably 2 to 50 mass %, far preferably 2 to 30 mass %, based on the molecular weight of Resin (C). In addition, it is preferable that the silicon-containing repeating units make up 10 to 100 mass %, especially 20 to 100 mass %, of the silicon-containing Resin (C).

The weight-average molecular weight of the silicon-containing Resin (C) is preferably from 1,000 to 100,000, far preferably from 1,000 to 50,000.

The content of residual monomers in the silicon-containing Resin (C) is preferably from 0 to 10 mass %, far preferably from 0 to 5 mass %. Further, it is preferable to use the silicon-containing Resin (C) having a molecular weight distribution (Mw/Mn, also referred to as the dispersion degree) in the range of 1 to 5, especially 1 to 3, from the viewpoints of resolution, resist profile, sidewall of resist patterns and roughness.

The amount of silicon-containing Resin (C) added to a positive resist composition is preferably from 0.1 to 30 mass %, far preferably from 0.1 to 10 mass %, further preferably from 0.1 to 5 mass %, based on the total solids in the positive resist composition.

As the silicon-containing Resin (C), the silicon-containing resins as recited above may be used alone or as a mixture of two or more thereof.

As with the case of the resin of Component (A), it is natural for the silicon-containing Resin (C) to be reduced in impurities including metals, and besides, it is preferable that the content of residual monomers and oligomer components in the Resin (C) is below a specified value, e.g., below 0.1 mass % in HPLC terms. By meeting these requirements, the silicon-containing Resin (C) can contribute to not only improvements in resist sensitivity, resolution, process stability and pattern profile but also realization of a resist composition superior in point of reduction in submerged extraneous matter and sensitivity change with the passage of time.

As to the silicon-containing Resin (C), various commercial products can be utilized, and silicon-containing resins for Component (C) can be synthesized in usual ways. For instance, silicon-containing resins for Component (C) can be obtained by radical polymerization and general purification as in the case of the resin of Component (A).

[4] Solvent (D)

Examples of a solvent which can be used in dissolving each ingredient therein to prepare a positive resist composition include organic solvents, such as an alkylene glycol monoalkyl ether carboxylate, an alkylene glycol monoalkyl ether, an alkyl lactate, an alkyl alkoxypropionate, a 4-10C cyclic lactone, a 4-10C monoketone compound which may contain a ring, an alkylene carbonate, an alkyl alkoxyacetate and an alkyl pyruvate.

Suitable examples of an alkylene glycol monoalkyl ether carbonate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Suitable examples of an alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Suitable examples of an alkyl lactate include methyl lactate, ethyl lactate, propyl lactate, and butyl lactate.

Suitable examples of an alkyl alkoxypropionate include ethyl 3-ethoxypropionate, methyl 3-methoxypropionate, methyl 3-ethoxypropionate, and ethyl 3-methoxypropionate.

Suitable examples of a 4-10C cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Suitable examples of a 4-10C monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Suitable examples of an alkylene carbonate include propylene carbonate, vinylene carbonate, ethylene carbonate, and butylene carbonate.

Suitable examples of an alkyl alkoxyacetate include acetate-2-methoxyethyl, acetate-2-ethoxyethyl, acetate-2-(2-ethoxyethoxy)ethyl, acetate-3-methoxy-3-methylbutyl, and acetate-1-methoxy-2-propyl.

Suitable examples of an alkyl pyruvate include methylpyruvate, ethyl pyruvate, and propyl pyruvate.

Solvents used to advantage include solvents having boiling points of 130° C. or above at ordinary temperatures and under normal atmospheric pressure. Examples of such solvents include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetate-2-ethoxyethyl; acetate-2-(2-ethoxyethoxy)ethyl, and propylene carbonate.

In the invention, the solvents recited above may be used alone, or as combinations of two or more thereof.

The solvent used in the invention may also be a mixture of a solvent having a hydroxyl group in its structure and a solvent having no hydroxyl group.

Examples of a solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Of these solvents, propylene glycol monomethyl ether and ethyl lactate are preferred over the others.

Examples of a solvent having no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Of these solvents, propylene glycol monomethyl ether acetate, ethyl ethoxypropionate, 2-heptanone, γ-butyrolactone, cyclohexanone and butyl acetate are preferred over the others. Further, propylene glycol monomethyl ether acetate, ethyl ethoxypropionate and 2-heptanone in particular are used to advantage.

The mixing ratio (by mass) between the solvent containing a hydroxyl group and the solvent containing no hydroxyl group is from 1/99 to 99/1, preferably from 10/90 to 90/10, far preferably from 20/80 to 60/40. A mixed solvent containing a solvent having no hydroxyl group in a proportion of 50 weight % or above is particularly preferred from the viewpoint of coating evenness.

[5] (E): Basic Compound

For the purpose of reducing performance changes with the passage of time from exposure to heating, it is preferable that a basic compound is contained in the positive resist composition according to the invention.

Examples of such a basic compound include compounds having the following structures (A) to (E).

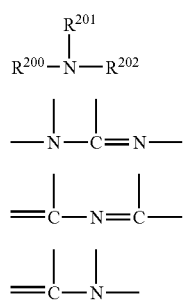

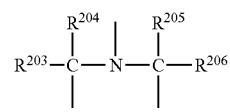

In the formula (A), $R^{200}$, $R^{201}$ and $R^{202}$, which may be the same or different, each represent a hydrogen atom, a 1-20C alkyl group, a 3-20C cycloalkyl group or a 6-20C aryl group independently. Herein, $R^{200}$ and $R^{201}$ may combine with each other to form a ring. The alkyl group may be an unsubstituted one, or may have a substituent. Suitable examples of an alkyl group having a substituent include 1-20C aminoalkyl groups, 1-20C hydroxyalkyl groups and 1-20C cyanoalkyl groups.

In the formula (E), $R^{203}$, $R^{204}$, $R^{205}$ and $R^{206}$, which may be the same or different, each represent a 1-20C alkyl group.

The alkyl groups in the formulae (A) and (E) are preferably unsubstituted alkyl groups.

Examples of such basic compounds include substituted or unsubstituted primary, secondary and tertiary aliphatic amines, aromatic amines, heterocyclic amines, amide derivatives, imide derivatives, and nitrogen-containing compounds having cyano groups. Of these compounds, aliphatic amines, aromatic amines and heterocyclic amines are preferred over the others. Suitable examples of substituents which those compounds may have include amino groups, alkyl groups, alkoxy groups, acyl groups, acyloxy groups, aryl groups, aryloxy groups, a nitro group, a cyano group, ester groups and lactone groups.

Examples of favorable compounds include guanidine, aminopyrrolidine, pyrazole, pyrazoline, piperazine, aminomorpholine, aminoalkylmorpholines and piperidine, which each may have a substituent. Examples of more favorable compounds include compounds having an imidazole structure, a diazabicyclo structure, an onium hydroxide structure, an onium carboxylate structure, a trialkylamine structure, an aniline structure and a pyridine structure, respectively, an alkylamine derivative having a hydroxyl group and/or an ether linkage, and an aniline derivative having a hydroxyl group and/or an ether linkage.

Examples of the compound having an imidazole structure include imidazole, 2,4,5-triphenylimidazole and benzimidazole. Examples of the compound having a diazabicyclo structure include 1,4-diazabicyclo[2.2.2]octane, 1,5-diazabicyclo[4.3.0]nona-5-ene and 1,8-diazabicyclo[5.4.0]undeca-7-ene. Examples of the compound having an onium hydroxide structure include triarylsulfonium hydroxides, phenacylsulfonium hydroxides and sulfonium hydroxides having 2-oxoalkyl groups, and more specifically, include triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is a compound having the structure corresponding to the substitution of carboxylate for the anion moiety of the compound having an onium hydroxide structure, with examples including acetate, adamantane-1-carboxylate and perfluoroalkylcarboxylates. Examples of the compound having a trialkylamine structure include tri(n-butyl)amine and tri(n-octyl)amine. Examples of the aniline compounds include 2,6-diisopropylaniline and N,N-dimethylaniline. Examples of the alkylamine derivative having a hydroxyl group and/or an ether linkage include ethanolamine, diethanolamine, triethanolamine and tris(methoxyethoxyethyl)amine. As an example of the aniline derivative having a hydroxyl group and/or an ether linkage, N,N-bis(hydroxyethyl)aniline can be given.

These basic compounds are used alone or as combinations of two or more thereof.

The amount of basic compound or compounds used is generally from 0.001 to 10 mass %, preferably 0.01 to 5 mass %, based on the total solids in the positive resist composition.

As to the usage ratio of acid generator(s) to basic compound(s) in the composition, the acid generator/basic compound ratio (by mole)=2.5 to 300 is suitable. More specifically, it is appropriate that the ratio by mole be adjusted to at least 2.5 in point of sensitivity and resolution, while it be adjusted to at most 300 from the viewpoint of preventing the resolution from decreasing by thickening of resist patterns with the passage of time from the end of exposure to heating treatment. The acid generator/basic compound ratio (by mole) is preferably from 5.0 to 200, far preferably from 7.0 to 150.

[6] (F): Surfactant

It is preferable that the positive resist composition according to the invention further contains a surfactant, specifically a surfactant containing at least one fluorine atom and/or at least one silicon atom (namely either a surfactant containing at least one fluorine atom, or a surfactant containing at least one silicon atom, or a surfactant containing both fluorine and silicon atoms), or a combination of at least two of these surfactants.

Incorporation of such a surfactant in the positive resist composition according to the invention makes it possible to provide resist patterns having strong adhesion and reduced development defect while ensuring the composition both satisfactory sensitivity and high resolution in the case of using an exposure light source of 250 nm or below, especially 220 nm or below.

Examples of a surfactant containing at least one fluorine atom and/or at least one silicon atom include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants which can be used include fluorine- or silicon-containing surfactants, such as EFTOP EF301 and EF303 (produced by Shin-Akita Kasei K.K.), Florad FC430, 431 and 4430 (produced by Sumitomo 3M, Inc.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troysol S-366 (produced by Troy Chemical Industries, Inc.), GF-300 and GF-150 (produced by Toagosei Co., Ltd.), Surflon S-393 (produced by Semi Chemical Co., Ltd.), EFTOP EF121, EF122A, EF122B, RF122C, EF125M, EF135M, EF351, EF352, EF801, EF802 and EF601 (produced by JEMCO Inc.), PF636, PF656, PF6320 and PF6520 (produced by OMNOVA Solutions Inc.), and FTX-204D, 208G, 218G, 230G, 208D, 212D, 218D and 222D (produced by NEOS). Moreover, organosiloxane polymer KP-341 (produced by Shin-Etsu Chemical Co., Ltd.) can be used as a silicon-containing surfactant.

In addition to known surfactants as recited above, the surfactants usable in the invention include surfactants using polymers containing fluorinated aliphatic groups derived from fluorinated aliphatic compounds synthesized by a telomerization method (also referred to as a telomer method) or an oligomerization method (also referred to as an oligomer method). These fluorinated aliphatic compounds can be synthesized according to the methods disclosed in JP-A-2002-90991.

The polymers containing fluorinated aliphatic groups are preferably copolymers of fluorinated aliphatic group-containing monomers and poly(oxyalkylene)acrylates and/or poly(oxyalkylene)methacrylates, wherein the fluorinated aliphatic group-containing units may be distributed randomly or in blocks. Examples of such poly(oxyalkylene) groups include a poly(oxyethylene) group, a poly(oxypropylene) group and a poly(oxybutylene) group. In addition, the poly(oxyalkylene) groups may be units containing alkylene groups of different chain lengths in their respective oxyalkylene chains, such as poly(oxyethylene block-oxypropylene block-oxyethylene block combination) and poly(oxyethylene block-oxypropylene block combination). Further, the copolymers of fluorinated aliphatic group-containing monomers and poly(oxyalkylene)acrylates (or methacrylates) may be binary copolymers or at least ternary copolymers prepared by copolymerizing at least two different kinds of fluorinated aliphatic group-containing monomers and at least two different kinds of poly(oxyalkylene)acrylates (or methacrylates) at the same time.

Examples of commercially available surfactants of such types include Megafac F178, F-470, F-473, F-475, F-476 and F-472 (produced by Dainippon Ink & Chemicals, Inc.). Additional examples of surfactants of such types include a copolymer of $C_6F_{13}$ group-containing acrylate (or methacrylate) and poly(oxyalkylene)acrylate (or methacrylate), and a copolymer of $C_3F_7$ group-containing acrylate (or methacrylate), poly(oxyethylene)acrylate (or methacrylate) and poly(oxypropylene)acrylate (or methacrylate).

Alternatively, it is also possible to use surfactants other than surfactants containing fluorine and/or silicon atoms. Examples of such surfactants include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

These surfactants may be used alone, or as combinations of two or more thereof.

The amount of surfactants used is preferably from 0.01 to 10 mass %, preferably 0.1 to 5 mass %, based on the total ingredients (exclusive of a solvent) in the positive resist composition.

[7] (G): Onium Carboxylate

The positive resist composition for use in the invention may further contain an onium carboxylate. Examples of such an onium carboxylate include sulfonium carboxylates, iodonium carboxylates and ammonium carboxylates. Of these onium salts, iodonium salts and sulfonium salts are especially preferred. In addition, it is preferable that neither aromatic groups nor carbon-carbon double bonds are contained in the carboxylate residues of onium carboxylates which can be used in the invention. Examples of an especially suitable anion moiety include 1-30C linear and branched alkyl carboxylate anions and mononuclear or polynuclear cycloalkyl carboxylate anions. Of these anions, the carboxylate anions whose alkyl groups are partially or entirely substituted by fluorine atoms are preferred over the others. In addition, those alkyl chains may contain oxygen atoms. By containing an onium salt having such a carboxylate anion, the resist composition can ensure transparency to light with wavelengths of 220 nm or below, and can have increased sensitivity and resolution and improved pitch dependency and exposure margin.

Examples of a fluorinated carboxylate anion include fluoroacetate anion, difluoroacetate anion, trifluoroacetate anion, pentafluoropropionate anion, heptafluorobutyrate anion, nanofluoropentanate anion, perfluorododecanate anion, perfluorotridecanate anion, perfluorocyclohexanecarboxylate anion and 2,2-bistrifluoromethylpropionate anion.

These onium carboxylates can be synthesized by allowing sulfonium hydroxide, iodonium hydroxide or ammonium hydroxide and carboxylic acids to react with silver oxide in an appropriate solvent.

The suitable content of onium carboxylate in a composition is from 0.1 to 20 mass %, preferably from 0.5 to 10 mass %, far preferably from 1 to 7 mass %, of the total solids in the composition.

Other Additives

The positive resist composition according to the invention can further contain, on an as needed basis, dyes, plasticizers, photosensitizers, light absorbents, alkali-soluble resins, dissolution inhibitors and compounds which can further dissolution in developers (e.g., phenol compounds having molecular weights of 1,000 or below, alicyclic or aliphatic compounds having carboxyl groups).

Such phenol compounds 1,000 or below in molecular weight can be easily synthesized by persons skilled in the art when they refer to the methods as disclosed in JP-A-4-122938, JP-A-2-28531, U.S. Pat. No. 4,916,210 and European Patent No. 219,294.

Examples of alicyclic and aliphatic compounds having carboxyl groups include carboxylic acid derivatives having steroid structures, such as cholic acid, deoxycholic acid and lithocholic acid, adamantanecarboxylic acid derivatives, adamantanedicarboxylic acid, cyclohexanecarboxylic acid and cyclohexanedicarboxylic acid, but not limited to the compounds recited above.

[Physical Properties of Positive Resist Composition]

From the viewpoint of improvement in resolution, it is appropriate that the positive resist composition according to the invention be used in a coating thickness of 30 to 250 nm, preferably 30 to 200 mm. The coating thickness in such a range can be attained by imparting just right viscosity to the positive resist composition through adjustment of the solids concentration in the composition to a proper range, thereby enhancing coating suitability and film formability.

The concentration of total solids in the positive resist composition is generally from 1 to 10 mass %, preferably from 1 to 8 mass %, far preferably from 1.0 to 7.0 mass %.

[Preparation of Positive Resist Composition]

The positive resist composition according to the invention is prepared by dissolving the ingredients as described above in a specified solvent, preferably the mixed solvent as described above, and passing the resulting solution through a filter. The filter suitably used for filtration is a polytetrafluoroethylene, polyethylene or nylon filter capable of filtering to 0.1 microns or below, preferably 0.05 microns or below, far preferably 0.03 microns or below.

[Pattern Forming Method]

The pattern forming method of the invention is described below in detail.

As a result of our intensive study of what gives rise to deterioration in resolution, which is traceable to topple of resist patterns, and sensitivity decrease when a chemical amplification resist is used in immersion lithography, we have narrowed it down to immersion liquid permeation into a resist coating which occurs while the resist coating maintains contact with the immersion liquid, thereby achieving the invention.

The image forming method of the invention has steps of:

(i) coating a substrate with the positive resist composition according to the invention to form a resist coating, (ii) exposing the resist coating to light via an immersion liquid, (iii) removing the immersion liquid remaining on the resist coating, (iv) heating the resist coating, and (v) developing the resist coating, and is distinguished by having the step (iii) of removing the immersion liquid remaining on the resist coating after the step (ii) of exposing the resist coating to light via the immersion liquid and before the step (iv) of heating the resist coating.

Incidentally, the step (iv) of heating the resist coating is a step corresponding to the heating step generally performed after exposure and before development for the purpose of promoting conversion of alkali-insoluble groups in a resist coating to alkali-soluble groups, namely the step referred to as PEB (Post Exposure Bake).

Reaction for converting alkali-insoluble groups in a chemical amplification resist to alkali-soluble groups occurs at the time of PEB generally carried out during or after exposure, so reactions under PEB are important.

Although it was thought that water as the most suitable immersion liquid in the case of using ArF excimer laser is less prone to permeate into a resist coating for ArF excimer laser use because the resist coating is generally formed from resin and organic molecules, so it is sufficiently hydrophobic, we have found that minute quantities of water actually permeated into upper part of the resist coating. When the water permeates into the resist coating, the resist coating surface and the vicinity of the interface between the resist coating and the substrate come to differ in water content to cause changes in diffusion distance of a generated acid and rate of conversion reaction from alkali-insoluble groups into alkali-soluble groups, thereby resulting in unevenness of chemical reaction in the space between the surface and the bottom of the resist coating. Therefore, there is a possibility that resist patterns of good quality cannot be obtained.

In the case of immersion lithography using exposure wavelengths other than the wavelength of ArF, it is also conceivable that minute quantities of immersion liquid will permeate into a resist coating, and there is a high possibility that resist patterns formed will become unsatisfactory.

A feature of the invention consists in that the step (iii) of removing the immersion liquid remaining on a resist coating is carried out before PEB, or the step (iv) of heating the resist coating, and thereby reaction for converting alkali-insoluble groups into alkali-soluble groups can be made uniform throughout the coating to result in formation of satisfactory resist patterns.

Examples of a step adoptable as the step (iii) of removing the immersion liquid remaining on a resist coating include (iii-1) a step of removing the immersion liquid by spinning the substrate, (iii-2) a step of removing the immersion liquid by heating the substrate at temperatures on a level that there occurs no conversion from alkali-insoluble groups into alkali-soluble groups, and (iii-3) a step of removing the immersion liquid by blowing a gas from a nozzle. These steps can be performed by use of general apparatus for manufacturing semiconductors, liquid crystal displays and devices like thermal heads, so they don't require introduction of new apparatus and are practical in point of cost advantage. Alternatively, a device permitting hot-air drying may be installed in an exposure apparatus or a developing machine, and the drying may be performed with hot air.

In the step (iii-1) of removing the immersion liquid by spinning a substrate, the number of revolutions of the substrate is preferably 500 rpm or above since the low revs cannot induce a high velocity of air flow on the resist coating surface to result in prolongation of drying. The higher revs the better, because they can make the drying time the shorter and thereby the higher throughput can be attained.

However, the setting of the revs is generally below the upper limit designated by the device used. So, for instance, the revs is generally adjusted to 3,000 rpm or below in the case of spinning a 12-inch circular silicon-wafer substrate, or 4,000 rpm or below in the case of spinning an 8-inch circular wafer substrate.

For completion of the drying, it is appropriate that the spinning time of the substrate be adjusted to 5 seconds or longer, and the longer the better. However, in order to minimize throughput penalty, the setting of the spinning time may be made with consideration given to the total time and number of devices required for other steps, such as exposure, PEB and development.

For elimination of the vaporized immersion liquid from apparatus, ventilation of the apparatus is preferred, and the ventilation pressure is preferably 20 Pa or above.

Although the device for spinning a substrate may be any device so long as it has a mechanism for spinning the substrate, the use of developing apparatus, which is general apparatus for manufacturing semiconductors, liquid crystal displays and devices like thermal heads, is advantageous from the viewpoint of simplicity in delivery of a substrate from exposure apparatus to developing apparatus, but the device should not be construed as being limited to such apparatus.

In the step (iii-2) of removing the immersion liquid by baking (heating) a resist coating, conversion of alkali-insoluble groups in the resin into alkali-soluble groups during the bake for removal of the immersion liquid allows chemical reaction to occur in a state that the immersion liquid is present in the resist coating, and raises the possibility of rendering the chemical reaction uneven in the space between the surface and bottom of the resist coating. Therefore, it is appropriate that the bake temperature be adjusted to temperatures at which the alkali-insoluble groups in the resin cannot be converted into alkali-soluble ones.

Further, it is required that the bake temperature be a temperature at which no conversion from alkali-insoluble groups into alkali-soluble groups is caused in the resist resin.

As the temperature at which an alkali-insoluble group is converted into an alkali-soluble group differs depending on the kind of resist, commercially available resists have their recommended post-bake temperatures (namely the foregoing PEB temperatures), and they are generally in the range of 90-150° C. At temperatures higher than the recommended temperatures, the conversion reaction from alkali-insoluble groups into alkali-soluble groups occurs with efficiency.

Accordingly, the bake temperature for removal of immersion liquid is a temperature at which alkali-insoluble groups cannot be converted into alkali-soluble groups, and preferably chosen from the temperatures at least 20° C. lower than the heating temperature in the step (iv) of heating the resist coating.

Although the temperature required at the minimum differs depending on the kind of immersion liquid, there is a high possibility of adopting water as an immersion liquid in immersion lithography utilizing ArF excimer laser and, when water is used as an immersion liquid under these circumstances, the heating at a temperature of 40° C. or above is preferred. However, the immersion liquid should not be construed as being limited to water.

Since a short heating time cannot complete the removal of immersion liquid and a long heating time affects throughput, the heating time is preferably adjusted to the range of 10-120 seconds.

Further, it is preferable that the apparatus is ventilated for the purpose of eliminating the vaporized immersion liquid from apparatus, and the ventilation pressure is preferably 3 Pa or above. As to the device for heating the substrate, although any devices may be used as far as they have a heating mechanism, it is advantageous to use a heating unit attendant on a developing apparatus as general apparatus for manufacturing semiconductors, liquid crystal displays and devices like thermal heads from the viewpoint of simplicity in delivery of a substrate from the exposure apparatus to the developing apparatus, but the device should not be construed as being limited to such unit.

As another example of the step (iii) of removing the immersion liquid remaining on a resist coating, a step of removing the immersion liquid by feeding a water-miscible organic solvent to the resist coating surface can be given.

Examples of a water-miscible organic solvent usable therein include alcohol solvents, such as methyl alcohol, ethyl alcohol, n-propyl alcohol and isopropyl alcohol. Of these solvents, isopropyl alcohol is preferred over the others.

A water-miscible organic solvent may be fed onto a wafer surface via a dropping nozzle, e.g., under a condition that the wafer is made to adsorb to a holding mount by means of a vacuum chuck. It is preferable that the solvent feeding is carried out in an amount of 0.1 to 2.0 kg/cm$^2$ so as to distribute the solvent over the whole surface of the wafer. The solvent feeding may be performed in a state that the wafer stands still, or it may be performed as the wafer is rotated at a low speed (e.g., 30 rpm). After the solvent feeding is stopped, the water-miscible organic solvent may be dried by ventilation as the wafer is in a stationary state, or by spinning of the wafer at 1,000 rpm or above.

The amount of immersion liquid remaining in the resist coating after completion of the step (iii) of removing the immersion liquid remaining on the resist coating is preferably 0.1 mass % or below, far preferably 0.01 mass % or below.

As a method for measuring a water content in the case of using water or a water solution as the immersion liquid, there is known the method of scraping the resist coating away from the substrate by use of, e.g., a spatula and measuring its water content with a Karl Fischer Moisture Titrator (MKS-500, made by Kyoto Electronics Manufacturing Co., Ltd.). In the case where the immersion liquid is a non-aqueous solution, on the other hand, there is known the method of dissolving the resist coating scraped away from the substrate in a solvent, such as cyclohexanone, and determining the liquid content by gas chromatography (using, e.g., GC-17 Aver. 3, made by Shimadzu Corporation).

In the pattern forming method of the invention, the step (i) of coating a substrate with a positive resist composition to form a resist coating, the step (ii) of exposing the resist coating via an immersion liquid, the step (iv) of heating the resist coating and the step (v) of developing the resist coating can be performed using generally known methods.

At the removal of the immersion liquid remaining on the resist coating, it is preferable that a liquid film (puddle) of the immersion liquid (preferably purified water) is formed on the resist coating, and then the liquid film is removed so as not to left any liquid drops.

The puddle can be formed by making use of the surface tension of the immersion liquid and putting the immersion liquid on the resist coating in a condition that the wafer is kept still.

In the invention, it is preferable that the surface of the resist coating is cleaned prior to the step (ii) of exposing the resist coating via the immersion liquid.

The cleaning is performed by bringing a liquid to contact with the resist coating surface and eliminating dirt and particles.

As the liquid brought into contact with the resist coating surface, the immersion liquid may be used, or a liquid for cleaning, other than the immersion liquid, may be used.

The heating of the resist coating in the step (iii-2) and the step (iv) is generally carried out by heating the substrate having the resist coating by means of a hot plate.

After heating the resist coating in the step (iv), the resist coating is generally cooled to the vicinity of room temperature (e.g., 23° C.), and then undergoes development in the step (v).

The invention has no particular restriction as to the wavelength of a light source used in exposure apparatus for immersion lithography, but a start in the study of immersion lithography has been made at the wavelengths of ArF excimer laser (193 nm) and $F_2$ excimer laser. The invention can be applied to immersion lithography at both wavelengths.

The liquid suitable as immersion liquid is transparent to exposure wavelengths, and the refractive index thereof preferably has the smallest possible temperature coefficient so that the distortion of optical images projected onto the resist coating is minimized. In the case where the exposure light source is ArF excimer laser (wavelength: 193 nm) in particular, it is preferable that water is used from the viewpoints of availability and easiness of handling in addition to the aforesaid viewpoints.

When water is used as the immersion liquid, an additive (liquid) capable of reducing the surface tension of water and enhancing the surface activity may be added in a slight proportion. This additive is preferably a liquid not causing dissolution of the coating layer on the wafer and having a negligibly small effect on an optical coat provided on the underside of lens element.

Suitable examples of such an additive include aliphatic alcohol compounds having almost the same refractive indexes as that of water, such as methyl alcohol, ethyl alcohol and isopropyl alcohol. Addition of alcohol having almost the same refractive index as that of water can offer an advantage that a change in refractive index as the liquid in its entirety can be made minimal even when the alcohol concentration in the immersion liquid is altered by vaporization of the alcohol.

On the other hand, mixing of a substance opaque to light of 193 nm and impurities greatly differing in refractive index from water brings about distortion of optical images projected onto the resist, so the water used is preferably distilled water. Further, purified water having undergone filtration by passage through an ion exchange filter may be used.

In the invention, the substrate on which the resist coating is formed has no particular restriction, but it is possible to use any of inorganic substrates, such as silicon, SiN, or $SiO_2$/SiN, coating-type inorganic substrates such as SOG, and substrates generally used in a lithography process for manufacturing semiconductors, such as ICs, circuit boards for LCDs and thermal heads, and for photofabrication of other devices. Further, an organic antireflective film may be formed between the resist coating and the substrate, if needed.

Examples of an alkaline developer used in the step of carrying out development include aqueous alkaline solutions of inorganic alkalis, such as sodium hydroxide, potassium hydroxide, sodium carbonate, sodium silicate, sodium metasilicate and aqueous ammonia, primary amines, such as ethyl amine and n-propylamine, secondary amines, such as diethylamine and di-n-butylamine, tertiary amines, such as triethylamine and methyldiethylamine, alcohol amines, such as dimethylethanolamine and triethanolamine, quaternary ammonium salts, such as tetramethylammonium hydroxide and tetraethylammonium hydroxide, and cyclic amines, such as pyrrole and piperidine.

Further, it is possible to use the alkaline aqueous solution as recited above to which an alcohol compound and a surfactant are added in appropriate amounts.

The alkali concentration in an alkaline developer is generally from 0.1 to 20 mass %.

The pH of the alkaline developer is generally from 10.0 to 15.0.

As a rinse solution, purified water is used, and thereto an appropriate amount of surfactant may also be added.

After the development-processing or the processing with a rinse solution, treatment for eliminating the developer or the rinse solution adhering to patterns by use of a supercritical liquid can further be performed.

EXAMPLES

The invention will now be illustrated in greater detail by reference to the following examples, but these examples should not be construed as limiting the scope of the invention in any way.

The structures of resins (1) to (26) used as Component (A) in Examples and Comparative Examples are illustrated below. In addition, the compositions (which each are expressed in a ratio between proportions (by mole %) of repeating units arranged in the direction from the left to the right in each individual structural formula), weight-average molecular weights (Mw) and dispersion degrees (Mw/Mn) of the resins (1) to (26) are shown in the following Tables 1 and 2.

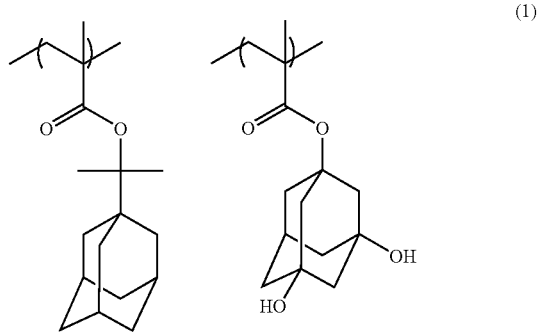

(1)

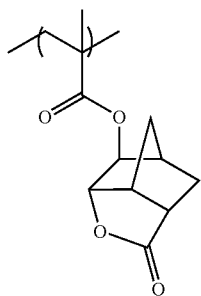
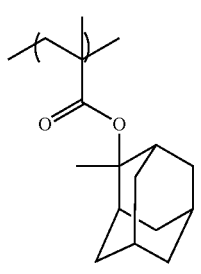 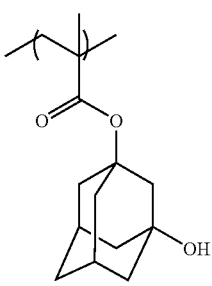
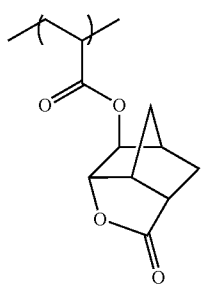
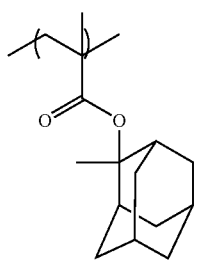 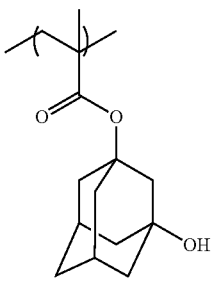
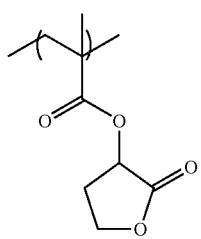
(2)
(3)
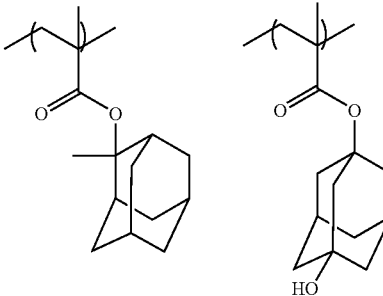 (4)
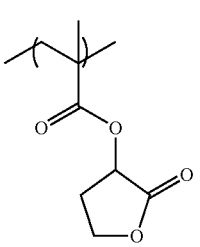
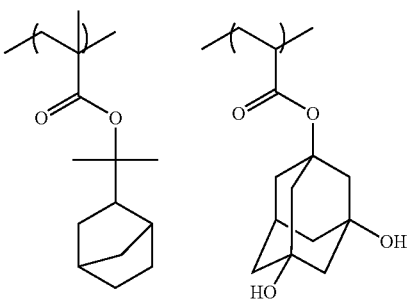 (5)
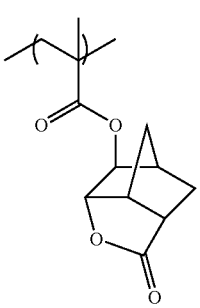
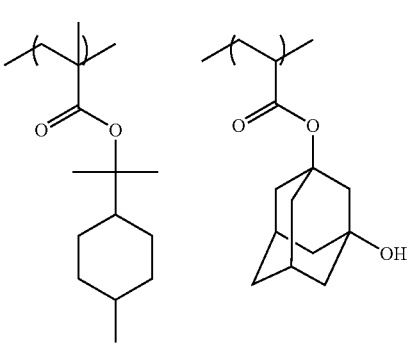 (6)

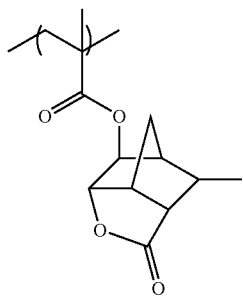
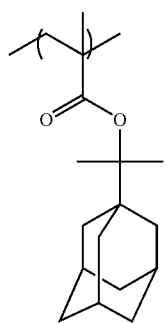
(7)
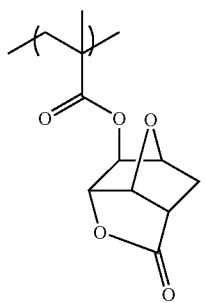
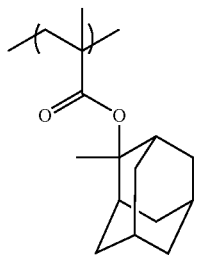
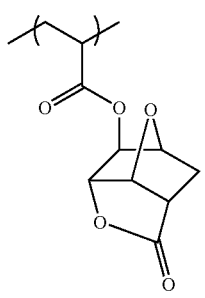
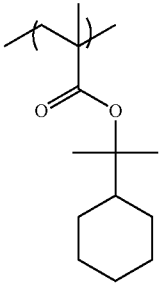
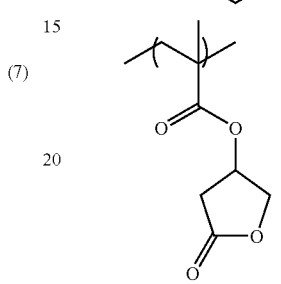
(9)
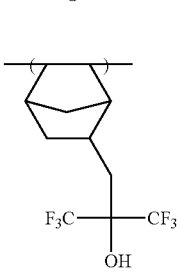
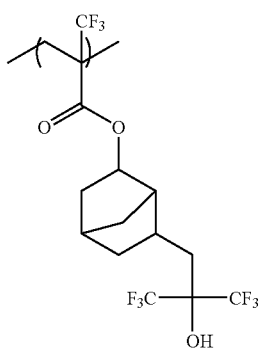
(10)
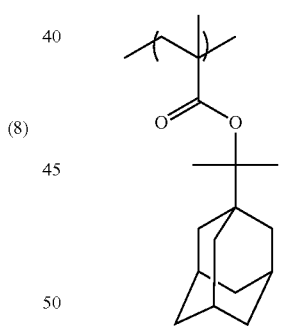
(8)
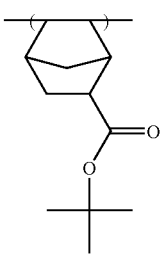
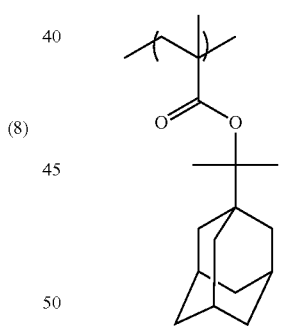
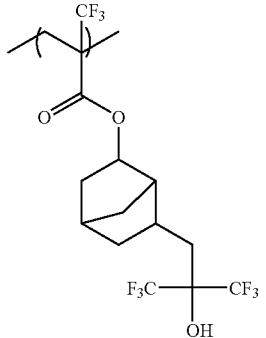
(11)

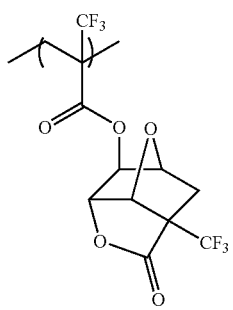
(12)
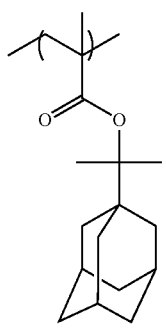
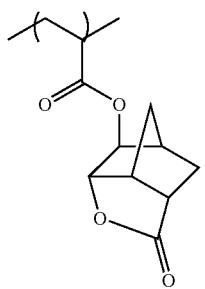
(13)
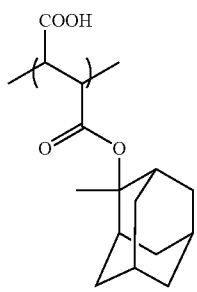
(14)
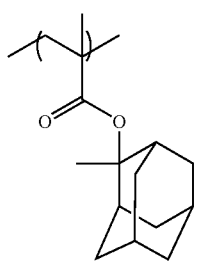
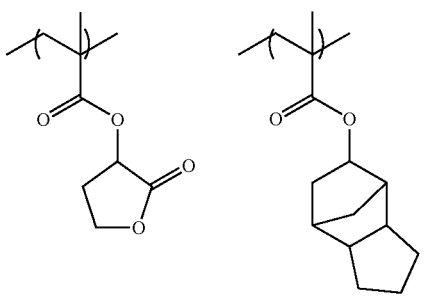
(15)
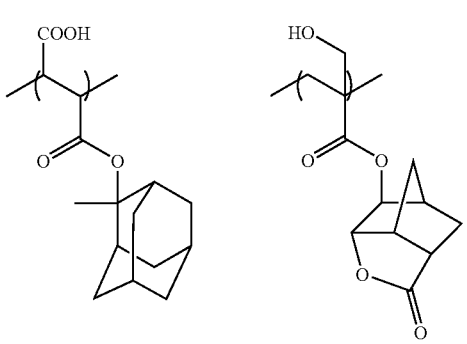
(16)
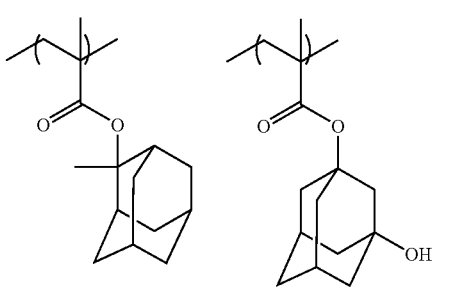
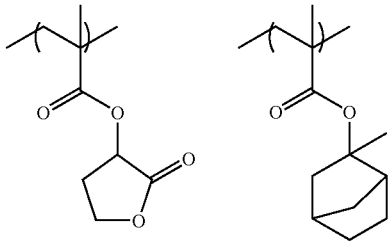
(17)
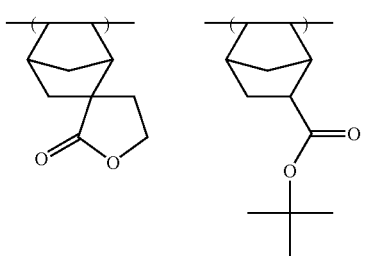

-continued
(18)
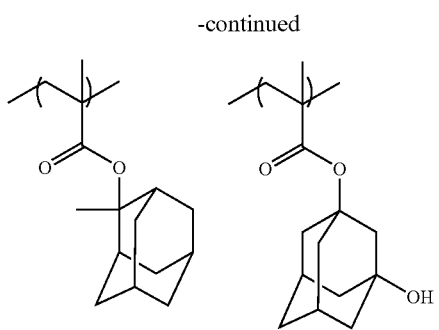
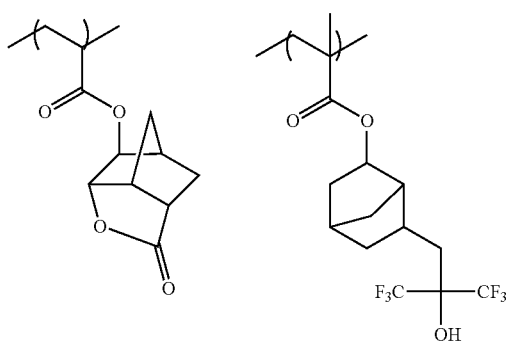
(19)
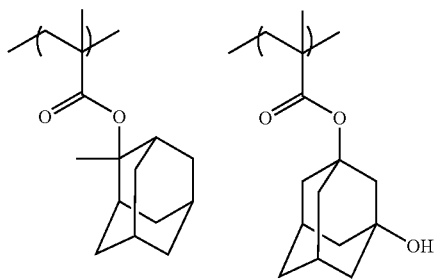
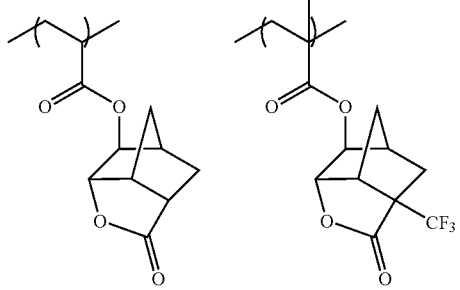
(20)
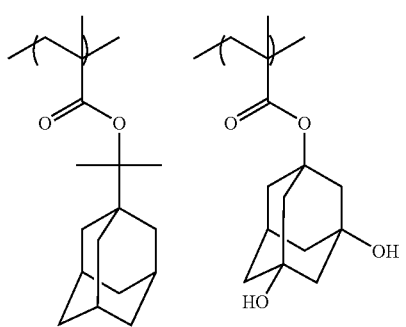
-continued
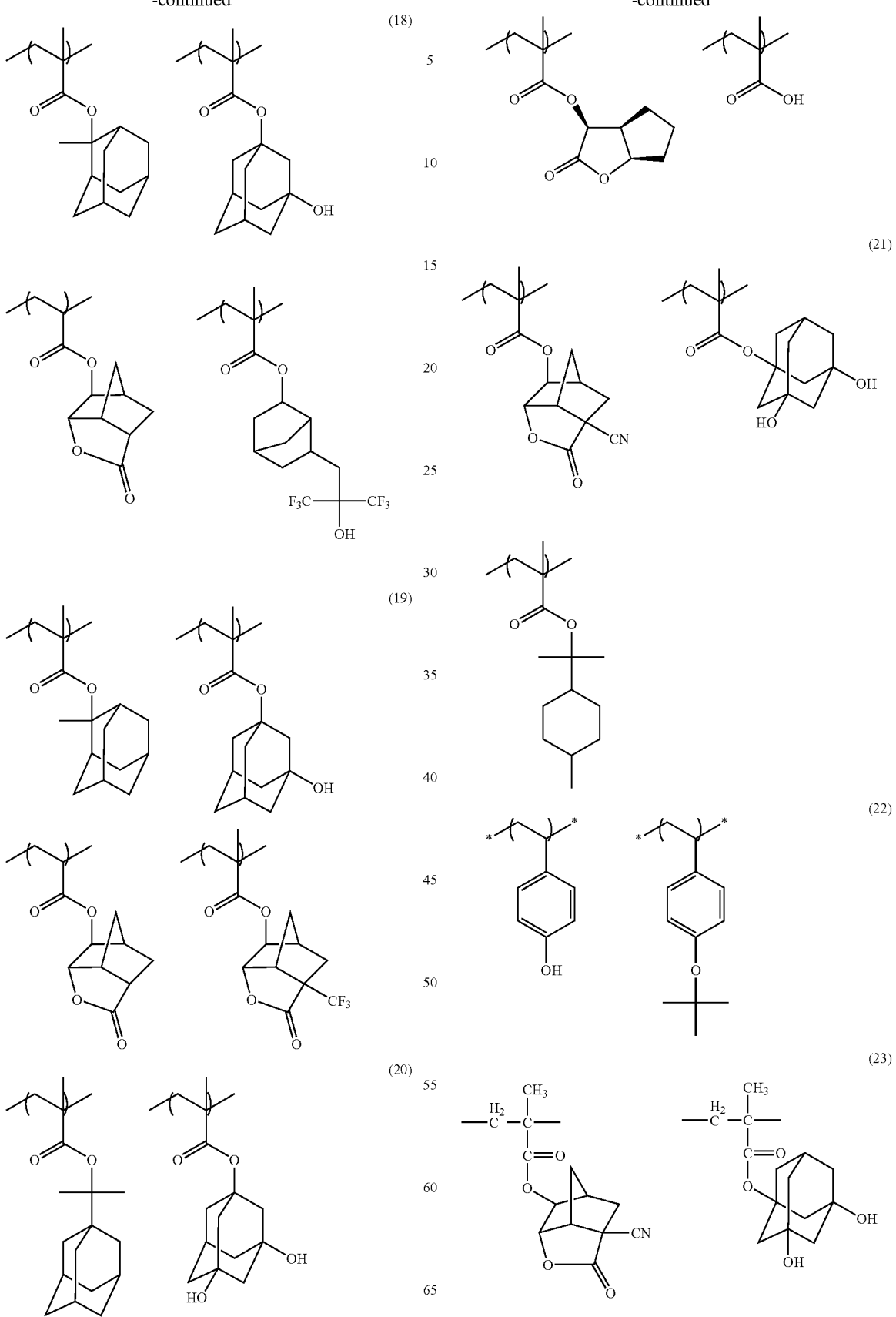

-continued

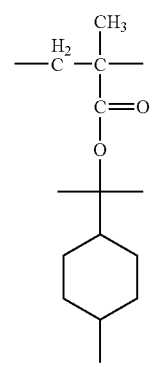

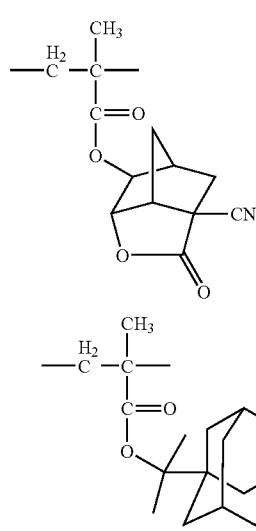

(24)

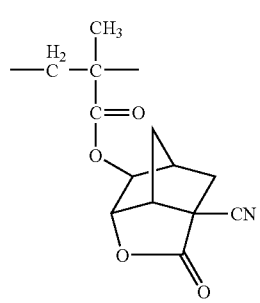

(25)

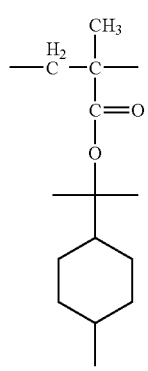

-continued (26)

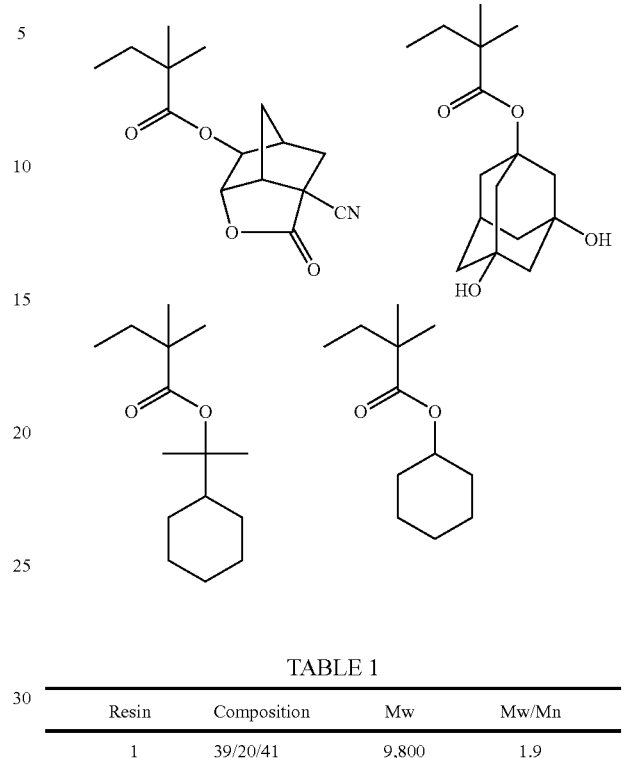

TABLE 1

| Resin | Composition | Mw | Mw/Mn |
|---|---|---|---|
| 1 | 39/20/41 | 9,800 | 1.9 |
| 2 | 40/22/38 | 12,000 | 2.0 |
| 3 | 34/33/33 | 11,000 | 2.3 |
| 4 | 45/15/40 | 10,500 | 2.1 |
| 5 | 35/15/50 | 6,700 | 2.2 |
| 6 | 30/25/45 | 8,400 | 2.3 |
| 7 | 39/20/41 | 10,500 | 2.1 |
| 8 | 49/10/41 | 9,500 | 2.5 |
| 9 | 35/32/33 | 14,000 | 2.6 |
| 10 | 35/35/30 | 6,700 | 2.3 |
| 11 | 40/22/38 | 8,500 | 2.5 |
| 12 | 40/20/35/5 | 12,500 | 2.4 |
| 13 | 50/50 | 14,000 | 1.9 |
| 14 | 40/15/40/5 | 10,000 | 1.8 |
| 15 | 50/50 | 8,300 | 1.5 |
| 16 | 40/15/40/5 | 9,800 | 2.3 |
| 17 | 50/50 | 5,200 | 2.1 |
| 18 | 35/20/40/5 | 6,100 | 2.3 |
| 19 | 30/30/30/10 | 8,600 | 2.5 |
| 20 | 40/20/35/5 | 12,000 | 2.1 |
| 21 | 40/20/40 | 7,800 | 1.9 |
| 22 | 80/20 | 8,800 | 2.1 |

TABLE 2

| Resin | Composition | Mw | Mw/Mn |
|---|---|---|---|
| 23 | 50/10/40 | 10,000 | 1.2 |
| 24 | 40/20/40 | 9,600 | 1.4 |
| 25 | 40/20/30/10 | 10,400 | 1.1 |
| 26 | 45/20/30/5 | 9,900 | 1.3 |

Synthesis Example 1

Synthesis of Resin (C-1)

(Trimethylsilyl)methyl methacrylate and methacrylic acid were prepared at a ratio of 50 to 50 (by mole), and dissolved in propylene glycol monomethyl ether acetate, thereby making 450 g of a solution having a solids concentration of 22 mass %. To this solution, a polymerization initiator, V-601 produced by Wako Pure Chemical Industries, Ltd., was added in a proportion of 5 mole %, and this admixture was added dropwise to 50 mL of propylene glycol monomethyl ether acetate heated to 80° C. over a 2-hour period in an atmosphere of nitrogen. After conclusion of the dropwise addition, the reaction solution was stirred for 2 hours. Thus, a reaction solution (C-1) was obtained. After completion of the reaction, the reaction solution (C-1) was cooled to room temperature, and then poured into a 10-times amount of 90:10 hexane-ethyl acetate mixture to result in precipitation of white powdery matter. This powdery matter was filtered off, thereby collecting the intended resin (C-1) having the structure illustrated hereinafter.

The polymer's compositional ratio (by mole %) determined by $^{13}$C-NMR and acid value titration was 50/50 (corresponding to the arranging order (in the direction from the left to the right) of repeating units in the structural formula, as were the compositional ratios mentioned below). Further, the weight-average molecular weight and dispersion degree of Resin (C-1) were found to be 13,200 and 2.2, respectively, as measured by GPC and calculated in terms of polystyrene.

Synthesis Example 2

Synthesis of Resin (C-2)

Resin (C-2) having the structure illustrated hereinafter was synthesized in the same manner as the above, except that the ratio between the amounts of monomers prepared was changed to 70/30 (by mole) and the solvent used for crystallization was changed to methanol. The compositional ratio (by mole %) of Resin (C-2) determined by $^{13}$C-NMR and acid value titration was 32/68. Further, the weight-average molecular weight and dispersion degree of Resin (C-2) were found to be 13,000 and 2.1, respectively, as measured by GPC and calculated in terms of polystyrene.

Synthesis Example 3

Synthesis of Resin (C-3)

Allyltrimethylsilane, maleic anhydride and t-butyl methacrylate were prepared at a ratio of 40 to 40 to 20 (by mole), and dissolved in propylene glycol monomethyl ether acetate, thereby making 450 g of a solution having a solids concentration of 50 mass %. To this solution, a polymerization initiator, V-65 produced by Wako Pure Chemical Industries, Ltd., was added in a proportion of 4 mole %, and this admixture was stirred for 5 hours in an atmosphere of nitrogen. Thus, a reaction solution (C-3) was obtained. After completion of the reaction, the reaction solution (C-3) was cooled to room temperature, and then poured into a 5-times amount of methanol to result in precipitation of white powdery matter. This powdery matter was filtered off, thereby collecting the intended resin (C-3) having the structure illustrated hereinafter.

The polymer's compositional ratio (by mole %) determined by $^{13}$C-NMR was 35/35/30. Further, the weight-average molecular weight and dispersion degree of Resin (C-3) were found to be 8,500 and 1.8, respectively, as measured by GPC and calculated in terms of polystyrene.

Synthesis Example 4

Synthesis of Resin (C-4)

Allyltrimethylsilane, N-ethylmaleimide and methacrylic acid were prepared at a ratio of 35 to 35 to 30 (by mole), and dissolved in tetrahydrofuran, thereby making 300 g of a solution having a solids concentration of 80 mass %. To this solution, a polymerization initiator, V-65 produced by Wako Pure Chemical Industries, Ltd., was added in a proportion of 5 mole %, and this admixture was added dropwise to 30 mL of tetrahydrofuran heated to 65° C. over a 4-hour period in an atmosphere of nitrogen. After conclusion of the dropwise addition, the reaction solution was stirred for 2 hours. Thus, a reaction solution (C-4) was obtained. After completion of the reaction, the reaction solution (C-4) was cooled to room temperature, and then poured into a 5-times amount of 90:10 hexane-ethyl acetate mixture to result in precipitation of white powdery matter. This powdery matter was filtered off, thereby collecting the intended resin (C-4) having the structure illustrated hereinafter.

The polymer's compositional ratio (by mole %) determined by $^{13}$C-NMR and acid value titration was 32/32/36. Further, the weight-average molecular weight and dispersion degree of Resin (C-4) were found to be 10,000 and 2.1, respectively, as measured by GPC and calculated in terms of polystyrene.

Synthesis Example 5

Synthesis of Resin (C-5)

Methacryloxypropylheptaethyl-T8-silsesquioxane and acrylic acid were prepared at a ratio of 40 to 60 (by mole), and dissolved in tetrahydrofuran, thereby making 450 g of a solution having a solids concentration of 50 mass %. To this solution, a polymerization initiator, V-65 produced by Wako Pure Chemical Industries, Ltd., was added in a proportion of 4 mole %, and this admixture was stirred for 5 hours in an atmosphere of nitrogen. Thus, a reaction solution (C-5) was obtained. After completion of the reaction, the reaction solution (C-5) was cooled to room temperature, and then poured into a 10-times amount of methanol to result in precipitation of white powdery matter. This powdery matter was filtered off, thereby collecting the intended resin (C-5) having the structure illustrated hereinafter.

The polymer's compositional ratio (by mole %) determined by $^{13}$C-NMR was 35/65. Further, the weight-average molecular weight and dispersion degree of Resin (C-5) were found to be 8,500 and 1.8, respectively, as measured by GPC and calculated in terms of polystyrene.

In addition, it was possible to synthesize Resins (C-6) to (C-8) in manners similar to the manner adopted in this Synthesis Example. The weight-average molecular weights and dispersion degrees of Resins (C-6) to (C-8) determined by measurements of GPC and calculation in terms of polystyrene are summarized in the following Table 3.

TABLE 3
| Resin | Weight-average Molecular Weight | Dispersion Degree |
|---|---|---|
| (C-6) | 5,900 | 2.0 |
| (C-7) | 6,100 | 1.9 |
| (C-8) | 7,000 | 1.8 |
(C-1)
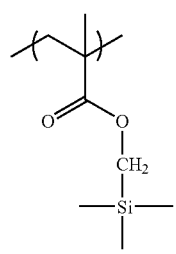
(C-2)
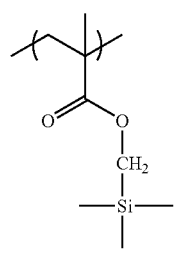
(C-3)
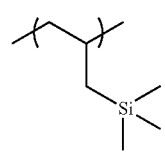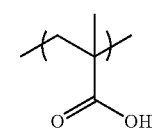
(C-4)
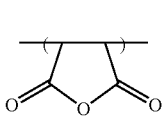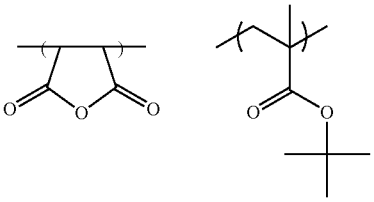
-continued
(C-5)
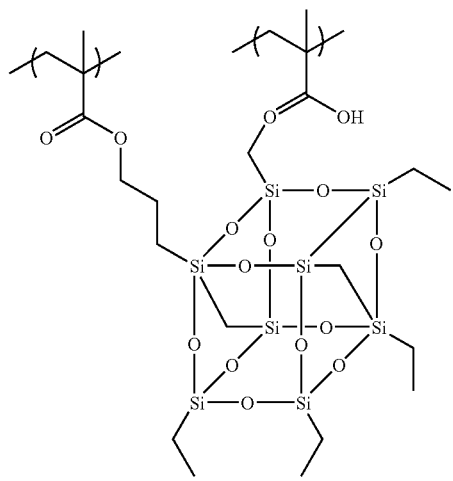
(C-6)
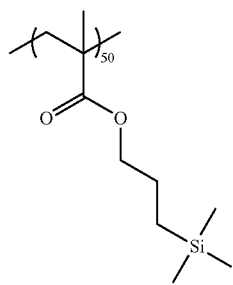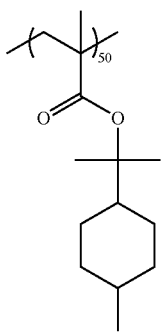
(C-7)
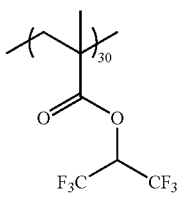

-continued

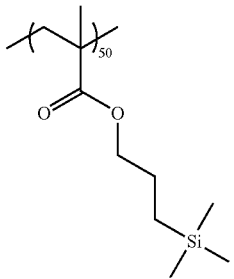
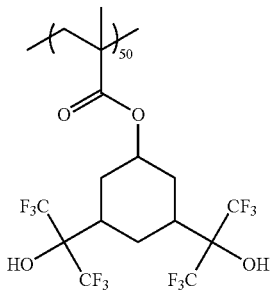

(C-8)

Examples 1 to 12 and Comparative Examples 1 to 4

<Preparation of Resist>
Positive resist compositions were each prepared by dissolving ingredients in solvents as shown in the following Table 4 so as to prepare a resist solution having a solids concentration of 7 mass % and passing the resist solution through a 0.1-μm polyethylene filter. Patterns were formed using each of the thus prepared positive resist compositions in accordance with a method chosen from those described in Table 5, and evaluated by the following method. Results obtained are shown in Table 4.

[Evaluation of Development Defect]

A defect inspection system, KLA2360 (trade name, made by KLA-Tencor Corporation), was used, and measurements with the defect inspection system were made in a random mode under a setting that the pixel size was 0.16 μm and the threshold was 20. And development defects extracted from discrepancies developing by superposing images for comparison upon pixel units were detected, and the number of development defects per unit area was calculated.

TABLE 4

| | Composition | | | | | | | |
|---|---|---|---|---|---|---|---|---|
| | Resin (A) 2 g | Acid generator (mg) | Resin (C) (mg) | Solvent (ratio by mass) | Basic compound (mg) | Surfactant (mg) | Pattern forming method | Number of defects (per cm$^2$) |
| Example | | | | | | | | |
| 1 | 9 | z2 (80) | C-6 (20) | SL-1/SL-2 (60/40) | N-5 (7) | W-1 (3) | (A) | 0.15 |
| 2 | 1 | z51 (100) | C-7 (30) | SL-2/SL-4/SL-6 (40/59/1) | N-6 (10) | W-4 (3) | (A) | 0.16 |
| 3 | 12 | z2/z62 (20/100) | C-5 (150) | SL-2/SL-4 (70/30) | N-3 (6) | W-1 (3) | (A) | 0.15 |
| 4 | 20 | z55/z65 (20/100) | C-6 (30) | SL-2/SL-4 (60/40) | N-1 (7) | W-1 (3) | (A) | 0.14 |
| 5 | 8 | z55/z51 (20/80) | C-7 (35) | SL-3/SL-4 (30/70) | N-6 (10) | W-4 (4) | (A) | 0.12 |
| 6 | 20 | z44/z65 (25/80) | C-3 (2) | SL-2/SL-4/SL-5 (40/58/2) | N-1 (7) | W-3 (4) | (B) | 0.11 |
| 7 | 21 | z55/z47 (30/60) | C-6 (15) | SL-1/SL-2 (60/40) | N-5 (10) | W-1 (4) | (A) | 0.10 |
| 8 | 12 | z65 (100) | C-7 (10) | SL-1/SL-2 (60/40) | N-3 (6) | W-2 (3) | (B) | 0.15 |
| 9 | 8 | z44/z65 (50/50) | C-8 (15) | SL-2/SL-4/SL-6 (40/59/1) | N-2 (9) | W-3 (3) | (A) | 0.14 |
| 10 | 12 | z51 (100) | C-7 (10) | SL-2/SL-4 (70/30) | N-5 (7) | W-1 (3) | (A) | 0.15 |
| 11 | 12 | z2/z62 (20/100) | C-8 (25) | SL-2/SL-4 (70/30) | N-3 (6) | W-1 (3) | (A) | 0.16 |
| 12 | 20 | z44/z65 (25/80) | C-6 (30) | SL-2/SL-4/SL-5 (40/58/2) | N-1 (7) | W-3 (4) | (A) | 0.17 |
| Comparative Example | | | | | | | | |
| 1 | 4 | z55/z65 (20/100) | — | SL-2/SL-4 (60/40) | N-1 (7) | W-1 (3) | (A) | 2.58 |
| 2 | 4 | z55/z65 (20/100) | — | SL-2/SL-4 (60/40) | N-1 (7) | W-1 (3) | (B) | 2.50 |
| 3 | 9 | z2 (80) | C-6 (20) | SL-1/SL-2 (60/40) | N-5 (7) | W-1 (3) | (C) | 1.01 |
| 4 | 1 | z51 (100) | C-7 (30) | SL-2/SL-4/SL-6 (40/59/1) | N-6 (10) | W-4 (3) | (C) | 0.88 |

The characters representing the ingredients in the above Tables stand for the following, respectively.

As to the acid generators, the characters used correspond respectively to those standing for the compounds illustrated hereinbefore.

N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
W-1: Megafac F176 (produced by Dainippon Ink & Chemicals, Inc., a surfactant of fluorine-containing type)
W-2: Megafac R08 (produced by Dainippon Ink & Chemicals, Inc., a surfactant of fluorine- and silicon-containing type)
W-3: Organosiloxane polymer KP-341 (produced by Shin-Etsu Chemical Co., Ltd., a surfactant of silicon-containing type)
W-4: Troysol S-366 (produced by Troy Chemical Industries, Inc.)
W-5: PF656 (produced by OMNOVA Solutions Inc., a surfactant of fluorine-containing type)
W-5: PF6320 (produced by OMNOVA Solutions Inc., a surfactant of fluorine-containing type)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate The pattern forming methods (A) to (D) specified hereinbefore and hereinafter in the tables are set forth in the following Tables 5 and 6.

TABLE 5

| Pattern forming method |
|---|
| (A) An organic antireflective coating ARC29A (produced by Nissan Chemical Industries, Ltd.) is applied to a silicon wafer, and baked at 205° C. for 60 seconds, thereby forming a 78 nm-thick antireflective coating. Thereon, a prepared positive resist composition is coated, and baked at 120° C. for 60 seconds, thereby forming a 250 nm-thick resist coating. The thus obtained wafer is subjected to pattern exposure by means of an ArF excimer laser immersion scanner (NA = 0.75) using purified water as an immersion liquid. Immediately after the exposure, water is fed onto the wafer surface to form puddles, and then the wafer is dried by being spun at 2,000 rpm to eliminate the water. Next the wafer is heated at 120° C. for 60 seconds, and then developed with an aqueous solution of tetramethylammonium hydroxide (2.38 mass %) for 30 seconds, rinsed with purified water, and further spin-dried. Thus, resist patterns are formed. |
| (B) An organic antireflective coating ARC29A (produced by Nissan Chemical Industries, Ltd.) is applied to a silicon wafer, and baked at 205° C. for 60 seconds, thereby forming a 78 nm-thick antireflective coating. Thereon, a prepared positive resist composition is coated, and baked at 120° C. for 60 seconds, thereby forming a 250 nm-thick resist coating. The resist coating surface is cleaned by feeding purified water thereto and drying the water by spinning. The thus treated resist coating is subjected to pattern exposure by means of an ArF excimer laser immersion scanner (NA = 0.75) using purified water as an immersion liquid. Immediately after the exposure, water is fed onto the wafer surface to form puddles, and then the wafer is dried by being spun at 2,000 rpm to eliminate the water. And the wafer is heated at 120° C. for 60 seconds, and then developed with an aqueous solution of tetramethylammonium hydroxide (2.38 mass %) for 30 seconds, rinsed with purified water, and further spin-dried. Thus, resist patterns are formed. |
| (C) An organic antireflective coating ARC29A (produced by Nissan Chemical Industries, Ltd.) is applied to a silicon wafer, and baked at 205° C. for 60 seconds, thereby forming a 78 nm-thick antireflective coating. Thereon, a prepared positive resist composition is coated, and baked at 120° C. for 60 seconds, thereby forming a 250 nm-thick resist coating. The thus obtained wafer is subjected to pattern exposure by means of an ArF excimer laser immersion scanner (NA = 0.75) using purified water as an immersion liquid. Thereafter, the wafer is heated at 120° C. for 60 seconds, and then developed with an aqueous solution of tetramethylammonium hydroxide (2.38 mass %) for 30 seconds, rinsed with purified water, and further spin-dried. Thus, resist patterns are formed. |

TABLE 6

| Pattern forming method |
|---|
| (D) An organic antireflective coating ARC29A (produced by Nissan Chemical Industries, Ltd.) is applied to a silicon wafer, and baked at 205° C. for 60 seconds, thereby forming a 78 nm-thick antireflective coating. On this coating, a prepared positive resist composition is coated, and baked at 120° C. for 60 seconds, thereby forming a 250 nm-thick resist coating. Next, pattern exposure is performed by means of an ArF excimer laser immersion scanner (NA = 0.75) using purified water as an immersion liquid. Immediately after the exposure, |

TABLE 6-continued

| Pattern forming method |
| --- |
| isopropyl alcohol is fed onto the wafer surface for 15 seconds, and then the wafer is dried by being spun at 2,000 rpm. Herein, the amount of isopropyl alcohol fed is adjusted to 0.5 kg/cm$^2$. And the wafer thus treated is heated at 120° C. for 60 seconds, and then developed with an aqueous solution of tetramethylammonium hydroxide (2.38 mass %) for 30 seconds, rinsed with purified water, and further spin-dried. Thus, resist patterns are formed. |

It is apparent from Table 4 that the present image forming methods can provide significant improvements in development defect.

Examples 13 to 21

Resists 1 to 6 were each prepared by dissolving ingredients in solvents as shown in the following Table 7 so as to prepare a solution having a solids concentration of 7 mass % and passing the solution through a 0.1-μm polyethylene filter. Patterns were formed using each of the thus prepared resists in accordance with the method specified in Table 8, which is either of the methods as set forth in Tables 5 and 6, and evaluated by the same method as in Example 1. Results obtained are shown in Table 8.

TABLE 7

| | Composition | | | | | |
| --- | --- | --- | --- | --- | --- | --- |
| | Resin (A) (2 g) | Acid Generator (mg) | Solvent (ratio by mass) | Basic Compound (mg) | Resin (C) (mg) | Surfactant (mg) |
| Resist 1 | 23 | z5 (80) | SL-2 (100) | N-3/N-5 (3/3) | C-3 (2) | W-1 (3) |
| Resist 2 | 24 | z5/z55 (50/50) | SL-2/SL-4 (60/40) | N-3/N-5 (3/3) | C-3 (2) | W-1 (3) |
| Resist 3 | 25 | z5/z55 (50/50) | SL-1/SL-2 (40/60) | N-3 (6) | C-4 (2) | W-1 (3) |
| Resist 4 | 26 | z5 (80) | SL-2/SL-4 (60/40) | N-5 (6) | C-4 (5) | W-1 (3) |
| Resist 5 | 23 | z2 (100) | SL-2/SL-4 (70/30) | N-3/N-5 (3/3) | C-5 (1) | W-1 (3) |
| Resist 6 | 24 | z2/z55 (50/50) | SL-2/SL-4 (70/30) | N-3/N-5 (3/3) | C-5 (5) | W-1 (3) |

TABLE 8

| | Resist | Pattern forming method | Number of defects (per cm$^2$) |
| --- | --- | --- | --- |
| Example 13 | Resist 1 | (D) | 0.10 |
| Example 14 | Resist 2 | (D) | 0.09 |
| Example 15 | Resist 3 | (D) | 0.11 |
| Example 16 | Resist 1 | (B) | 0.12 |
| Example 17 | Resist 2 | (B) | 0.11 |
| Example 18 | Resist 3 | (B) | 0.10 |
| Example 19 | Resist 4 | (D) | 0.13 |
| Example 20 | Resist 5 | (B) | 0.13 |
| Example 21 | Resist 6 | (B) | 0.13 |

It is apparent from these results that development defect can be improved by the pattern forming methods of the invention.

According to the invention, it is possible to provide an image forming method which can ensure improvement in development defect appearing after development in immersion lithography.

The entire disclosure of each and every foreign patent application from which the benefit of foreign priority has been claimed in the present application is incorporated herein by reference, as if fully set forth.

What is claimed is:

1. A pattern forming method which uses a positive resist composition comprising:
    (A) a silicon-free resin capable of increasing its solubility in an alkaline developer under action of an acid;
    (B) a compound capable of generating an acid upon irradiation with an actinic ray or radiation;
    (C) a silicon-containing resin having at least one group selected from the group consisting of (X) an alkali-soluble group, (XI) a group capable of decomposing under action of an alkaline developer and increasing solubility of the resin (C) in an alkaline developer, and (XII) a group capable of decomposing under action of an acid and increasing solubility of the resin (C) in an alkaline developer, and
    (D) a solvent,
    wherein the silicon-containing resin (C) is added in an amount of 0.047 to 6.60 mass % based on the total solids in the positive resist composition,
    the method comprising:
    (i) a step of applying the positive resist composition to a substrate to form a resist coating,
    (ii) a step of exposing the resist coating to light via an immersion liquid,
    (iii) a step of removing the immersion liquid remaining on the resist coating,
    (iv) a step of heating the resist coating, and
    (v) a step of developing the resist coating.

2. The pattern forming method according to claim 1, wherein the resin (A) has a mononuclear or polynuclear alicyclic hydrocarbon structure.

3. The pattern forming method according to claim 1, wherein the resist coating is exposed to light of a wavelength of 193 nm.

4. The pattern forming method according to claim 1, further comprising a step of cleaning the resist coating surface prior to (ii) the step of exposing the resist coating to light via an immersion liquid.

5. The pattern forming method according to claim 1, wherein (iii) the step of removing the immersion liquid remaining on the resist coating is a step of removing the immersion liquid by feeding a water-miscible organic solvent onto the resist coating.

6. The pattern forming method according to claim 5, wherein the water-miscible organic solvent is isopropyl alcohol.

7. The pattern forming method according to claim 1, wherein the silicon-containing resin (C) has a weight-average molecular weight of 1,000 to 100,000.

8. The pattern forming method according to claim 1, wherein the silicon-containing resin (C) further contains a fluorine atom.

9. The pattern forming method according to claim 1, wherein the silicon-containing resin (C) is added in an amount of 0.1 to 5 mass % based on the total solids in the positive resist composition.

10. The pattern forming method according to claim 1, wherein (iii) the step of removing the immersion liquid remaining on the resist coating includes steps of forming a liquid film (puddle) of the immersion liquid and removing the liquid film so as not to left any liquid drops.

11. The pattern forming method according to claim 10, wherein the step of removing the liquid film is a step of removing the liquid film while rotating the substrate at 500 rpm or above.

12. The pattern forming method according to claim 1, wherein the resin (A) has a repeating unit containing a group having a polycyclic hydrocarbon structure substituted by a hydroxyl group or a cyano group.

* * * * *